(12) United States Patent
Yi et al.

(10) Patent No.: US 6,931,330 B1
(45) Date of Patent: Aug. 16, 2005

(54) METHODS FOR MONITORING AND CONTROLLING CHEMICAL MECHANICAL PLANARIZATION

(75) Inventors: Jingang Yi, Albany, CA (US); Cangshan Xu, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/611,143

(22) Filed: Jun. 30, 2003

(51) Int. Cl.$^7$ .............................. G01L 1/00; B24B 49/14
(52) U.S. Cl. .............................. 702/41; 438/687; 451/5; 701/44
(58) Field of Search .............................. 702/33, 41, 57; 451/5, 41, 59; 438/14, 687, 689, 692; 701/44; 15/49.1

(56) References Cited

U.S. PATENT DOCUMENTS

| | | | |
|---|---|---|---|
| 5,036,015 A | * 7/1991 | Sandhu et al. | 438/14 |
| 5,904,608 A | * 5/1999 | Watanabe | 451/5 |
| 6,327,540 B1 | * 12/2001 | Miyano et al. | 702/57 |
| 6,458,013 B1 | * 10/2002 | Saka et al. | 451/5 |
| 6,585,559 B1 | * 7/2003 | Griffin et al. | 451/5 |
| 2003/0203624 A1 | * 10/2003 | Sameshima et al. | 438/687 |
| 2004/0138797 A1 | * 7/2004 | Yao et al. | 701/44 |

* cited by examiner

*Primary Examiner*—John Barlow
*Assistant Examiner*—John Le
(74) *Attorney, Agent, or Firm*—Martine, Penilla & Gencarella, LLP

(57) ABSTRACT

Methods are provided for monitoring and controlling a chemical mechanical planarization (CMP) process. Relationships between motor torques and CMP process parameters are determined and utilized to provide a basis for monitoring and controlling the CMP process. Motor current measurements obtained during the CMP process are converted to motor torques to provide for use of the relationships in monitoring and controlling the CMP process. The motor current measurements and relationships are also used to determine and monitor a coefficient of friction present during the CMP process.

24 Claims, 47 Drawing Sheets

METHODS FOR MONITORING AND CONTROLLING CHEMICAL MECHANICAL PLANARIZATION

BACKGROUND OF THE INVENTION

1. Field of the Invention

The present invention relates generally to semiconductor manufacturing. More specifically, the present invention relates to chemical mechanical planarization.

2. Description of the Related Art

In the fabrication of semiconductor devices, planarization operations are often performed on a semiconductor wafer ("wafer") to provide polishing, buffing, and cleaning effects. Typically, the wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Patterned conductive layers are insulated from other conductive layers by a dielectric material. As more metallization levels and associated dielectric layers are formed, the need to planarize the dielectric material increases. Without planarization, fabrication of additional metallization layers becomes substantially more difficult due to increased variations in a surface topography of the wafer. In other applications, metallization line patterns are formed into the dielectric material, and then metal planarization operations are performed to remove excess metallization.

The CMP process is one method for performing wafer planarization. In general, the CMP process involves holding and contacting a rotating wafer against a moving polishing pad under a controlled pressure. CMP systems typically configure the polishing pad on a rotary table or a linear belt.

FIG. 1 is an illustration showing a linear CMP apparatus, in accordance with the prior art. The linear CMP apparatus includes a polishing pad 101 configured to rotate in a direction 105 around rollers 103. A platen 107 is disposed opposite a working surface of the polishing pad 101 to provide backing support to the polishing pad 101 during a CMP operation. A wafer carrier 109 is configured to hold and apply a wafer 111 to the working surface of the polishing pad 101 during the CMP operation. The wafer carrier 109 is attached to a spindle 123 that is capable of rotating in a direction 113 while simultaneously applying the wafer 111 to the polishing pad 101 with an appropriate force as indicated by an arrow 115. An air bearing 117 is utilized between the platen 107 and the polishing pad 101 to facilitate traversal of the polishing pad 101 across the platen 107. A slurry 119 is introduced onto and distributed over the working surface of the polishing pad 101 to facilitate and enhance the CMP operation. Additionally, a conditioner 121 is used to condition the working surface of the polishing pad 101 as it travels in the direction 105.

During the CMP operation, a coefficient of friction between the wafer 111 and the polishing pad 101 can significantly influence the CMP process results. However, a relationship between the coefficient of friction and other parameters affecting the CMP operation has not been sufficiently developed and utilized.

In view of the foregoing, there is a need for a method of determining and utilizing the relationship between the coefficient of friction and other parameters affecting the CMP operation.

SUMMARY OF THE INVENTION

In one embodiment, a method for monitoring a chemical mechanical planarization (CMP) process is disclosed. The method includes determining an expected motor torque for the CMP process. The expected motor torque is based on a set of CMP process parameters. The method further includes measuring a motor current during the CMP process. The measured motor current is converted to a measured motor torque. The method also includes comparing the measured motor torque to the expected motor torque. A result of the comparison between the measured motor torque and the expected motor torque is monitored.

In another embodiment, a method for determining a friction coefficient of a CMP process is disclosed. The method includes determining a relationship between a motor torque and the friction coefficient. The method also includes measuring a motor current during the CMP process. The measured motor current is converted to a measured motor torque. The method further includes using the measured motor torque and the relationship between the motor torque and the friction coefficient to determine the friction coefficient. Thus, the method provides for determination of the friction coefficient during the CMP process.

In another embodiment, a method for controlling a CMP process is disclosed. The method includes determining an expected relationship between one or more CMP process parameters and a motor torque. The method also includes measuring values for both a motor current and the one or more CMP process parameters, wherein the values are measured in the CMP process to be controlled. The measured values for the motor current in the CMP process to be controlled are converted to measured values for a motor torque. The method further includes determining whether the measured values for both the motor torque and the one or more CMP process parameters satisfy the expected relationship between the one or more CMP process parameters and the motor torque. A control signal is created based on the determination of whether the expected relationship between one or more CMP process parameters and a motor torque is satisfied by the measured values. The method further includes controlling the CMP process in accordance with the control signal.

In another embodiment, a method for monitoring a CMP conditioning system is disclosed. The method includes an operation for determining an expected relationship between a motor torque and a friction coefficient during a CMP process. The expected relationship between the motor torque and the friction coefficient is based in-part on acceptable characteristics of the CMP conditioning system. The method also includes an operation in which a motor current is measured during performance of the CMP process. The measured motor current is converted to a measured motor torque occurring during performance of the CMP process. The method further includes using the measured motor torque and the expected relationship between the motor torque and the friction coefficient to monitor the friction coefficient present during performance of the CMP process. The method also includes identifying an unacceptable friction coefficient during performance of the CMP process. Additionally, the identified unacceptable friction coefficient is correlated to an unacceptable characteristic of the CMP conditioning system.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
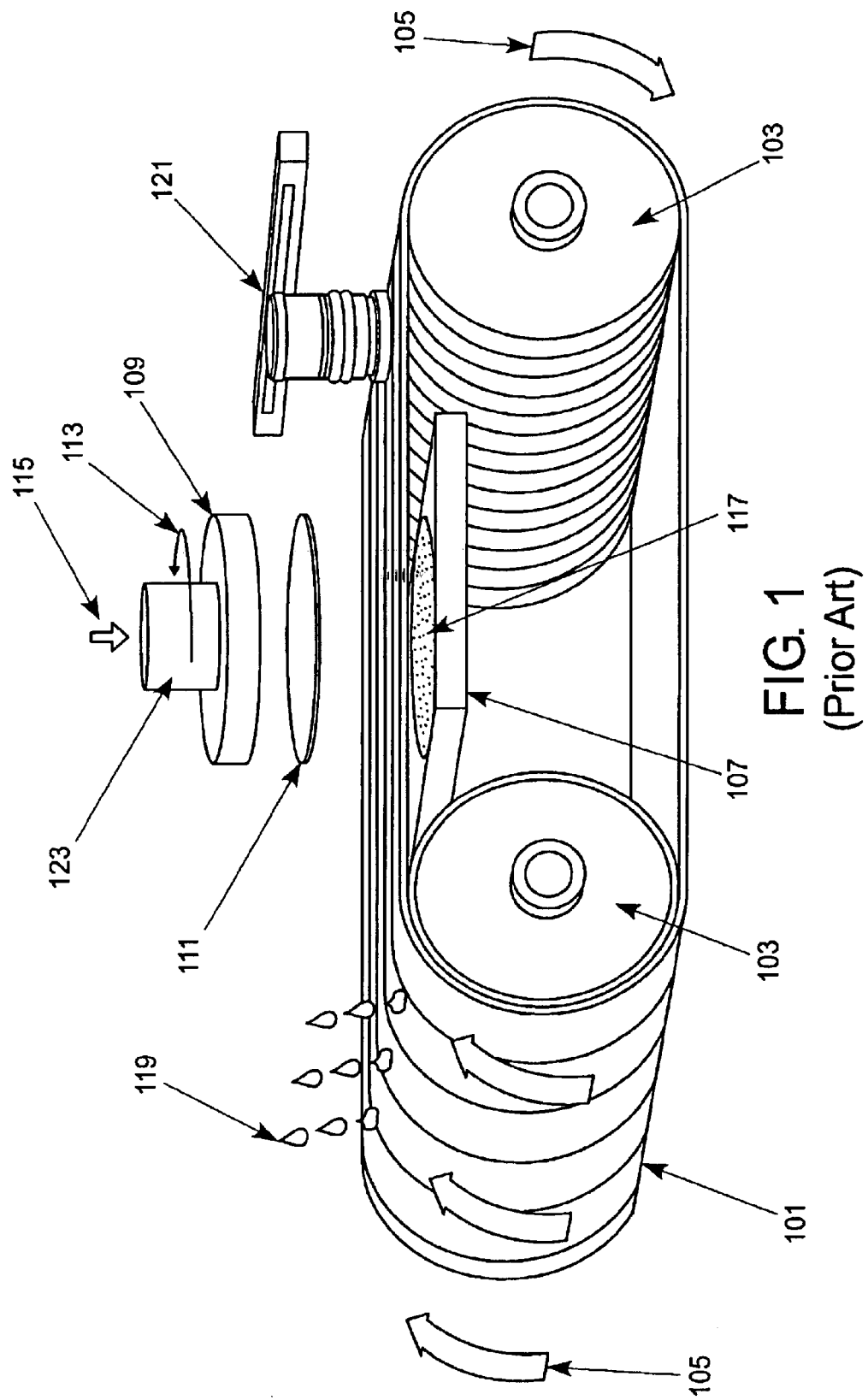
FIG. 1 is an illustration showing a linear CMP apparatus, in accordance with the prior art.
Figure 2:
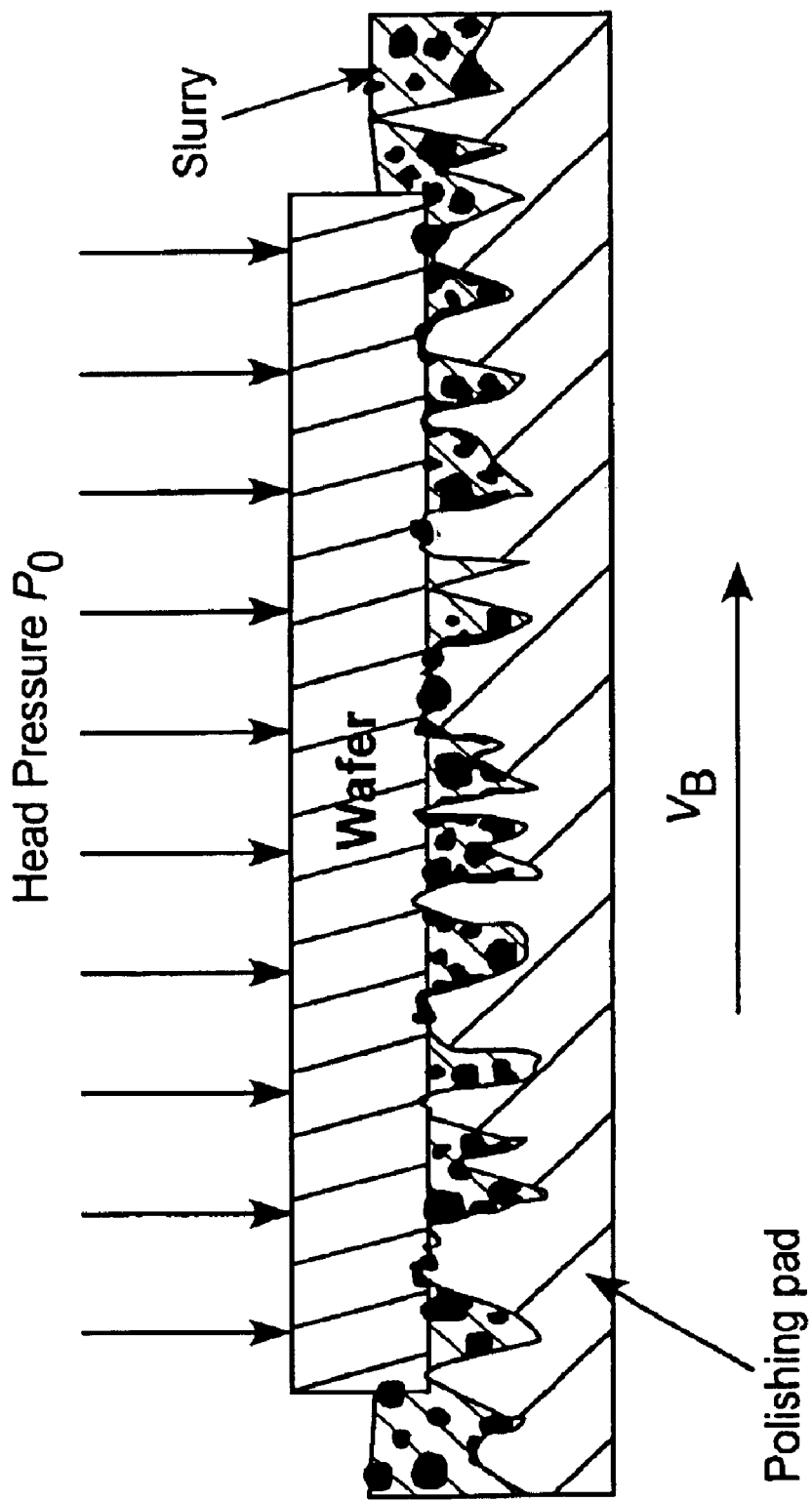
FIG. 2 is an illustration showing a schematic of the interface between the wafer and polishing pad during the CMP process, in accordance with one embodiment of the present invention.

FIG. 2 is an illustration showing a schematic of the interface between the wafer and polishing pad during the CMP process, in accordance with one embodiment of the present invention. During the CMP process, the wafer is rotated and pushed with a pressure $p_0$ against the polishing pad that is moving with a linear velocity $v_B$. When in contact with the polishing pad, the wafer is supported by asperities of the polishing pad. The asperities of the polishing pad are often formed by pores that are broken at a working surface of the polishing pad. The broken pores are capable of storing slurry that is deposited on the polishing pad. When the wafer is pushed against the polishing pad, some slurry particles are squeezed between the wafer and the pad asperities causing removal of material from the wafer. The interface between the wafer and polishing pad influences a friction force (i.e., coefficient of friction) that is generated between the wafer and polishing pad during the CMP process.

Figure 3:
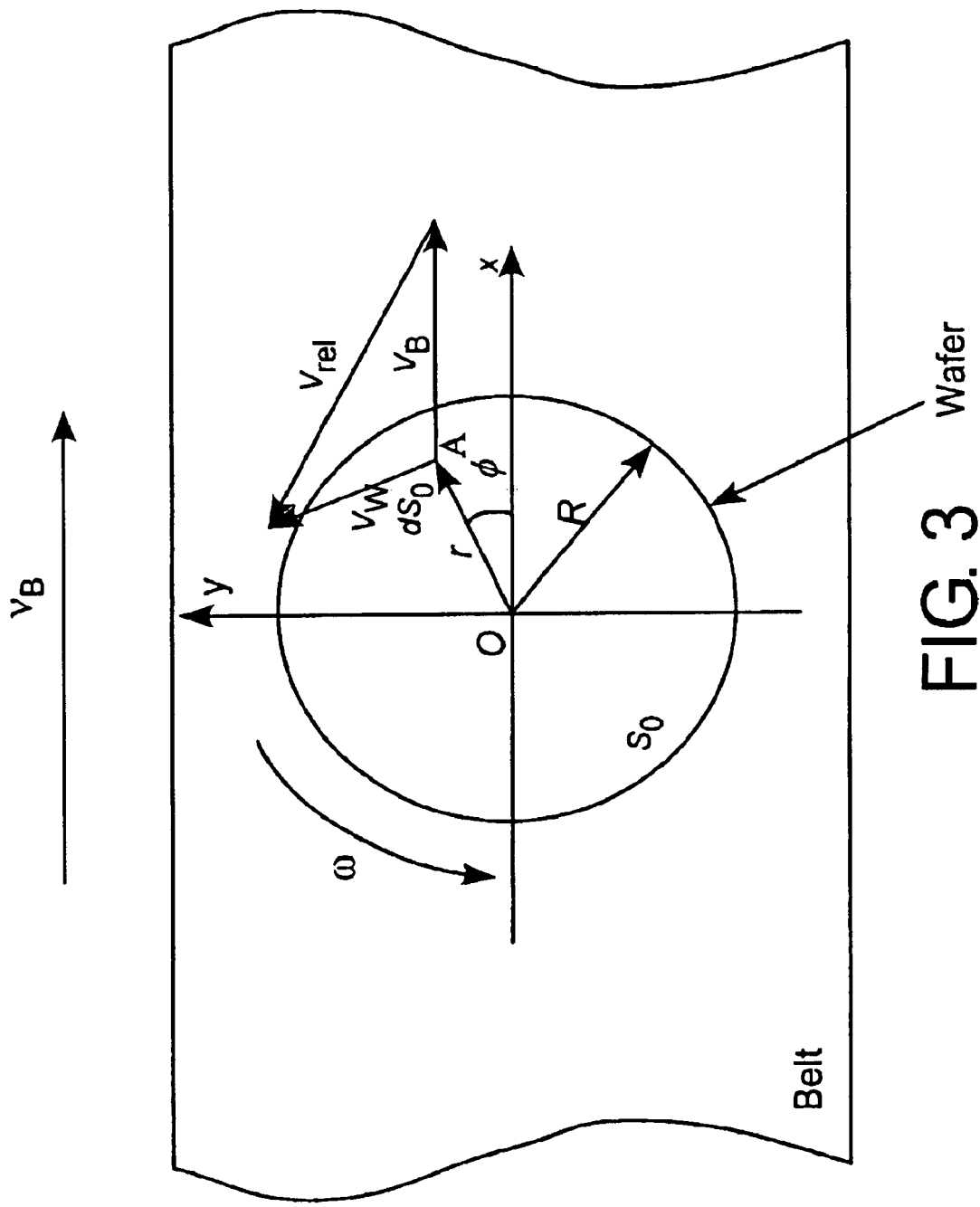
FIG. 3 is an illustration showing a schematic of the wafer against the moving polishing pad, in accordance with one embodiment of the present invention.

FIG. 3 is an illustration showing a schematic of the wafer against the moving polishing pad, in accordance with one embodiment of the present invention. Based on the schematic of FIG. 3, the kinematic relationship between the wafer and polishing pad is evaluated to develop a model of the friction force generated between the wafer and polishing pad. The polishing pad linear velocity is denoted as $v_B$, and the wafer carrier angular velocity is denoted as $\omega$. For an arbitrary point A on the wafer surface, a position vector r in the x-y coordinate system can be expressed as shown in Equation 1, where r is the distance from point A to the origin O of the coordinate system, $\phi$ is the angle between the vector r and the x axis, and i and j are the x and y axis unit vectors, respectively.

$$r = (r \cos \phi)i + (r \sin \phi)j \quad \text{Equation 1}$$

Based on the schematic of FIG. 3, the relative velocity vector ($v_{rel}$) of the point A on the wafer with respect to a point on the polishing pad that is contacting A can be calculated as shown in Equation 2. The magnitude of $v_{rel}$ can be calculated as shown in Equation 3.

$$v_{rel} = v_W - v_B = \dot{r} - v_B i = (-\omega r \sin \phi - v_B)i + (\omega r \cos \phi)j \quad \text{Equation 2}$$

$$|v_{rel}| = \sqrt{(\omega r \sin \phi + v_B)^2 + (\omega r \cos \phi)^2} = \sqrt{\omega^2 r^2 + 2v_B \omega r \sin \phi + v_B^2} \quad \text{Equation 3}$$

Figure 4:
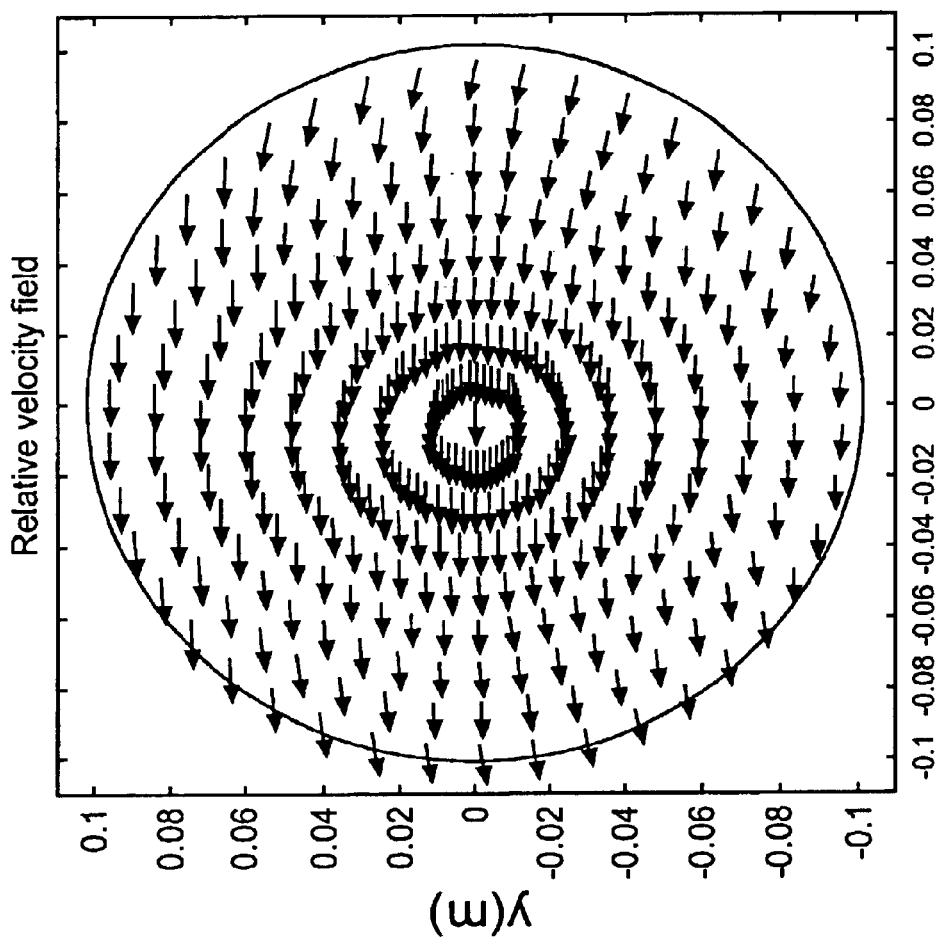
FIG. 4 is an illustration showing an example of a relative velocity vector distribution across a wafer based on Equations 2 and 3, in accordance with one embodiment of the present invention.

FIG. 4 is an illustration showing an example of a relative velocity vector distribution across a wafer based on Equations 2 and 3, in accordance with one embodiment of the present invention. The example relative velocity vector distribution of FIG. 4 corresponds to an 8 inch diameter wafer rotating at an angular velocity of $\omega$=20 rpm against a polishing pad having a linear velocity of $v_B$=200 ft/min. The relative velocities across the wafer are not the same. The relative velocity increases across the wafer in the direction of the positive y axis. Conversely, the relative velocity decreases across the wafer in the direction of the negative y axis.

It can be assumed that the average contact pressure p between the wafer surface and the polishing pad asperities is uniformly distributed across the wafer during the CMP process. Since the total contact area between the wafer surface and the polishing pad asperities is less than the total wafer surface area, the average contact pressure p is greater than the downward pressure $p_0$ applied to the wafer carrier. For discussion purposes, the total wafer surface area and total contact area between the wafer surface and the polishing pad asperities are denoted as $S_0$ and S, respectively. A unit area of surface $S_0$ about the point A on the wafer (see FIG. 3) is denoted as $dS_0$. Correspondingly, a portion of $dS_0$ that is in contact with the polishing pad is denoted as dS. Using the distributed LuGre dynamic friction model, the friction force $\delta F$ generated on $dS_0$ can be represented as shown in Equation 4.

$$\begin{cases} \dfrac{d\delta z}{dt} = v_{rel} - \theta \dfrac{\sigma_0 |v_{rel}|}{g(v_{rel})} \delta z \\ \delta F = (\sigma_0 \delta z + \sigma_1 \delta \dot{z} + \sigma_2 v_{rel}) \delta F_n \end{cases} \quad \text{Equation 4}$$

With respect to Equation 4, $\delta z$ is an average friction bristle deformation vector on $dS_0$, $\sigma_i$ (for i=0,1,2) are friction model parameters, and $\delta F_n$ is a normal force applied on $dS_0$. The parameter $\theta$ is used to model variations of the wafer-to-polishing pad contact conditions. For example, in one embodiment the parameter $\theta$ can be used to model the presence of slurry flow during the CMP process. The function $g(v_{rel})$ can be represented as shown in Equation 5, wherein $\mu_c$ and $\mu_s$ are Coulomb and static friction coefficients between the wafer and the polishing pad, respectively, and $v_s$ is a Stribeck velocity.

$$g(v_{rel}) = \mu_c + (\mu_s - \mu_c) \exp\left(-\dfrac{|v_{rel}|}{v_s}\right) \quad \text{Equation 5}$$

For the uniformly distributed average contact pressure p, $\delta F_n$ =pdS. Based on a force balance between the wafer and the polishing pad asperities in contact with the wafer, the relationship shown in Equation 6 can be obtained $$p_0 S_0 = pS \qquad \text{Equation 6}$$

If it is assumed that the asperities are uniformly distributed on the polishing pad, the relationship shown in Equation 7 can be obtained.

$$pdS = p_0 dS_0 \qquad \text{Equation 7}$$

A total friction force F and a spindle moment $M^S$ (i.e., total moment applied on wafer carrier spindle axis) with respect to the wafer center O can be represented as shown in Equations 8 and 9, respectively. With respect to Equation 9, $\delta M^S$ is a frictional moment generated on $dS_0$.

$$F = \int_{s_0} \delta F dS_0 \qquad \text{Equation 8}$$

$$M^S = \int_{s_0} \delta M^S = \int_{s_0} r \times \delta F dS_0 \qquad \text{Equation 9}$$

In order to analyze relationships between the CMP polishing parameters (e.g., wafer carrier pressure $p_0$, polishing pad linear velocity $\upsilon_B$, etc . . . ) and the total friction force F and spindle moment $M^S$, it is necessary to express Equations 8 and 9 in terms of CMP polishing parameters.

For the LuGre dynamic friction model presented in Equation 4, the dynamics of friction occur much faster than the CMP process responses. In a very short period of time, the total friction force F and frictional moments reach steady-state values. Therefore, steady-state frictional moments can be calculated using steady-state solutions of Equation 4. In following, letting $(d\delta z/dt)$ equal zero in Equation 4, the relationship shown in Equation 10 can be obtained.

$$\delta z = \frac{g(v_{rel})v_{rel}}{\theta \sigma_0 |v_{rel}|} \Rightarrow \delta F = \left[\frac{g(v_{rel})}{\theta |v_{rel}|} + \sigma_2\right] p_0 v_{rel} \qquad \text{Equation 10}$$

Utilizing Equation 10 in Equation 9, the friction moment $\delta M^S$ generated on $dS_0$ can be calculated as shown in Equation 11, where $k=i\times j$ is a unit vector along a z axis.

$$\delta M^S = r \times \delta F = \left[\frac{g(v_{rel})}{\theta |v_{rel}|} + \sigma_2\right] p_0 (dS_0) r \times v_{rel} =$$

$$p_0 r \left[\frac{g(v_{rel})}{\theta |v_{rel}|} + \sigma_2\right] (dS_0)(\omega r + \upsilon_B \sin\phi) k \qquad \text{Equation 11}$$

In order to analytically calculate the total moment applied on the spindle axis, it is necessary to approximate the non-linear function $g(v_{rel})$ shown in Equation 5. A first-order approximation of the function $g(v_{rel})$ is shown in Equation 12.

$$g(v_{rel}) = \qquad \text{Equation 12}$$

$$\mu_c + (\mu_s - \mu_c)\left(1 - \frac{|v_{rel}|}{v_s}\right) = \mu_s - (\mu_s - \mu_c)\frac{|v_{rel}|}{v_s}$$

Using the $g(v_{rel})$ approximation of Equation 12, the frictional moment $\delta M^S$ of Equation 11 can be calculated to obtain the spindle moment $M^S$ as shown in Equation 13.

Also, the magnitude of the spindle moment $|M^S|$ (i.e., friction torque) can be calculated as shown in Equation 14.

$$M^S = \int_{s_0} \delta M^S dS_0 = \qquad \text{Equation 13}$$

$$\left(\int_{s_0} p_0 r \left[\frac{\mu_s}{\theta |v_{rel}|} + \sigma\right](\omega r + \upsilon_B \sin\phi) dS_0\right) k \text{ where } \sigma =$$

$$\sigma_2 - \frac{\mu_s - \mu_c}{v_s \theta}$$

$$|M^S| = M^S = \int_{s_0} p_0 r \left[\frac{\mu_s}{\theta |v_{rel}|} + \sigma\right](\omega r + \upsilon_B \sin\phi) dS_0 \qquad \text{Equation 14}$$

$$= \int_0^R \int_0^{2\pi} p_0 r \left[\frac{\mu_s}{\theta \sqrt{\omega^2 r^2 + 2\upsilon_B \omega r \sin\theta + \upsilon_B^2}} + \sigma\right](\omega r + \upsilon_B \sin\phi) d\phi dr$$

$$= \frac{p_0 \mu_s}{\theta} \int_0^R \int_0^{2\pi} \frac{r(\omega r + \upsilon_B \sin\phi)}{\sqrt{\omega^2 r^2 + 2\upsilon_B \omega r \sin\theta + \upsilon_B^2}} d\phi dr +$$

$$\int_0^R p_0 r \sigma \int_0^{2\pi} (\omega r + \upsilon_B \sin\phi) d\phi dr$$

$$= \frac{p_0 \mu_s}{\theta} E_1(\upsilon_B, \omega) + \frac{2}{3}\pi p_0 \sigma \omega R^3$$

With respect to Equation 14, the term $E_1(\upsilon_B,\omega)$ is defined as the integral function of $\upsilon_B$ and $\omega$ as shown in Equation 15.

$$E_1(\upsilon_B, \omega) = \qquad \text{Equation 15}$$

$$\int_0^R \int_0^{2\pi} \frac{r(\omega r + \upsilon_B \sin\phi)}{\sqrt{\omega^2 r^2 + 2\upsilon_B \omega r \sin\theta + \upsilon_B^2}} d\phi dr$$

Figure 5:
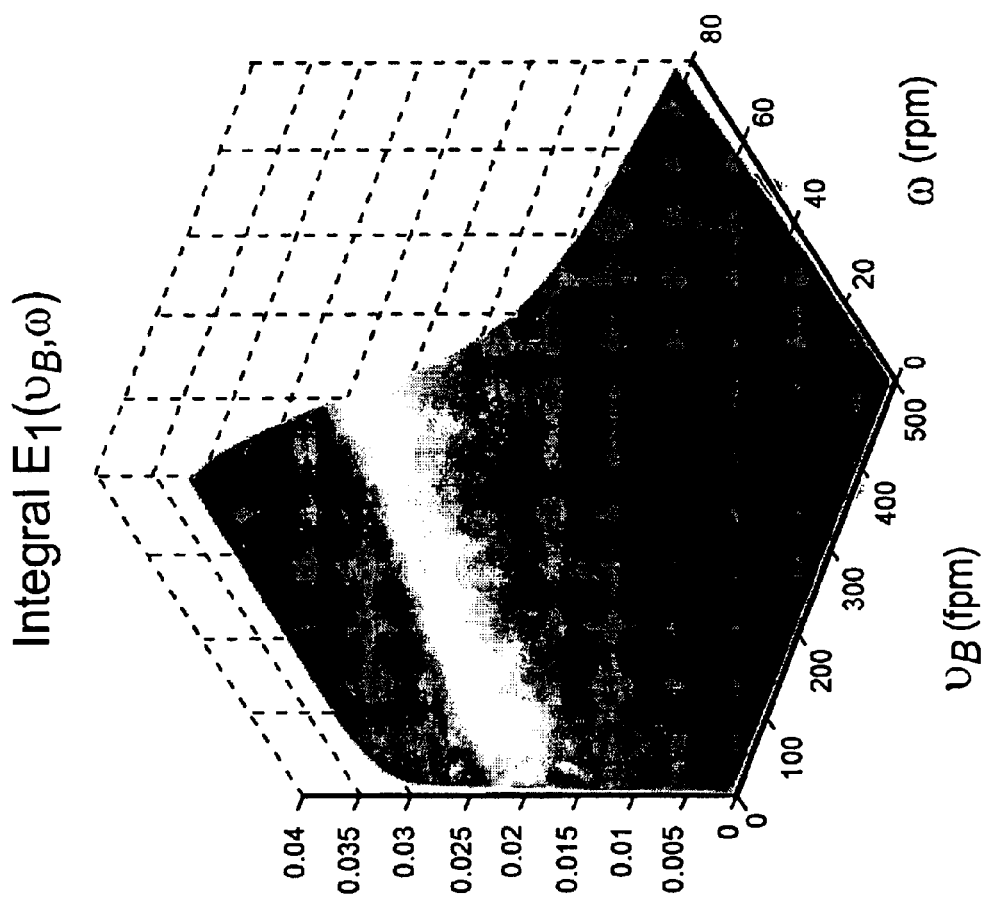
FIG. 5 shows example values of $E_1(\upsilon_B,\omega)$ for a range of linear CMP operations, in accordance with one embodiment of the present invention.

Since there is no closed form solution for the integral of Equation 15, it is not easy to see the relationship between the friction torque and the CMP polishing parameters. However, the integrals of Equation 15 can be computed numerically. FIG. 5 shows example values of $E_1(\upsilon_B,\omega)$ for a range of linear CMP operations, in accordance with one embodiment of the present invention.

In certain situations, the integral of Equation 15 can be solved in closed form to reveal more with regard to the relationship be the spindle moment $M^S$ and the CMP polishing parameters. For example, if $\upsilon_B=0$, Equation 15 can be solved in closed form such that the friction torque of Equation 14 can be represented as shown in Equation 16.

$$M^S = \frac{1}{3} p_0 \pi R^2 \left(\frac{3\mu_s}{\theta} + 2\sigma \omega R\right) \qquad \text{Equation 16}$$

In one embodiment, the polishing pad linear velocity $\upsilon_B$ is fast and the wafer carrier angular velocity $\omega$ is slow (i.e., $\upsilon_B \gg \omega$). In this particular embodiment, the magnitude of the relative velocity vector $|v_{rel}|$ as shown in Equation 3 can be approximated as shown in Equation 17 with an acceptable level of error. The relative velocity vector $|v_{rel}|$ as represented in Equation 17 can be substituted into Equation 14 to obtain the friction torque as shown in Equation 18.

$$|v_{rel}| \approx \omega r \sin\phi + \upsilon_B \qquad \text{Equation 17}$$

$$M^S = \frac{1}{3}p_0\pi R^3 \omega\left(\frac{\mu_s}{\theta \upsilon_B} + 2\sigma\right) \quad \text{Equation 18}$$

In addition to analyzing the spindle moment $M^S$ as previously discussed, it is also necessary to analyze the friction moment applied to the roller rotating axis (i.e., the roller moment $M^R$). During the CMP process, the polishing pad is tensioned about the rollers, and the friction force applied at the wafer-to-polishing pad interface is indirectly applied to the rollers. The roller moment $M^R$ can be estimated using the same calculational procedure previously discussed with respect to the spindle moment $M^S$.

Figure 6:
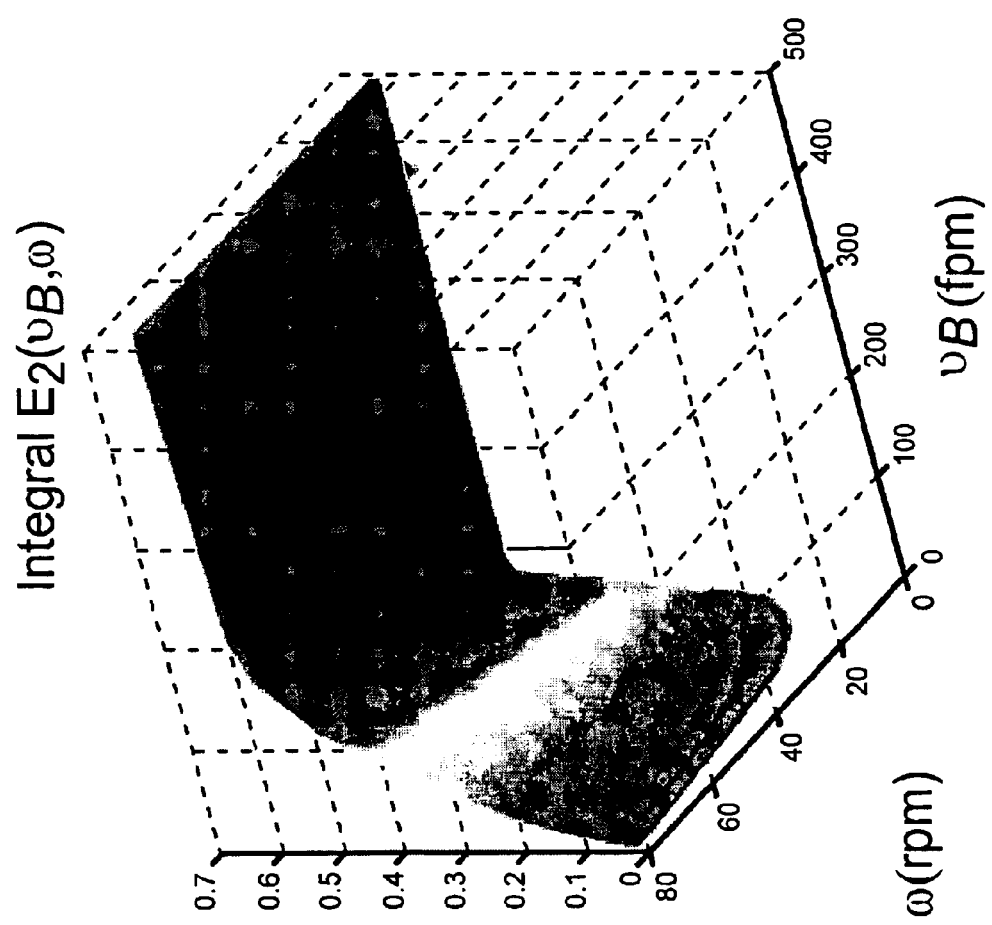
FIG. 6 shows example values of $E_2(\upsilon_B,\omega)$ for a range of linear CMP operations, in accordance with one embodiment of the present invention.

A friction force $F_x$ along the polishing pad direction of movement can be estimated as shown in Equation 19. A roller friction moment $M^R$ (i.e., $|M^R|$) on the roller rotating axis can be estimated as shown in Equation 20. With respect to Equation 20, the parameter $R_r$ is the roller radius, and the integral $E_2(\upsilon_B,\omega)$ is defined as shown in Equation 21. FIG. 6 shows example values of $E_2(\upsilon_B\omega)$ for a range of linear CMP operations, in accordance with one embodiment of the present invention.

$$F_x = \quad \text{Equation 19}$$

$$\int_{S_0} \delta F_x \, dS_0 = \int_{S_0} \delta F \cdot i \, dS_0 = \frac{p_0 \mu_s}{\theta} E_2(\upsilon_B, \omega) + 2\pi p_0 R \sigma \upsilon_B$$

$$M^R = F_x R_r \quad \text{Equation 20}$$

$$E_2(\upsilon_B, \omega) = \quad \text{Equation 21}$$

$$\int_0^R \int_0^{2\pi} \frac{\omega r \sin\phi + \upsilon_B}{\sqrt{\omega^2 r^2 + 2\upsilon_B \omega r \sin\phi + \upsilon_B^2}} \, d\phi \, dr$$

Recalling the embodiment wherein the polishing pad linear velocity $\upsilon_B$ is fast and the wafer carrier angular velocity $\omega$ is slow (i.e., $\upsilon_B \gg \omega$), the magnitude of the relative velocity vector $|v_{rel}|$ as approximated in Equation 17 can be used to obtain an approximation for the roller friction moment $M^R$ as shown in Equation 22.

$$M^R = 2p_0 \pi R R_r \left(\frac{\mu_s}{\theta} + \sigma \upsilon_B\right) \quad \text{Equation 22}$$

Through observation of FIGS. 5 and 6, it can be discerned that $E_1(\upsilon_B,\omega) \ll E_2(\upsilon_B,\omega)$ for the same $\upsilon_B$ and $\omega$. Also, $E_1(\upsilon_B,\omega)$ is not sensitive to changes in wafer carrier angular velocity at higher polishing pad linear velocities. Similarly, $E_2(\upsilon_B,\omega)$ is not sensitive to changes in polishing pad linear velocity. Through comparison of Equations 14 and 20, it can be determined that the friction moment of the spindle $M^S$ is much less that the friction moment of the roller $M^R$ (i.e., $M^S \ll M^R$).

Since $\upsilon_B \gg \omega$ for most CMP processes, the approximations for the friction moment of the spindle $M^S$ and the friction moment of the roller $M^R$, as shown in Equations 18 and 22, respectively, are widely applicable. In addition, the friction model parameter $\sigma$ generally satisfies the relationship $0 \leq \sigma \ll 1$. Therefore, the friction moment of the spindle $M^S$ given by Equation 18 is proportional to the external wafer carrier pressure $p_0$, the wafer carrier angular velocity $\omega$, and the reciprocal of the polishing pad linear velocity $\upsilon_B$. The friction moment of the roller $M^R$ given by Equation 22, however, is proportional to the external wafer carrier pressure $p_0$ and not to either $\omega$ or $\upsilon_B$.

The previous discussion regarding the spindle moment $M^S$ and roller moment $M^R$ have assumed that the friction coefficients $\mu_c$ and $\mu_s$ are uniform across the wafer-to-polishing pad interface. However, conditioning of the polishing pad during the CMP process will introduce non-uniformity in the friction coefficients $\mu_c$ and $\mu_s$ at the wafer-to-polishing pad interface. The conditioned portion of the polishing pad has higher values for the friction coefficients relative to the unconditioned portion. Conditioning of the polishing pad is generally performed to refresh the polishing pad activity and reduce a decay and glaze effect on the polishing pad. Therefore, the spindle moment $M^S$ and roller moment $M^R$ representations should be enhanced to account for changes in the friction coefficients $\mu_c$ and $\mu_s$ resulting from conditioning.

Figure 7:
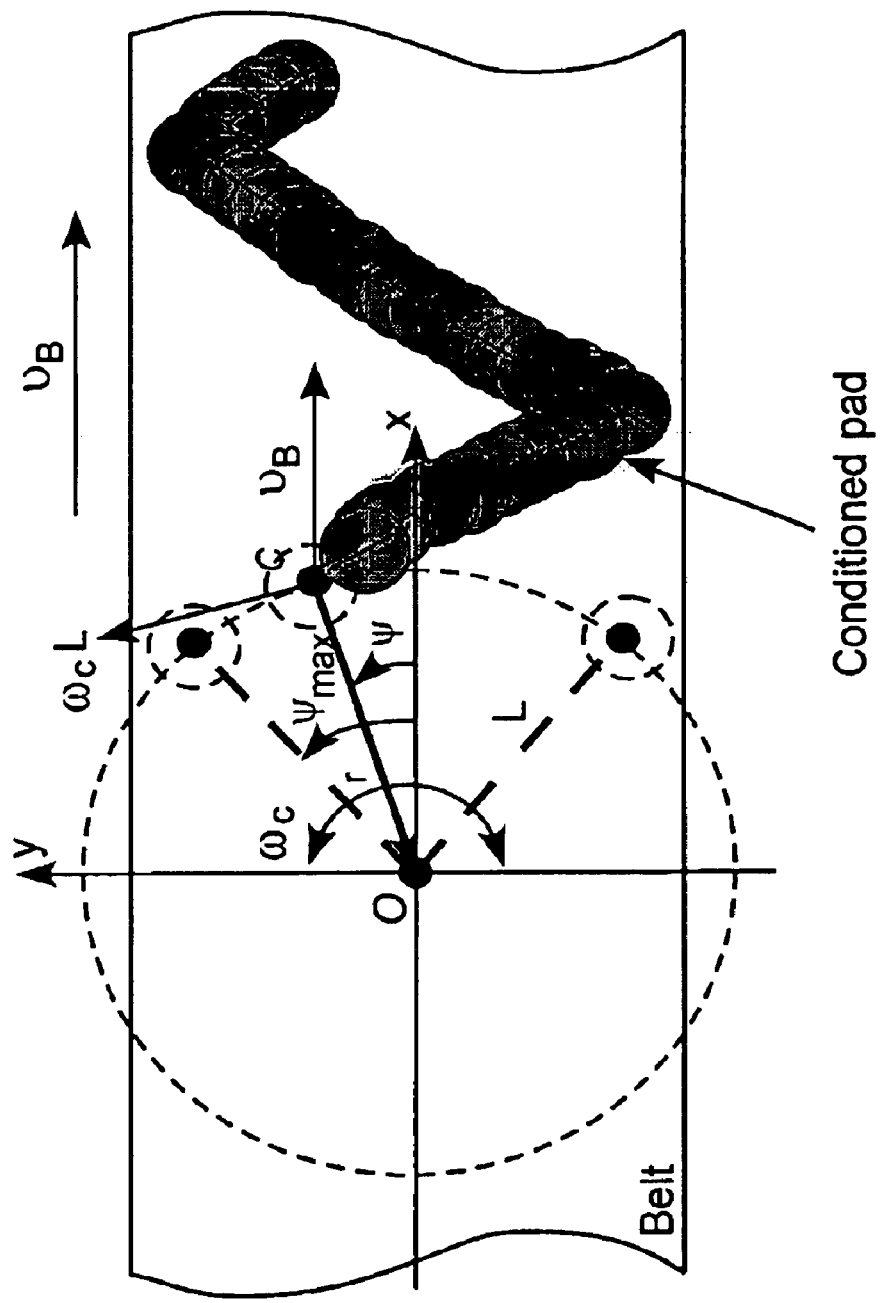
FIG. 7 is an illustration depicting a kinematic relationship between a radial arm type conditioning system and the polishing pad, in accordance with one embodiment of the present invention.

FIG. 7 is an illustration depicting a kinematic relationship between a radial arm type conditioning system and the polishing pad, in accordance with one embodiment of the present invention. A conditioner disk is attached to and moved by a radial arm having a length L. The radial arm is shown to rotate with a constant angular velocity $\omega_c$ around a fixed point O representing an origin of an x-y coordinate system. A maximum angular displacement of the radial arm is shown as $\psi_{max}$. Movement of the conditioner disk is symmetric with respect to a center line of the polishing pad (i.e., x-axis). The polishing pad linear velocity is shown as $\upsilon_B$. In one embodiment, the conditioner is driven by a motor that can quickly accelerate and decelerate the radial arm. Since the radial arm acceleration and deceleration occurs quickly relative to a sweep time across the polishing pad, it is appropriate to neglect the time required for the radial arm to accelerate from 0 to $\omega_c$ and decelerate from $\omega_c$ to 0. Considering a trajectory over the polishing pad of the conditioner disk having a center point C, a velocity profile of the conditioner disk in the x-y coordinate system is obtained as shown in Equation 23. With respect to Equation 23, a positive angular velocity (i.e., $\omega_c \geq 0$) is considered to occur in the counter-clockwise direction of rotation. Also, the angular displacement of the radial arm as a function of time ($\psi(t) = \omega_c t$) is required to remain within the range $-\psi_{max} \leq \psi(t) \leq \psi_{max}$.

$$\begin{cases} \upsilon_{Cx}(t) = \upsilon_B - \omega_c L \sin(\omega_c t) \\ \upsilon_{Cy}(t) = \omega_c L \cos(\omega_c t) \end{cases} \quad \text{Equation 23}$$

For a linear type conditioning system, the conditioner disk is moved across the polishing pad in a direction that is substantially perpendicular to the direction of motion of the polishing pad. Referring to FIG. 7, motion of the conditioner disk in the linear type conditioning system is decoupled in the x and y directions. Correspondingly, a velocity profile of the conditioner disk in the linear type conditioning system is obtained as shown in Equation 24. With respect to Equation 24, the velocity in the y-axis direction corresponds to the conditioner disk moving in the positive y axis direction. Also, the conditioner disk movement across the polishing pad is required to remain within the range $-\sin(\psi_{max}) \leq y_C(t) \leq L \sin(\psi_{max})$.

$$\begin{cases} \upsilon_{Cx}(t) = \upsilon_B \\ \upsilon_{Cy}(t) = \pm \upsilon_L \end{cases} \quad \text{Equation 24}$$

The polishing pad linear velocity $\upsilon_B$ is much greater than the conditioner disk velocity. Therefore, the conditioner disk trajectory is dominated by the polishing pad linear velocity.

In following, conditioner disk trajectories of both the radial arm type conditioning system and the linear type conditioning system are essentially the same. However, as the conditioner disk of the radial arm type conditioner system traverses the polishing pad, the orientation of the conditioner disk varies with respect to the polishing pad. Comparatively, as the conditioner disk of the linear type conditioner system traverses the polishing pad, the orientation of the conditioner disk remains constant with respect to the polishing pad. Nevertheless, it is appropriate to assume that the effects of both the radial arm type and linear type conditioning systems are the same.

Figure 8:
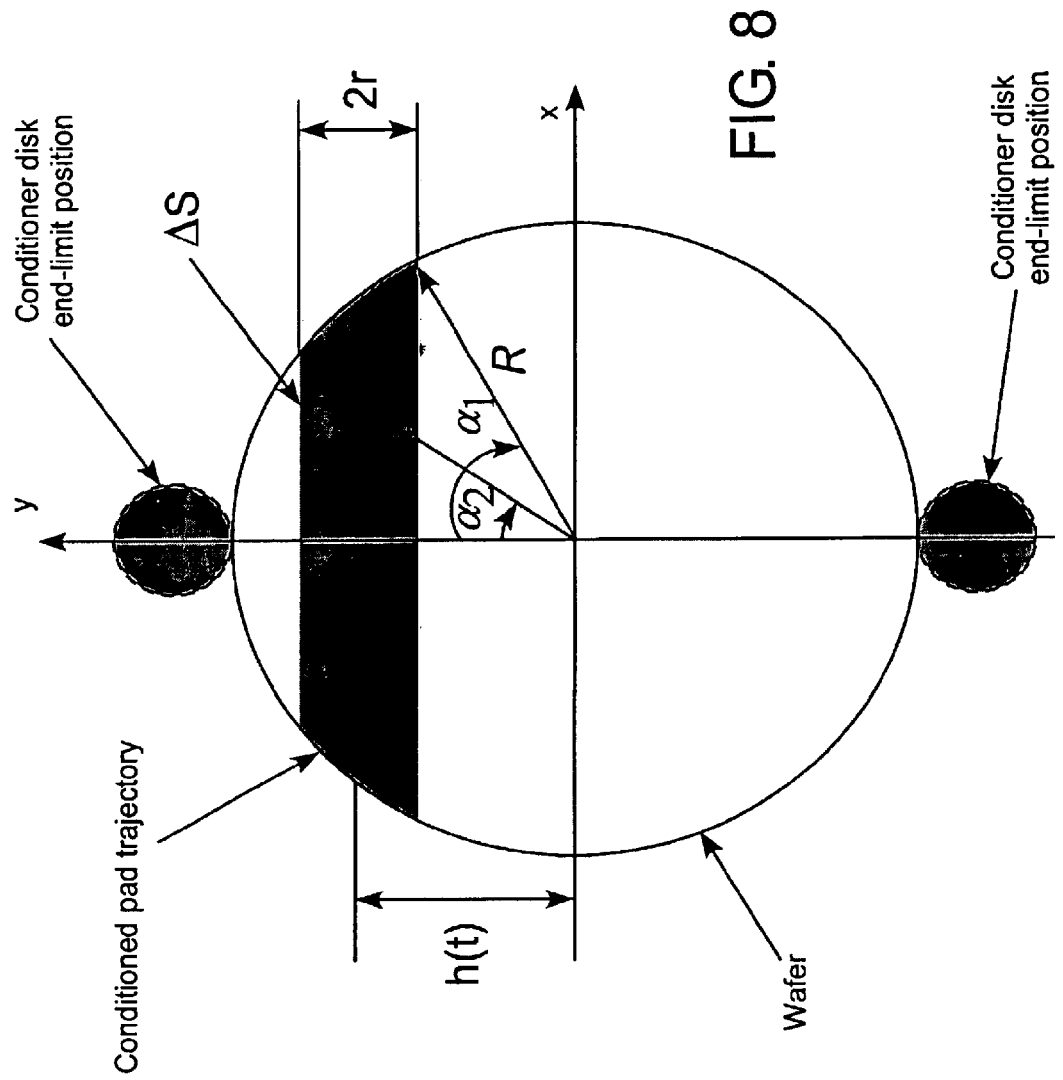
FIG. 8 is an illustration depicting a kinematic relationship between a conditioned pad trajectory and the wafer during the CMP process, in accordance with one embodiment of the present invention.

FIG. 8 is an illustration depicting a kinematic relationship between a conditioned pad trajectory and the wafer during the CMP process, in accordance with one embodiment of the present invention. To develop the kinematic relationship, the conditioner disk radius is represented by r. Also, the distance from the wafer center to the center of the conditioner disk is represented as h(t). During one sweep, the conditioner disk moves at a constant velocity from a position at x=0, y=(R+r), through a position at x=0, y=0, to a position at x=0, y=−(R+r). A period of the sweep is represented as $T_c$. Assuming that the conditioning begins with movement of the conditioner disk in the negative y axis direction and ends with movement of the conditioner disk in the positive y axis direction (i.e., 2 sweeps), the conditioner disk center position h(t) can be calculated as shown in Equation 25. With respect to Equation 25, $v_c$ is the linear velocity of the conditioner disk.

$$h(t) = \begin{cases} (R+r) - v_c t & \text{if } 0 \le t < T_c \\ -(R+r) - v_c(t - T_c) & \text{if } T_c \le t < 2T_c \end{cases} \qquad \text{Equation 25}$$

Referring to FIG. 8, the effect of the conditioned portion of the polishing pad is calculated as a function of a fraction of conditioned area in contact with the wafer (i.e., shaded area) relative to the total wafer area. To determine the friction moment relative to the wafer center O, it is necessary to consider both the magnitude and sign of the shaded area with respect to the wafer center O. A parameter $\Delta S^S(t)$ representing the signed area of the conditioned portion of the polishing pad within a conditioning sweep (i.e., $0 \le t \le T_c$), can be calculated as shown in Equation 26. Due to symmetry, a similar formula can be obtained for $T_c \le t < 2T_c$. With regard to Equation 26, since the polishing pad linear velocity is generally high with respect to the conditioner disk velocity, it is only necessary to consider the case where $2R - r \ll v_c T_c$.

The conditioning changes the Coulomb and static friction coefficients ($\mu_c$ and $\mu_s$, respectively) by an amount $\gamma_\mu \ge 0$ as shown in Equations 27 and 28, respectively.

$$\mu_{c\ cond} = (1 + \gamma_\mu)\mu_c \qquad \text{Equation 27}$$

$$\mu_{s\ cond} = (1 + \gamma_\mu)\mu_s \qquad \text{Equation 28}$$

An approximation is made that the additional friction moment due to conditioning is proportional to the conditioned area of the polishing pad in contact with the wafer surface. In following, the friction moment of the spindle under conditioning ($M^S_{cond}(t)$) as a function of time ($t \in [0, T_c]$) can be calculated as shown in Equation 29. With respect to Equation 29, the parameter $\gamma^S_{cond}(t)$ is the factor due to conditioning at time t.

$$M^S_{cond}(t) = \left(1 + \gamma_\mu \frac{\Delta S^S(t)|h(t)|}{\pi R^3}\right) M^S = (1 + \gamma_\mu \gamma^S_{cond}(t)) M^S \qquad \text{Equation 29}$$

Equation 29 reflects one conditioner disk trajectory within one polishing pad rotating cycle. Since the polishing pad is moving fast relative to the conditioner disk, however, a single conditioner disk trajectory could repeatedly cross the wafer surface. In order to capture the effect of multiple polishing pad rotating cycles, the parameter $\Delta S^S(t)$ given in Equation 26 is modified to a parameter $\Delta S^S_e(t)$ as shown in Equation 30.

$$\Delta S^S_e(t) = \Delta S^S(t) + \sum_{i=1}^{N} \beta_i \Delta S^S(t - iT_B) \qquad \text{Equation 30}$$

With respect to Equation 30, the parameters $\beta_i$ for i=1, . . . , N are called forgetting factors, wherein $0 < \beta_i < 1$. The parameter N represents the number of polishing pad rotating cycles within one conditioning sweep, wherein $1 \le N < [(v_B T_c)/L_B]$. The function $[(v_B T_c)/L_B]$ corresponds to the largest integer number that is less than $(v_B T_c)/L_B$. A time constant $T_B$ is defined as the time required for the conditioner disk trajectory to traverse one polishing pad length (i.e., $T_B = L_B/v_B$). There are a total of $T_c/T_B$ conditioner disk trajectories on the polishing pad during one conditioning sweep. If the number $(v_B T_c)/L_B$ is an irrational number, it can be determined that the conditioner disk will cover the whole pad surface after a large number of conditioning sweeps.

The friction moment of the roller under conditioning ($M^R_{cond}(t)$) as a function of time can be calculated in a $$\Delta S^S(t) = \begin{cases} R^2 \left[\cos^{-1}\left(\frac{h-r}{R}\right) - \frac{h-r}{R}\sqrt{1 - \frac{(h-r)^2}{R^2}}\right] & \text{if } 0 \le t < \frac{2r}{v_c} \\ R^2 \left[\cos^{-1}\left(\frac{h-r}{R}\right) - \cos^{-1}\left(\frac{h+r}{R}\right) - \frac{1}{R}\left((h-r)\sqrt{1 - \left(\frac{(h-r)}{R}\right)^2} - (h+r)\sqrt{1 - \left(\frac{h+r}{2}\right)^2}\right)\right] & \text{if } \frac{2r}{v_c} \le t < \frac{2r}{v_c} \\ R^2 \left[\cos^{-1}\left(\frac{r-h}{R}\right) - \cos^{-1}\left(\frac{h+r}{R}\right) - \frac{1}{R}\left((r-h)\sqrt{1 - \left(\frac{(h-r)}{R}\right)^2} - (h+r)\sqrt{1 - \left(\frac{h+r}{2}\right)^2}\right)\right] & \text{if } \frac{R}{v_c} \le t < \frac{R+2r}{v_c} \\ -R^2 \left[\cos^{-1}\left(\frac{|h|-r}{R}\right) - \cos^{-1}\left(\frac{h+r}{R}\right) - \frac{1}{R}\left((|h|-r)\sqrt{1 - \left(\frac{|h|-r}{R}\right)^2} - (h+r)\sqrt{1 - \left(\frac{h+r}{2}\right)^2}\right)\right] & \text{if } \frac{R+2r}{v_c} \le t < \frac{2R-r}{v_c} \\ -R^2 \left[\cos^{-1}\left(\frac{|h|-r}{R}\right) - \frac{|h|-r}{R}\sqrt{1 - \frac{(|h|-r)^2}{R^2}}\right] & \text{if } \frac{2R-r}{v_c} \le t < T_c \end{cases} \qquad \text{Equation 26}$$

similar manner as $M^S_{cond}(t)$. One difference, however, between $M^R_{cond}(t)$ and $M^S_{cond}(t)$ is that conditioning will always add an amount of extra positive load on the roller axis, but for the spindle the extra load can be either positive or negative. With respect to the spindle, the friction forces across the wafer are in the same direction. Therefore, when the conditioned portion of the polishing pad changes position relative to the spindle axis, the extra load changes sign. With respect to the roller, the extra load friction force always gives the same amount of extra moment. Additionally, with respect to the roller, the conditioner disk itself applies an extra torque to the roller axis during the conditioning period. Equations 26–30 can be modified to obtain the friction moment of the roller under conditioning ($M^R_{cond}(t)$) as a function of time ($t \in [0,T_c]$) as shown in Equation 31. With respect to Equation 31, the last term represents the extra torque resulting from contact of the conditioner disk with the polishing pad. The parameter $F_c$ represents the conditioner disk downforce. The parameter $\mu_{cond}$ represents the friction coefficient between the conditioner disk and the polishing pad.

$$M_{cond}^R(t) = (1 + \gamma_\mu \gamma_{cond}^R(t))M^R + F_c \mu_{cond} R_r \qquad \text{Equation 31}$$

Figure 9:
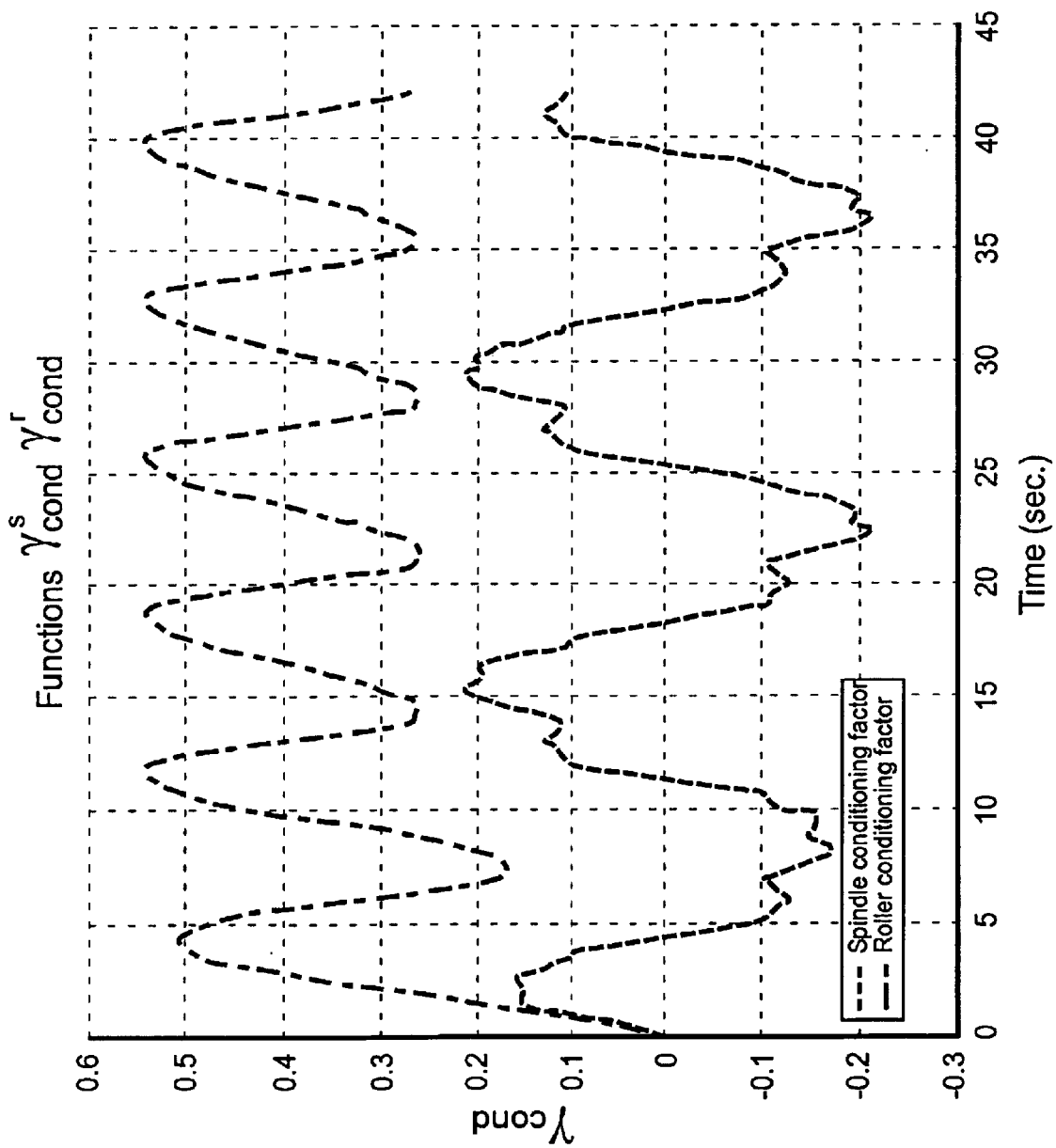
FIG. 9 is an illustration showing an example of the friction torque factors $\gamma^S_{cond}(t)$ and $\gamma^R_{cond}(t)$ of the spindle and roller, respectively, in accordance with one embodiment of the present invention.

FIG. 9 is an illustration showing an example of the friction torque factors $\gamma^S_{cond}(t)$ and $\gamma^R_{cond}(t)$ of the spindle and roller, respectively, in accordance with one embodiment of the present invention. In the example of FIG. 9, N=2, $\beta_1$=0.6, $\beta_2$=0.3, and conditioning is performed continuously with $T_c$=7 seconds. The various parameter values represented in FIG. 9 are provided for exemplary purposes and should not be interpreted as being restrictive of the present invention. For the spindle, $\gamma^S_{cond}(t)$ is shown to have an oscillating period of about $2T_c$. For the roller, $\gamma^R_{cond}(t)$ is shown to have an oscillating period of about $T_c$.

The spindle moment $M^S$ and roller moment $M^R$ representations of the present invention, including the respective conditioning effects, cannot be measured directly. However, the present invention provides a method for indirectly determining $M^S$ and $M^R$ through the use of spindle and roller motor current measurements.

Figure 10:
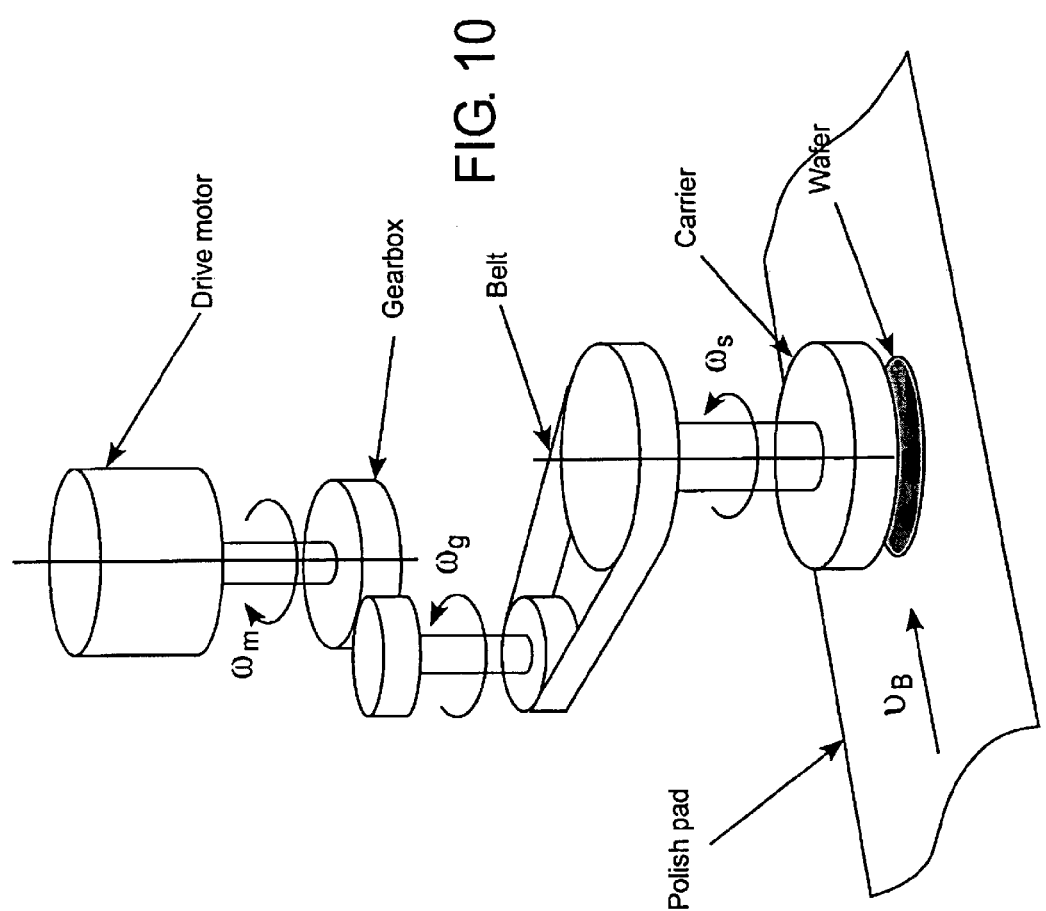
FIG. 10 is an illustration showing a kinematic schematic of the spindle system, in accordance with one embodiment of the present invention.

FIG. 10 is an illustration showing a kinematic schematic of the spindle system, in accordance with one embodiment of the present invention. A DC motor is used to drive the spindle system. A gearbox and a belt transmission system transfers the rotating motion of the DC motor and converts the fast motor speed into a slower and more accurate spindle rotation. By monitoring the motor current of the spindle system, the output torque of the motor can be obtained.

Let $T^S_m$ represent an output torque of the spindle DC motor. Let $T^S_i$ represent a torque transmitted to the spindle (i.e., wafer carrier) from the motor. Let $T^S_O$ represent a load torque applied on the motor axis. Let $T^S_{fm}$ and $T^S_{fs}$ represent friction moments by the mechanical components on the motor and spindle subsystems, respectively. Let $\omega_m$, $\omega_g$, and $\omega$ be the angular velocities of the motor, gearbox, and spindle, respectively.

For the motor subsystem, the relationship shown in Equation 32 can be obtained, wherein $J_m$ is a mass inertia of the motor axis. Similarly, the relationship shown in Equation 33 can be calculated, wherein $J_S$ is the mass inertia of the spindle and $T^S_w$ is the magnitude of the wafer friction moment (i.e., $T^S_w = M^S$). Assuming no energy loss for the gearbox and belt transmission, the relationship shown in Equation 34 can be obtained. Letting the gearbox and belt ratios be represented as $r_g$ and $r_b$, respectively, the relationship shown in Equation 35 can be obtained. With respect to Equation 35, the parameter $K^S_r = r_g r_b$ is the total transmission ratio of the gearbox and belt. Using Equations 32–35, the relationship shown in Equation 36 can be obtained.

$$T_m^S - T_{fm}^S - T_O^S = J_m \dot{\omega}_m \qquad \text{Equation 32}$$

$$T_i^S - T_{fs}^S - T_w^S = J_S \dot{\omega} \qquad \text{Equation 33}$$

$$T_i^S \omega_m = T_O^S \omega \qquad \text{Equation 34}$$

$$\omega_m = r_g \omega_g = r_g r_b \omega = K_r^S \omega \qquad \text{Equation 35}$$

$$T_m^S - T_{fm}^S - \frac{T_{fs}^S}{K_r^S} - \frac{T_w^S}{K_r^S} = \left(\frac{J_S}{K_r^S} + K_r^S J_m\right)\dot{\omega} \qquad \text{Equation 36}$$

Before touching down on the polishing pad, the wafer carrier starts rotating at $\omega$ and then pushes the wafer down against the polishing pad. Therefore, it is appropriate to consider a steady-state rotation of the spindle (i.e., $\dot{\omega}=0$) before and after the wafer carrier touches down on the polishing pad. Also, before the wafer carrier touches down on the polishing pad, $T^S_w=0$. Therefore, the motor torque that overcomes the mechanical friction moments prior to the wafer carrier touching down on the polishing pad is represented as $T^S_{m0}$ as shown in Equation 37. Once the wafer carrier touches down on the polishing pad, the motor torque that overcomes the mechanical friction moments and the polishing friction moment between the wafer and polishing pad is represented as $T^S_{m1}$ as shown in Equation 38.

$$T_{m0}^S = T_{fm}^S + \frac{T_{fs}^S}{K_r^S} \qquad \text{Equation 37}$$

$$T_{m1}^S = T_{fm}^S + \frac{T_{fs}^S}{K_r^S} + \frac{T_w^S}{K_r^S} \qquad \text{Equation 38}$$

Since the mechanical friction moments do not change before and after the wafer carrier touches down on the polishing pad, Equations 37 and 38 are used along with the DC motor relationship $T=K^S_i I$ to obtain the relationship shown in Equation 39. With respect to Equation 39, $K^S_i$ is the torque/current constant for the DC motor and $I^S_{m1}$ and $I^S_{m0}$ are the motor currents before and after the wafer carrier touches down on the polishing pad, respectively. From Equation 39, it is discernable that by measuring the spindle motor current, the friction torque between the wafer and polishing pad can be estimated during the CMP process. Furthermore, by combining Equations 39 and 14 it is possible to estimate friction model parameters (e.g., $\mu_s$ and $\sigma$, among others).

$$T_w^S = M^S = K_r^S(T_{m1}^S - T_{m0}^S) = K_r^S K_i^S (I_{m1}^S - I_{m0}^S) \qquad \text{Equation 39}$$

Figure 11:
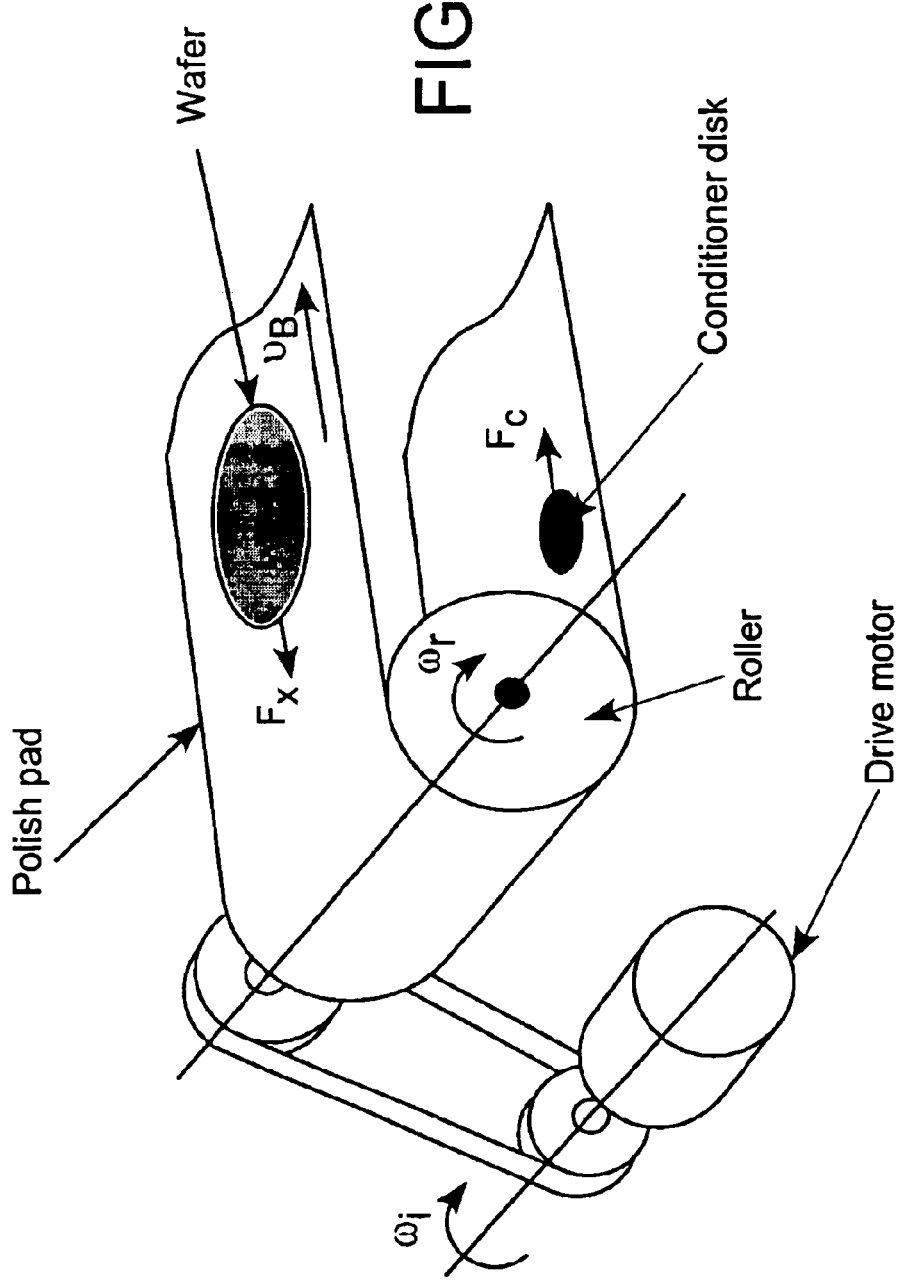
FIG. 11 is an illustration showing a kinematic schematic of the roller system, in accordance with one embodiment of the present invention.

FIG. 11 is an illustration showing a kinematic schematic of the roller system, in accordance with one embodiment of the present invention. An AC motor is used to drive the roller system. The AC motor also controls the roller speed at a particular value through use of a servo module. By monitoring the motor current of the roller system, the output torque of the motor can be obtained.

Using a similar approach as described with respect to Equations 32–39, a kinematic relationship for the roller system is developed as shown in Equation 40. With respect to Equation 40, the parameter $K^R_r$ is the ratio of the roller angular velocity and the roller motor angular velocity. The parameter $K^R_i$ is the roller motor torque/current constant. At different roller motor speeds, the value of $K^R_i$ may change. However, the value of $K^R_i$ can be obtained by comparing relative current values before and after initiation of the CMP process. The parameters $I^R_{m0}$ and $I^R_{m1}$ are the roller motor currents under idle and operating states, respectively.

$$T_w^R M^R = K_r^R K_i^R (I_{m1}^R - I_{m0}^R) \qquad \text{Equation 40}$$

To use the spindle moment $M^S$ and roller moment $M^R$ representations of the present invention, it is necessary to estimate the mechanical friction torques of the spindle and roller systems, i.e., $I^S_{m0}$ and $I^R_{m0}$, respectively. The friction among moving mechanical components of the spindle and roller systems can be modeled as Coulomb and viscous friction torques. Therefore, for the spindle system, Equation 37 can be represented as shown in Equation 41, wherein $f_c$ and $f_v$ are the Coulomb and viscous friction torques, respectively. In following, Equation 41 is used to estimate $T^S_{m0}$ by measuring the mechanical friction torque at various spindle angular velocities.

$$T_{m0}^S = f_v \omega + f_c \qquad \text{Equation 41}$$

Figure 12:
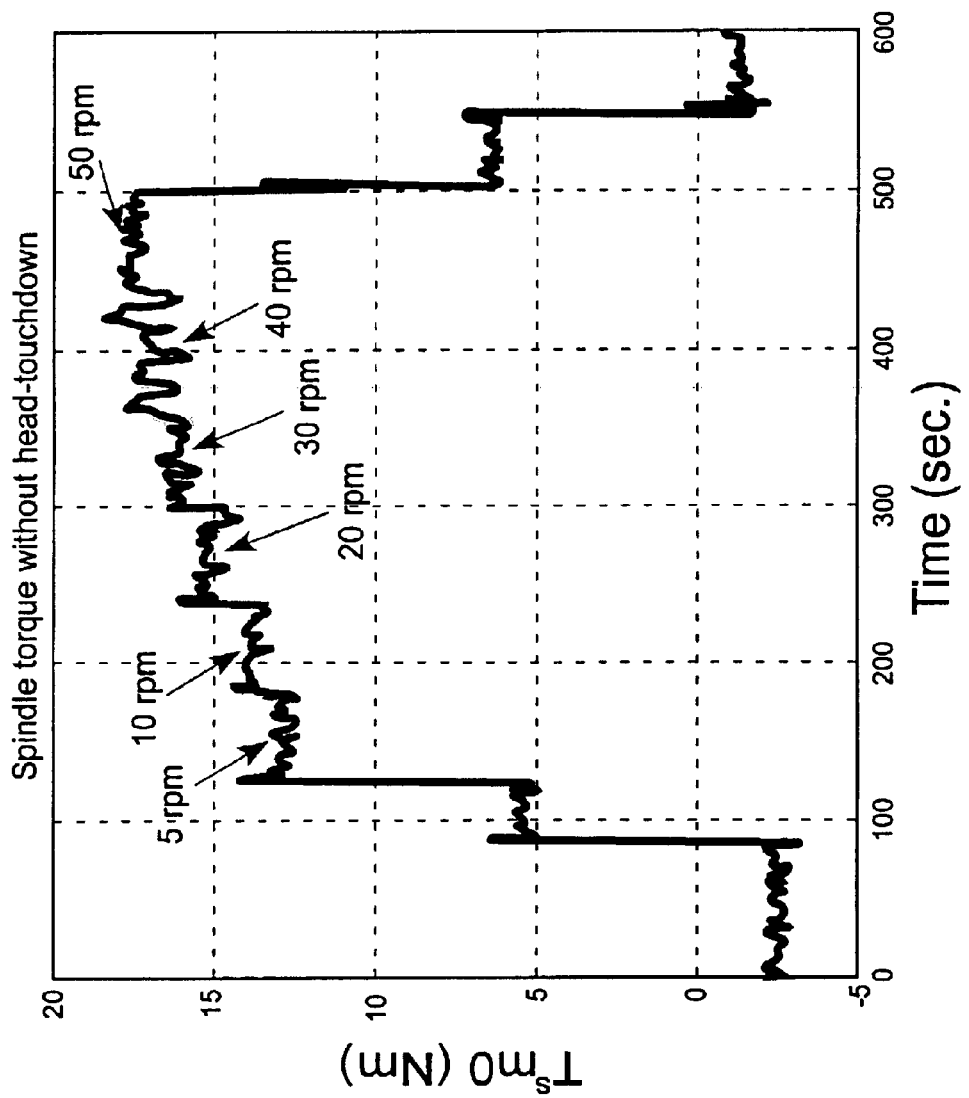
FIG. 12 is an illustration showing measured spindle mechanical friction torques for various spindle angular velocities, in accordance with the example embodiment.

An example embodiment is presented in which the mechanical friction torque is measured at various spindle angular velocities. It should be recognized that the example embodiment is provided for discussion purposes and is not to be considered limiting with respect to the present invention. Table 1 presents the spindle motor constant and mechanical transmission ratios used in the example embodiment. FIG. 12 is an illustration showing measured spindle mechanical friction torques for various spindle angular velocities, in accordance with the example embodiment. As shown in FIG. 12, the spindle mechanical friction torque is more stable when the spindle (i.e., wafer carrier) is rotating at lower angular velocities. A least-square estimate of the spindle mechanical friction torque as a function of spindle angular velocity for the example embodiment yields an $f_c$ value of 12.5533 N m and an $f_v$ value of 0.1103 N m sec.

TABLE 1

Spindle Motor Constant and Mechanical Transmission Ratios for Example Embodiment

| Parameter | $K_i^S$ | $r_g$ | $r_b$ |
|---|---|---|---|
| Value | 0.3341 Nm/A | 15 | 2 |

Figure 13:
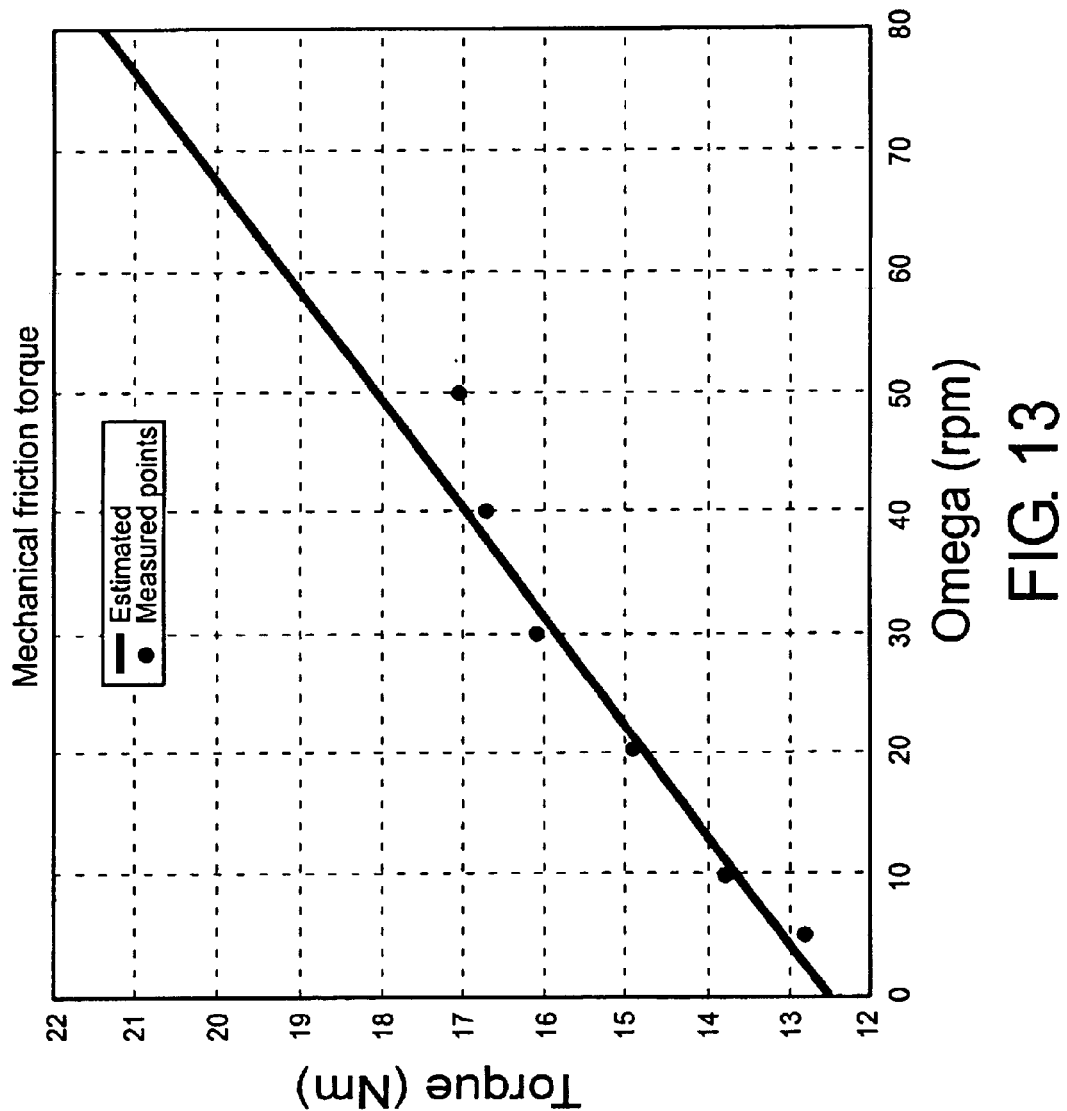
FIG. 13 is an illustration showing the least-square estimate of the measured spindle mechanical friction torque as a function of spindle angular velocity, in accordance with the example embodiment.

FIG. 13 is an illustration showing the least-square estimate of the measured spindle mechanical friction torque as a function of spindle angular velocity, in accordance with the example embodiment. FIG. 13 also shows the measured spindle mechanical friction torques from FIG. 12. It is observed that Equation 41 provides accurate estimates of the spindle mechanical friction torque.

To use the spindle moment $M^S$ and roller moment $M^R$ representations of the present invention, it is also necessary to estimate the model parameters $(\mu_s/\theta)$ and $\sigma$. The friction moment of the spindle $M^S$ given by Equation 14 can be rewritten as shown in Equation 42. A least-square estimate of model parameters $\Theta$ can be obtained as shown in Equation 43.

$$M^S = p_0 E_1(v_B, \omega)\left(\frac{\mu_s}{\theta}\right) + \left(\frac{2}{3}\pi p_0 \omega R^3\right)\sigma = X^T \Theta \qquad \text{Equation 42}$$

where $$X^T = \left[p_0 E_1(v_B, \omega)\frac{2}{3}\pi p_0 \omega R^3\right], \Theta = \left[\frac{\mu_s}{\theta}\sigma\right]$$

$$\hat{\Theta} = (XX^T)^{-1} M^S \qquad \text{Equation 43}$$

Figure 14:
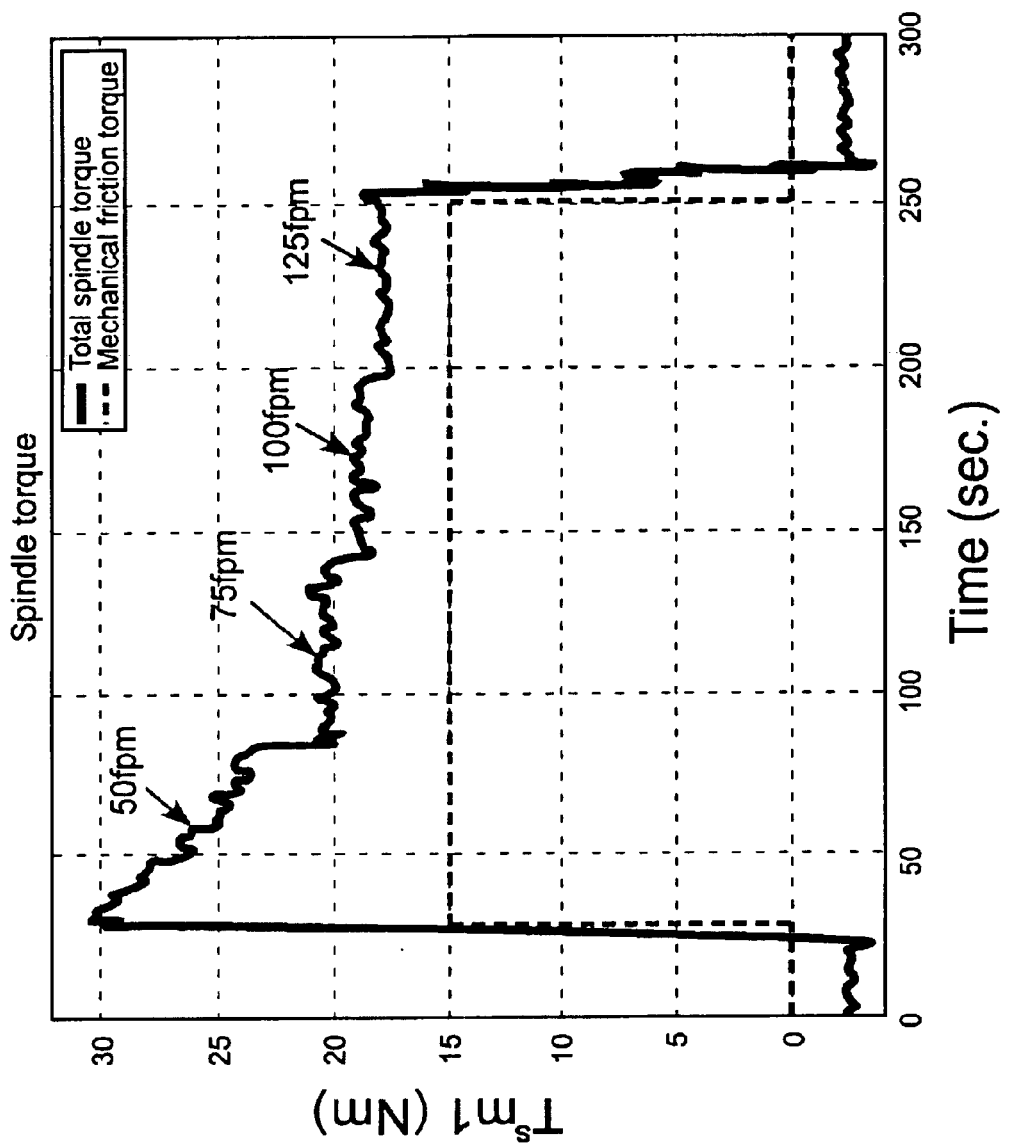
FIG. 14 is an illustration showing $T^S_{m1}$ for a wafer carrier angular velocity of 20 rpm and various polishing pad linear velocities, in accordance with the example embodiment.
Figure 15:
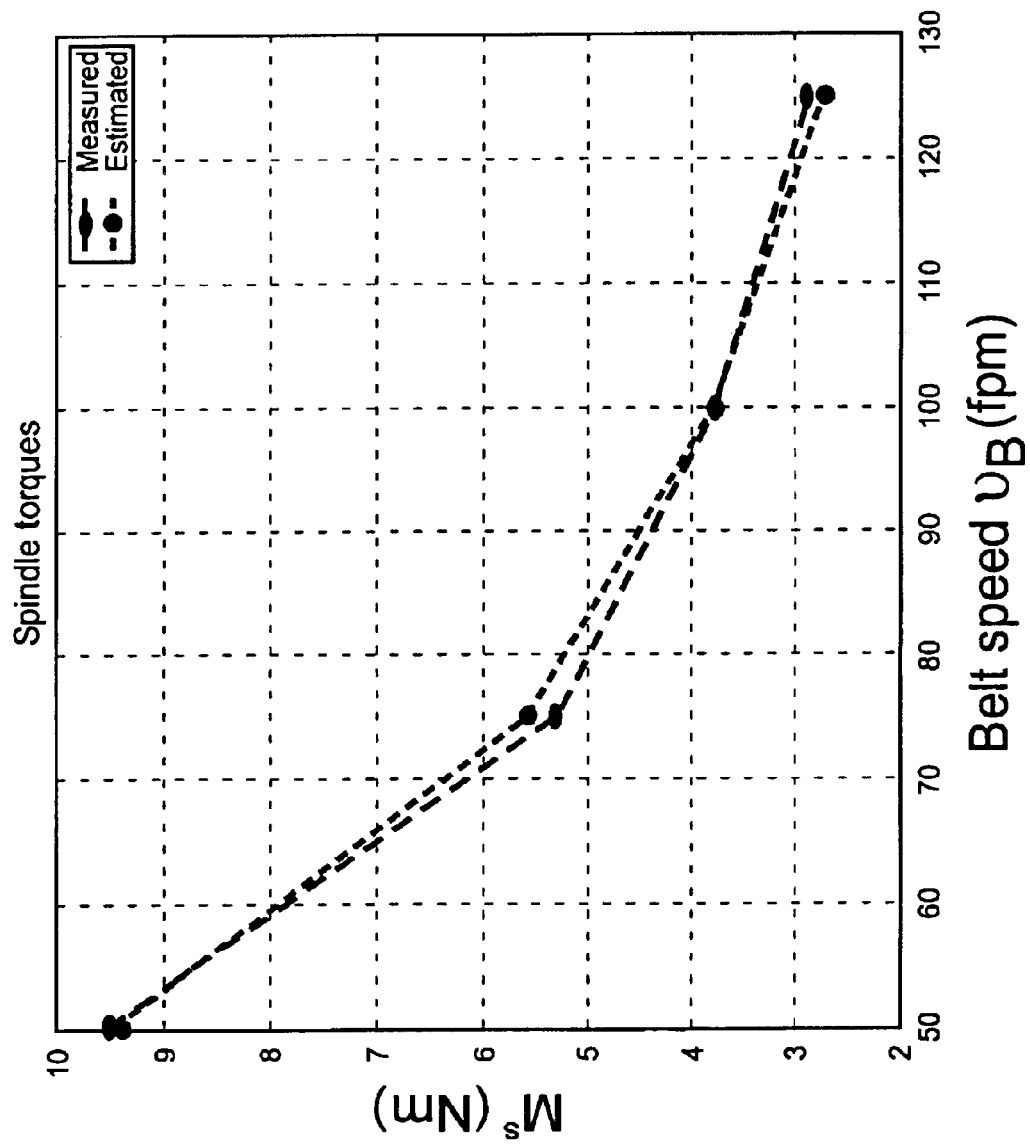
FIG. 15 is an illustration showing $M^S$ as a function of polishing pad linear velocity, in accordance with the example embodiment.

An example embodiment is presented in which the model parameters $(\mu_s/\theta)$ and $\sigma$ are determined through measurement of the friction moment of the spindle $M^S$ at various polishing pad linear velocities $v_B$. It should be recognized that the example embodiment is provided for discussion purposes and is not to be considered limiting with respect to the present invention. Table 2 presents CMP process parameters used in the example embodiment. The example embodiment considered different polishing pad linear velocities. Also, relatively low polishing pad linear velocities were considered so that relatively large spindle torques could be obtained. FIG. 14 is an illustration showing $T^S_{m1}$ for a wafer carrier angular velocity of 20 rpm and various polishing pad linear velocities, in accordance with the example embodiment. FIG. 15 is an illustration showing $M^S$ as a function of polishing pad linear velocity, in accordance with the example embodiment. Based on the example embodiment, the model parameters $(\mu_s/\theta)$ and $\sigma$ were estimated to be 0.0323 and −0.0085, respectively. Since the friction coefficient $\mu_s$ decays during the CMP process due to the lack of conditioning, the model parameters $(\mu_s/\theta)$ and $\sigma$ were estimated using stabilized values for $M^S$. From FIG. 15, it is observed that the estimated spindle torque compares well with the corresponding measured values.

TABLE 2

CMP Process Parameter for Example Embodiment

| Slurry Flowrate | Wafer Carrier Pressure | Air Bearing Pressures and Platen Height | Conditioning |
|---|---|---|---|
| 150 mL/min. | 5 psi | 5 psi, 13 psi, 45 psi, 11 psi, 0 psi, 0 psi, 9 mils | none |

A number of experiments were performed to validate the friction models of the present invention. The experiments were performed using the estimated values of the mechanical friction torques of the spindle and roller systems, i.e., $I^S_{m0}$ and $I^R_{m0}$, respectively, as obtained in the previously discussed example embodiment. The experiments also used the estimated values of the model parameters $(\mu_s/\theta)$ and $\sigma$, as obtained in the previously discussed example embodiment. In the validation experiments, a baseline CMP process as described in Table 2 was used with a polishing pad linear velocity of 250 fpm. Prior to each validation experiment, ex-situ polishing pad conditioning was performed as described in Table 3. The ex-situ conditioning is performed prior to contact between the wafer and polishing pad to ensure that the initial wafer-to-polishing pad friction coefficient is substantially the same for each experiment. Each validation experiment was performed on a thermal oxide wafer. Validation experiments using the baseline CMP process were performed to evaluate the conditioning models. Validation experiments were also performed to evaluate variations in polishing pad linear velocity, wafer carrier pressure, and wafer carrier angular velocity.

TABLE 3

Ex-Situ Conditioning for Validation Experiments

| Slurry Flowrate | Polishing Pad Linear Velocity | Conditioner Disk Downforce | Number of Sweeps | Sweep Time |
|---|---|---|---|---|
| 150 mL/min. | 150 fpm | 7 lbs | 4 | 7 sec. |

Figure 16:
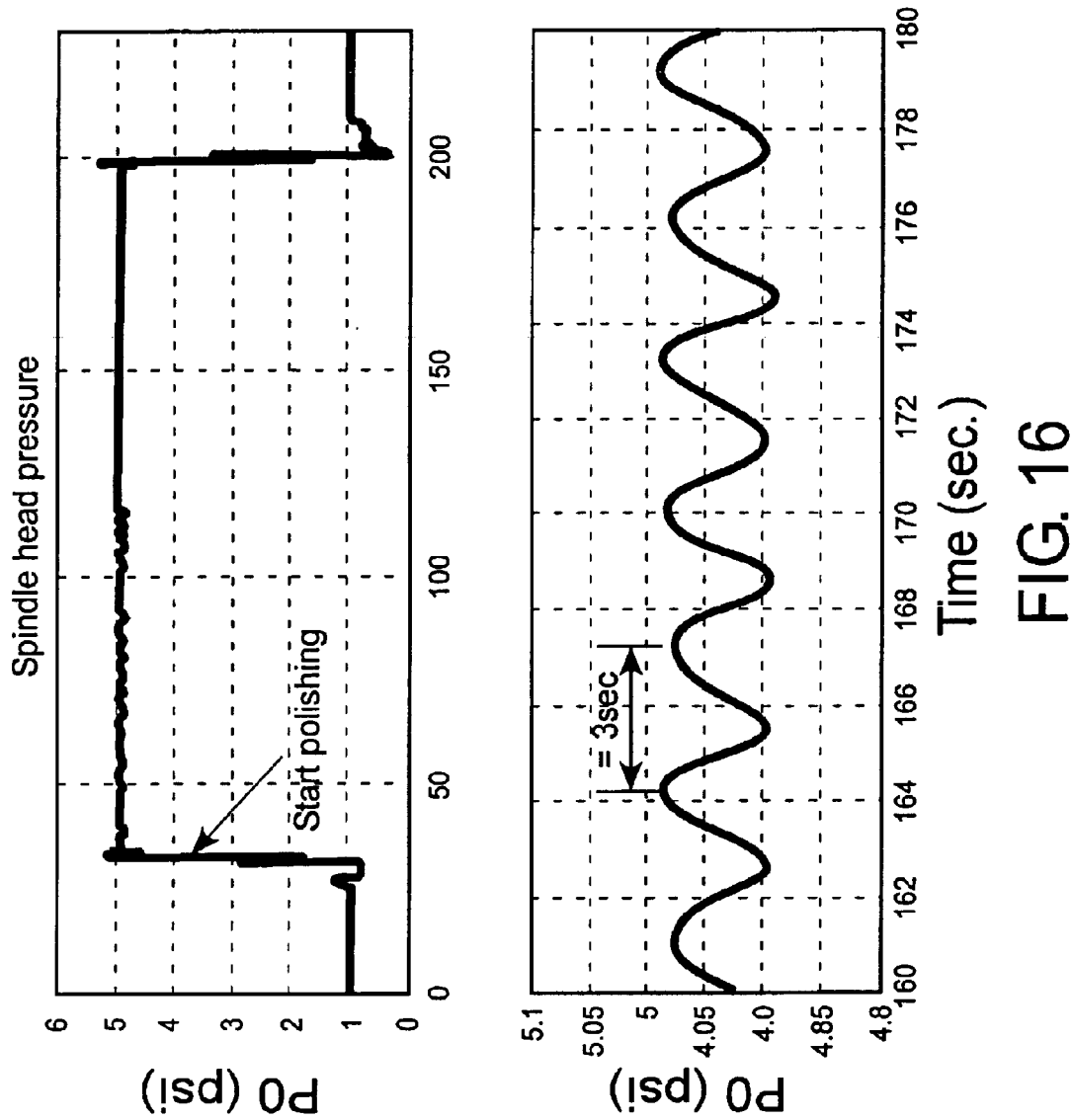
FIG. 16 is an illustration showing a wafer carrier pressure during a first validation experiment, in accordance with one embodiment of the present invention.
Figure 17:
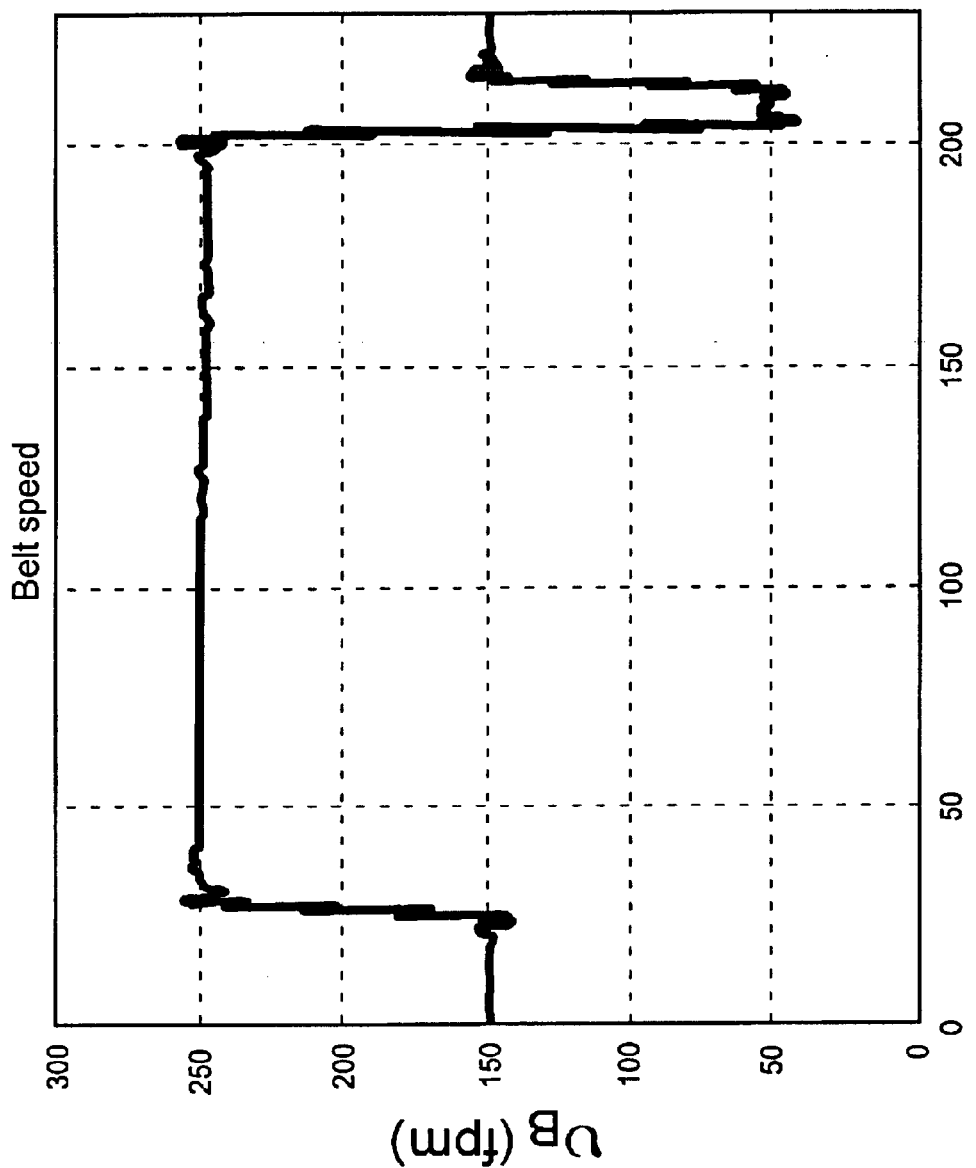
FIG. 17 is an illustration showing a polishing pad linear velocity during the first validation experiment, in accordance with one embodiment of the present invention.

FIG. 16 is an illustration showing a wafer carrier pressure during a first validation experiment, in accordance with one embodiment of the present invention. FIG. 17 is an illustration showing a polishing pad linear velocity during the first validation experiment, in accordance with one embodiment of the present invention. The first validation experiment corresponds to the baseline CMP process without conditioning. The CMP process duration of the first validation experiment is 168 seconds. The wafer carrier pressure experiences a small periodic oscillation during the CMP process. The oscillation results from a design of the wafer carrier and from the spindle not being perfectly perpendicular to the polishing pad surface.

Figure 18:
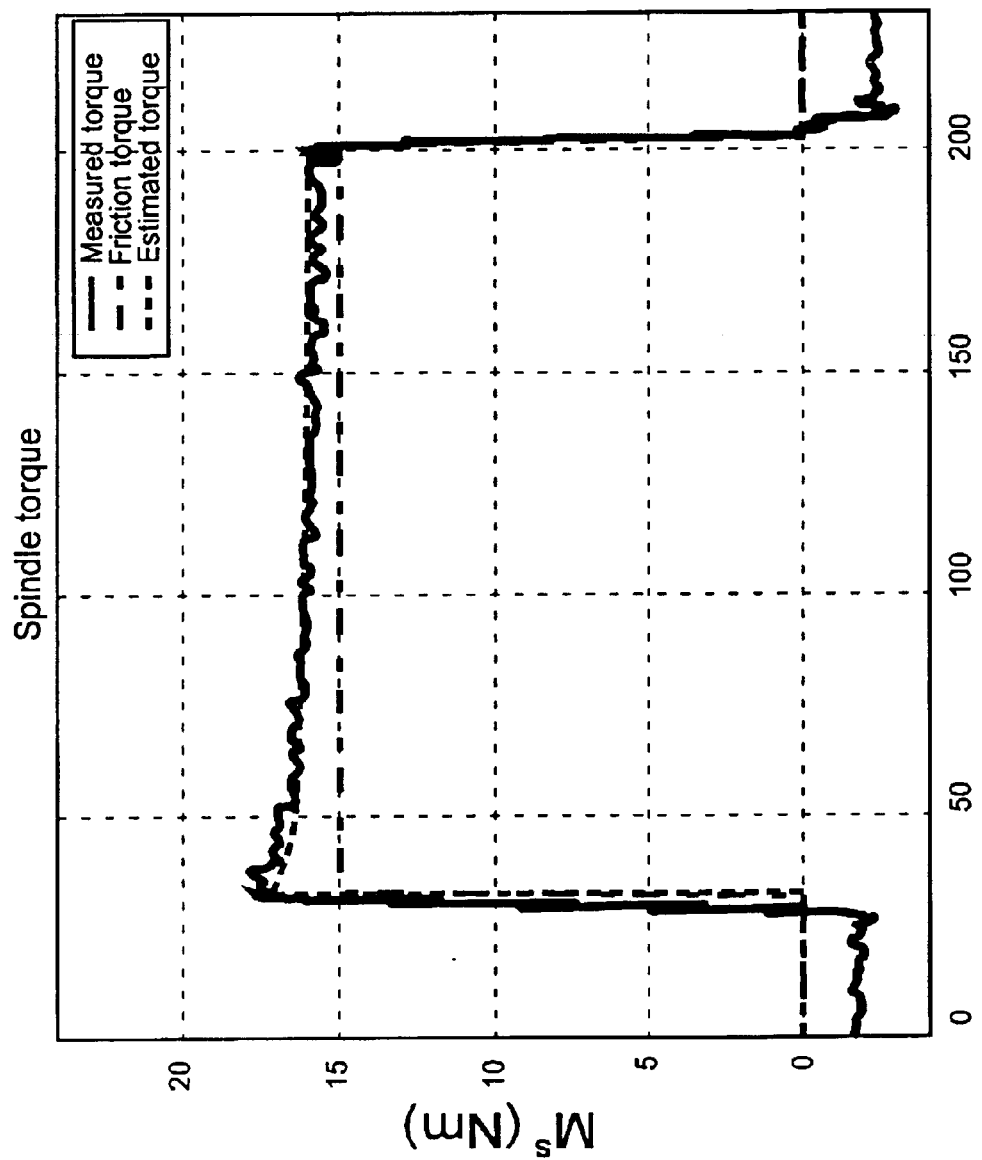
FIG. 18 is an illustration showing a spindle torque during the first validation experiment, in accordance with one embodiment of the present invention.

FIG. 18 is an illustration showing a spindle torque during the first validation experiment, in accordance with one embodiment of the present invention. The spindle torque generated by the wafer-to-polishing pad friction is small. Therefore, the measured spindle torque is larger than the spindle friction torque by a small amount. This corresponds to Equation 18 under the condition of a high polishing pad linear velocity.

Figure 19:
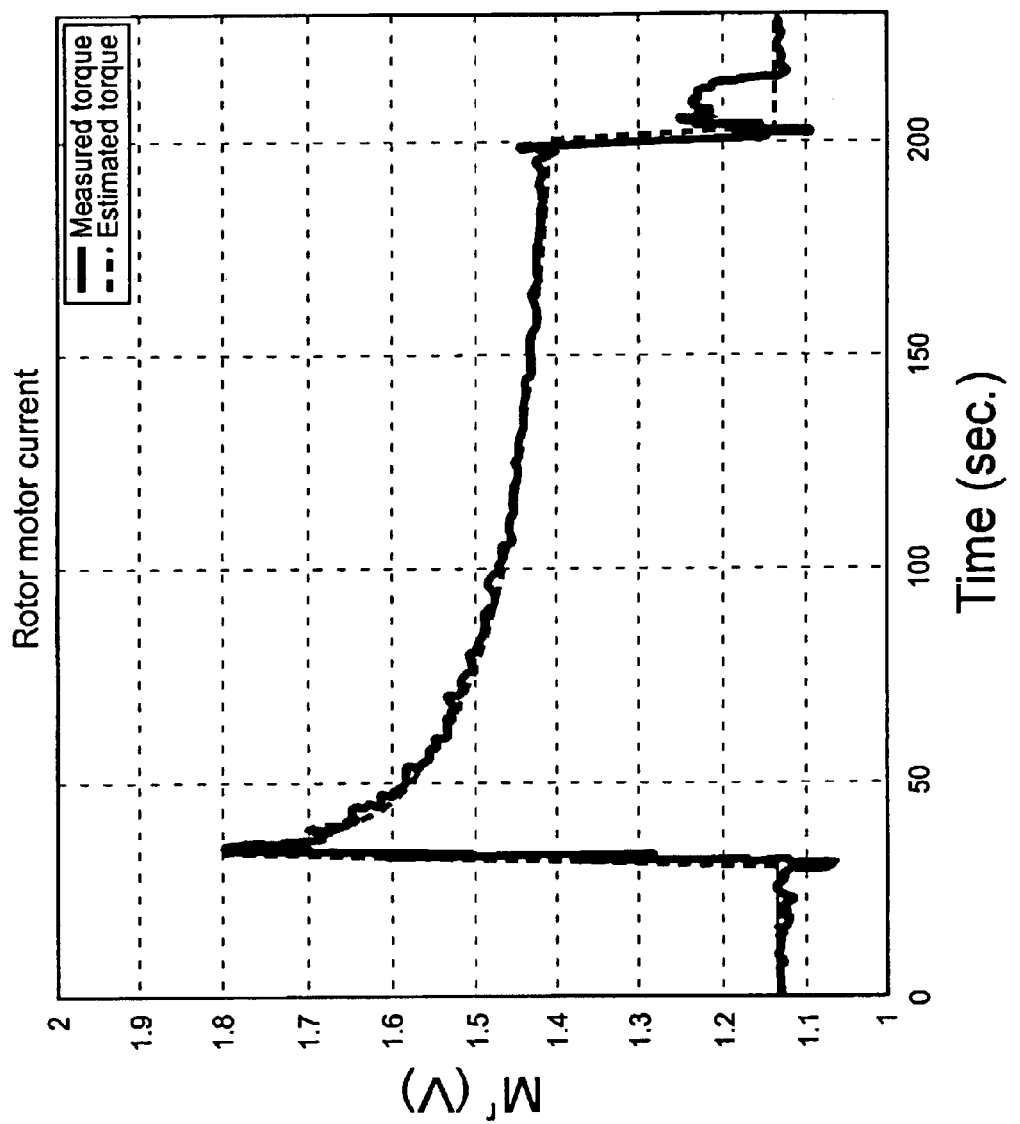
FIG. 19 is an illustration showing a roller torque during the first validation experiment, in accordance with one embodiment of the present invention.

FIG. 19 is an illustration showing a roller torque during the first validation experiment, in accordance with one embodiment of the present invention. A current monitor reading (in voltage) provided by the roller motor circuit is used as the indicator of the roller motor torque. A decrease in the roller torque during the CMP process indicates that the friction coefficient $\mu_s$ is decaying in the absence of conditioning. Since the roller torque changes by a relatively large amount during the CMP process, the roller torque is used to estimate the decay of the friction coefficient $\mu_s$. More specifically, the roller motor current is monitored to estimate the decay of $\mu_s$ during the CMP process.

A curve-fitting algorithm is used to estimate the decay of $\mu_s$ between the wafer and polishing pad during the CMP process. The estimate the decay of $\mu_s$ based on the curve-fitting is used to predict the spindle torque as shown in FIG. 18 ("Estimated torque"). Since the ratio of the spindle and roller torques are relatively constant for the case of a high polishing pad linear velocity, the spindle torque predicted using the estimate of $\mu_s$ based on the curve-fitting compares well with the measured spindle torque.

Figure 20:
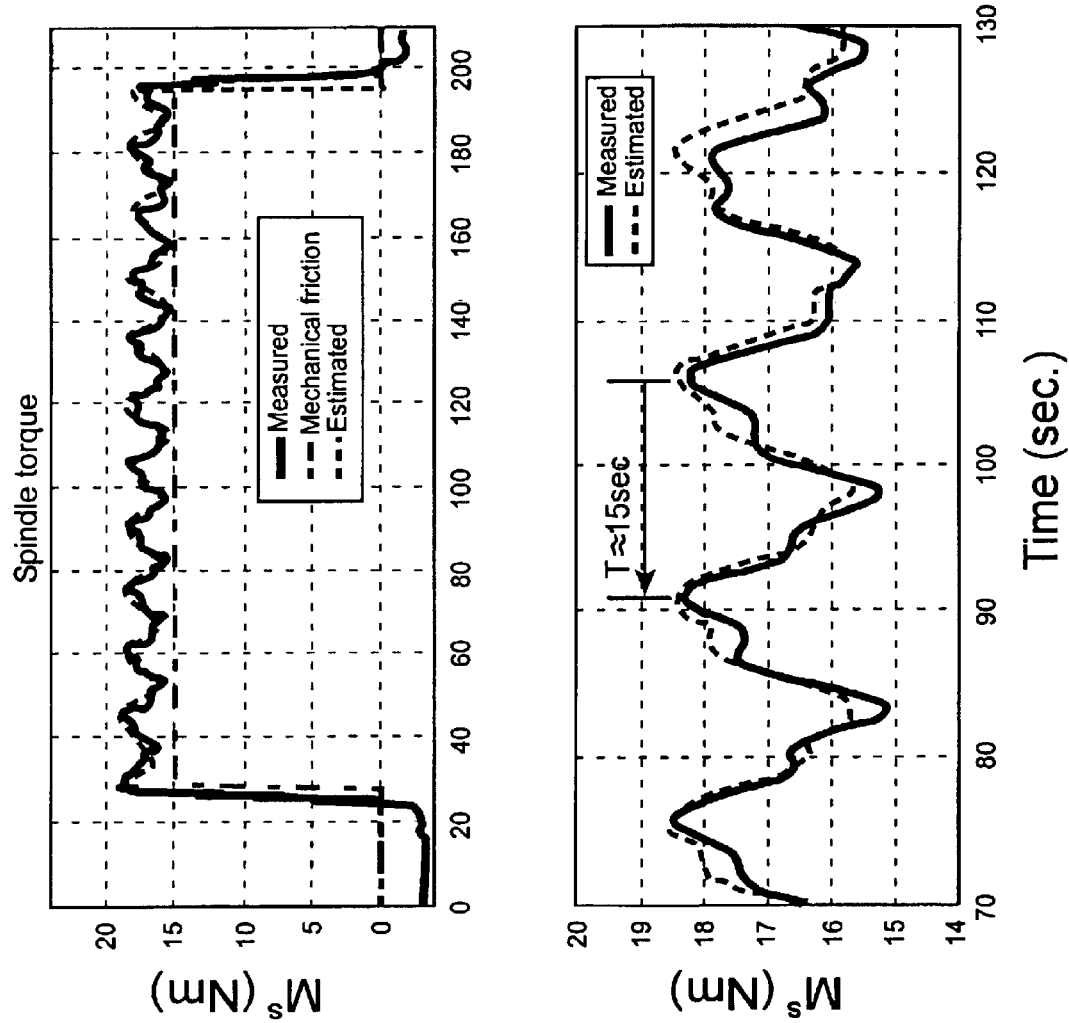
FIG. 20 is an illustration showing a spindle torque during a second validation experiment, in accordance with one embodiment of the present invention.

FIG. 20 is an illustration showing a spindle torque during a second validation experiment, in accordance with one embodiment of the present invention. The second validation experiment corresponds to the baseline CMP process with 100% conditioning, wherein the percentage of conditioning refers to the ratio of the conditioned CMP process time over the total CMP process time. The conditioner sweep time ($T_c$) is 7 seconds, and the conditioner disk downforce ($F_c$) is 7 lbs. The measured spindle torque has an oscillation period of about 15 seconds, which is close to the two-sweep conditioning time of 14 seconds. The difference between the oscillation period and the two-sweep time is caused by the time required for the conditioner disk to decelerate and accelerate during a sweep.

Figure 21:
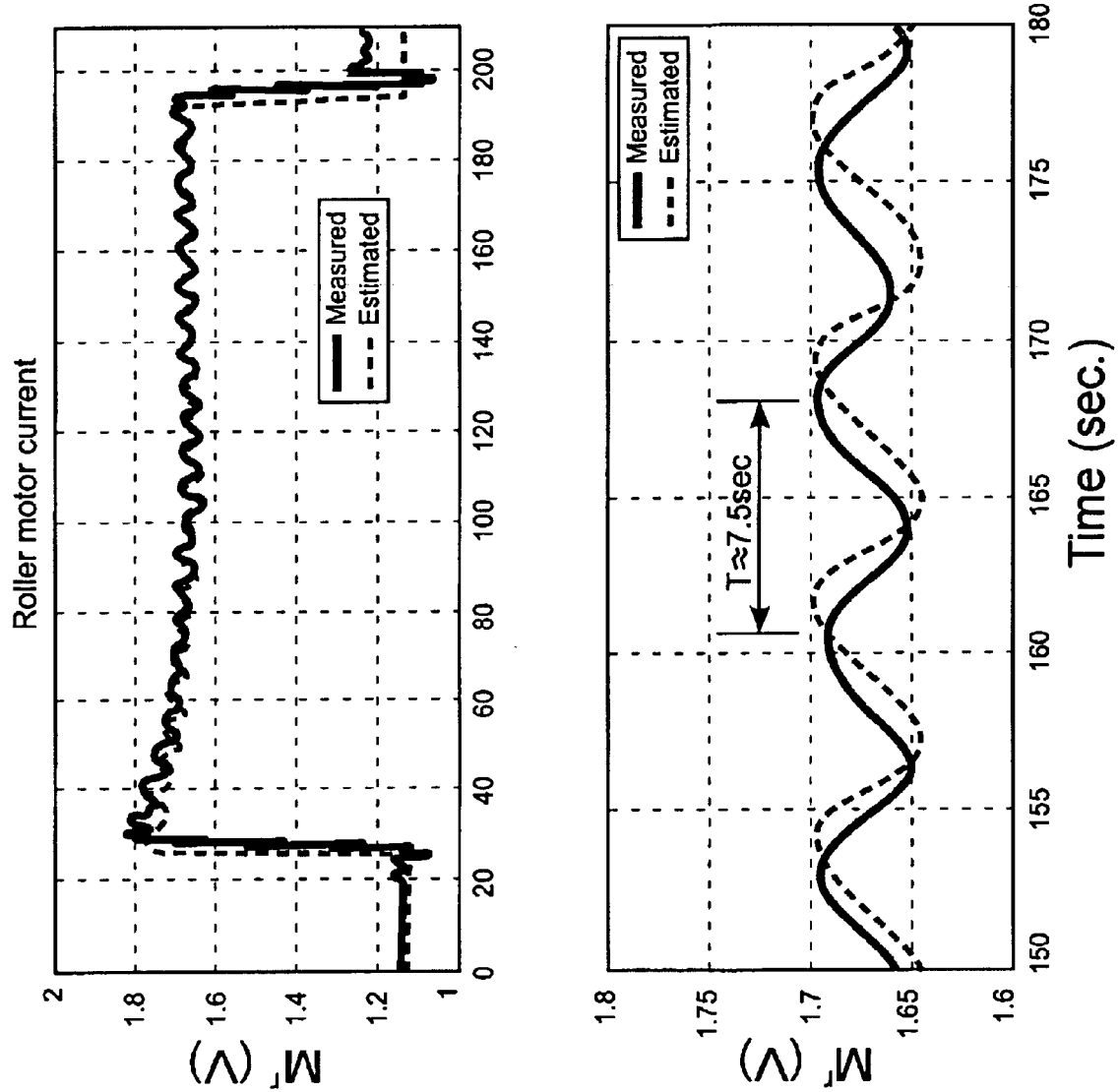
FIG. 21 is an illustration showing a roller torque during the second validation experiment, in accordance with one embodiment of the present invention.

FIG. 21 is an illustration showing a roller torque during the second validation experiment, in accordance with one embodiment of the present invention. The roller torque has an oscillation period of about 7.5 seconds, which is close to the one-sweep conditioning time of 7 seconds. Again, the difference between the oscillation period and the one-sweep time is caused by the time required for the conditioner disk to decelerate and accelerate during a sweep.

The estimated spindle and roller torques shown in FIGS. 20 and 21, respectively, are close to the measured values. In the estimations, $\gamma_\mu=0.8$, $\beta_1=0.7$, and $\beta_2=0.3$. FIGS. 20 and 21 show that with conditioning both the spindle and roller torques maintain constant levels, rather than decreasing as shown in FIGS. 18 and 19 without conditioning.

Figure 22:
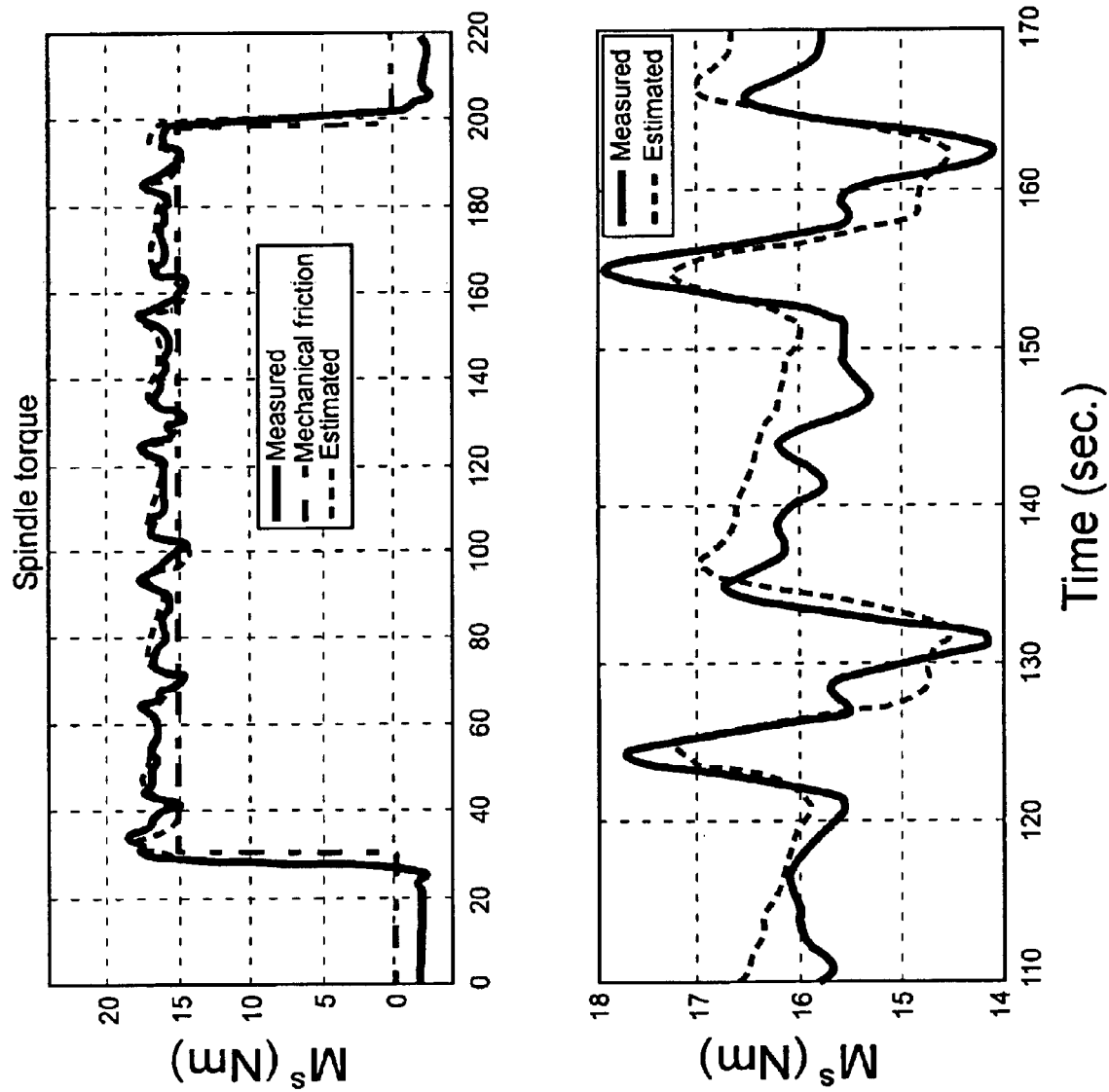
FIG. 22 is an illustration showing a spindle torque during a third validation experiment, in accordance with one embodiment of the present invention.
Figure 23:
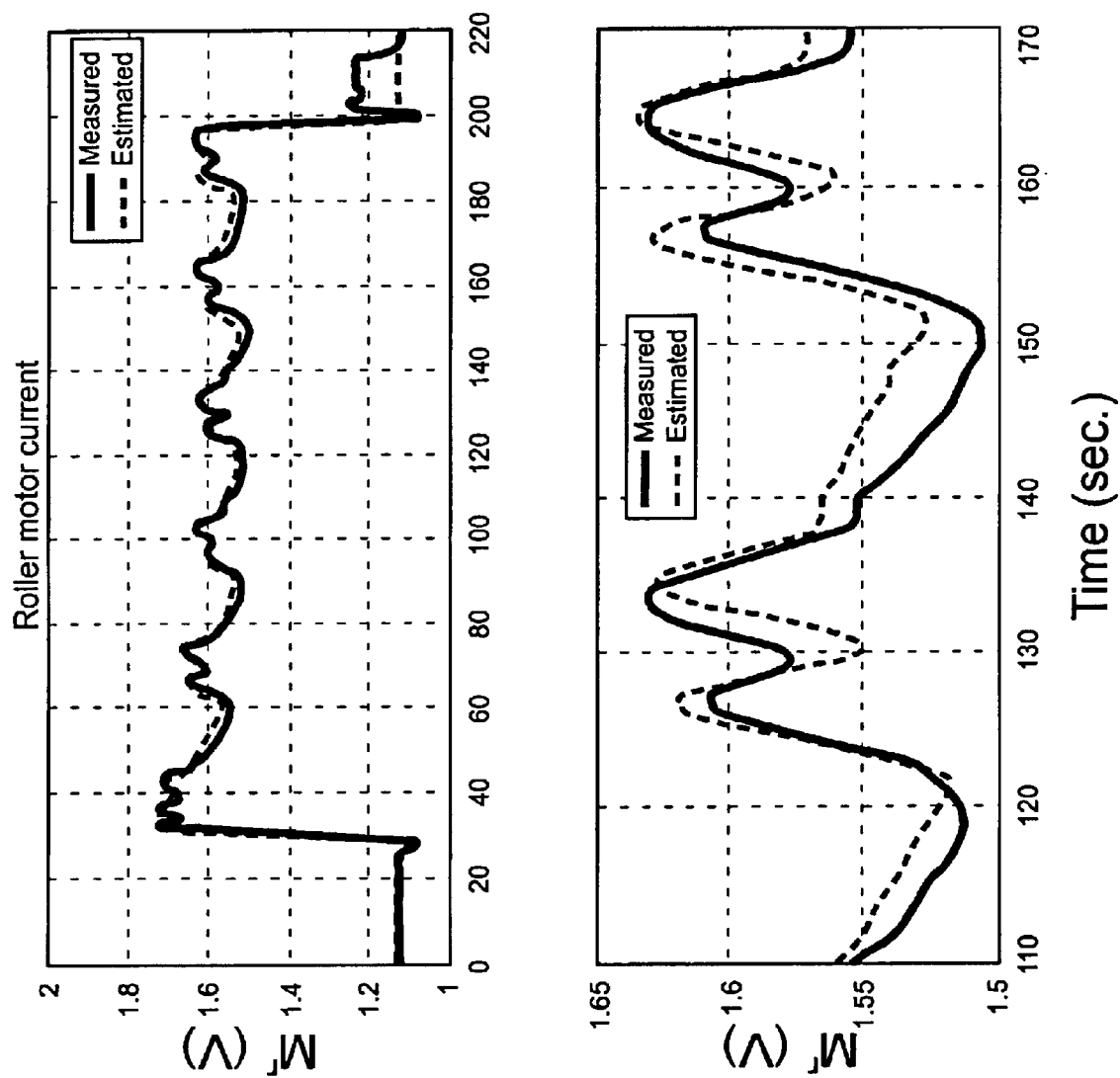
FIG. 23 is an illustration showing a roller torque during the third validation experiment, in accordance with one embodiment of the present invention.

FIG. 22 is an illustration showing a spindle torque during a third validation experiment, in accordance with one embodiment of the present invention. FIG. 23 is an illustration showing a roller torque during the third validation experiment, in accordance with one embodiment of the present invention. The third validation experiment corresponds to the baseline CMP process with 50% conditioning and a conditioner disk downforce ($F_c$) of 7 lbs. The estimated spindle and roller torques shown in FIGS. 22 and 23, respectively, are close to the measured values.

Figure 24:
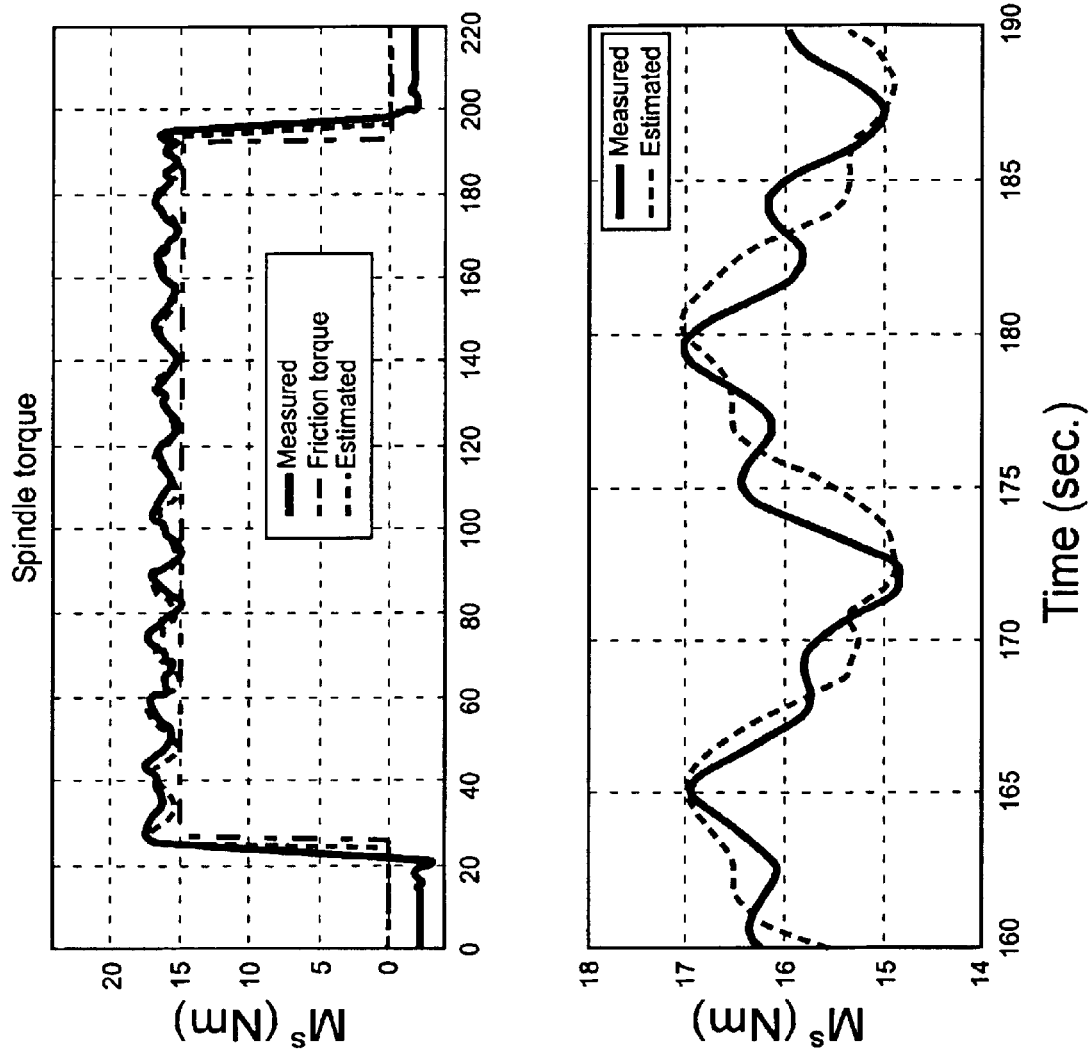
FIG. 24 is an illustration showing a spindle torque during a fourth validation experiment, in accordance with one embodiment of the present invention.
Figure 25:
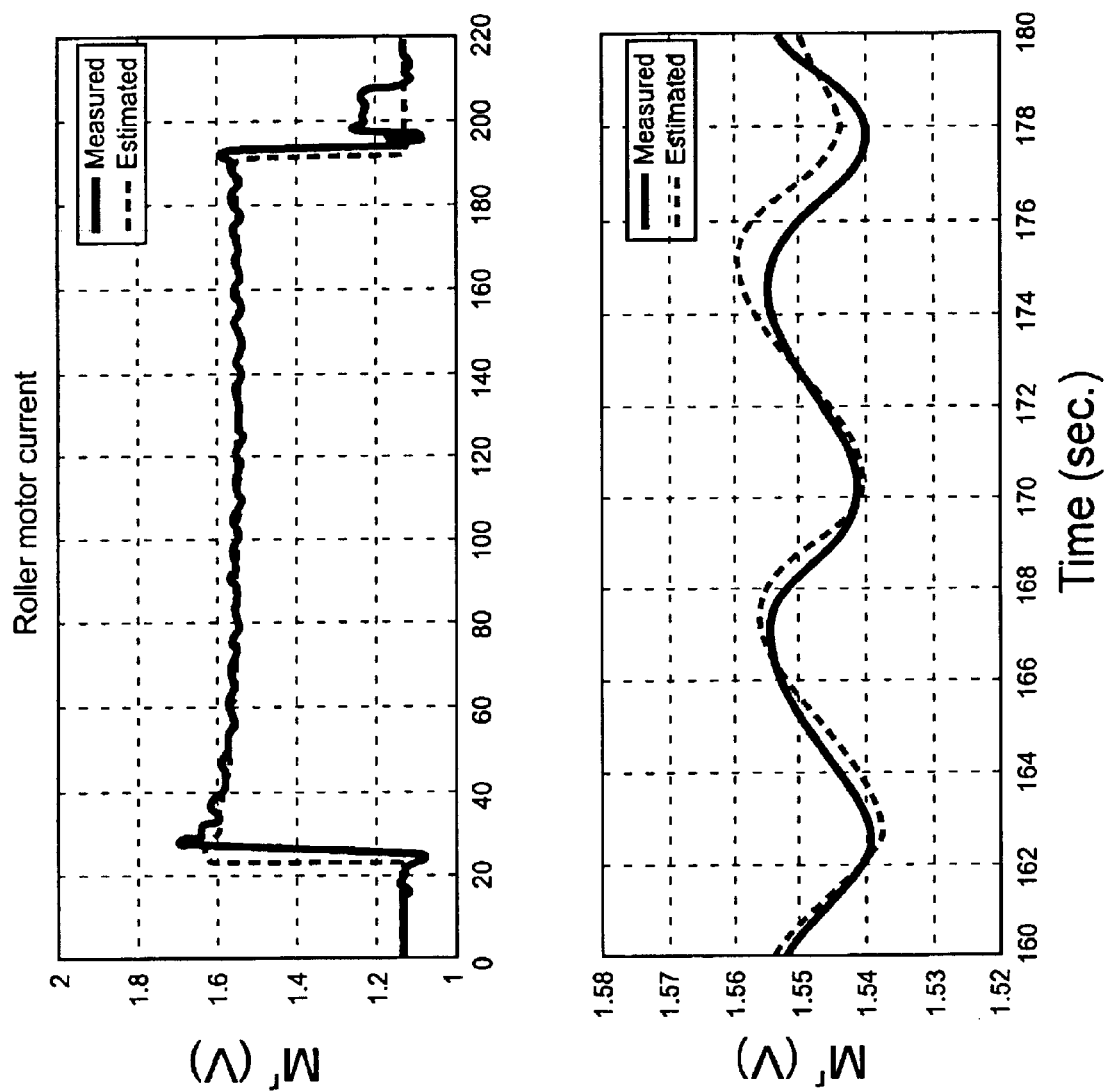
FIG. 25 is an illustration showing a roller torque during the fourth validation experiment, in accordance with one embodiment of the present invention.

FIG. 24 is an illustration showing a spindle torque during a fourth validation experiment, in accordance with one embodiment of the present invention. FIG. 25 is an illustration showing a roller torque during the fourth validation experiment, in accordance with one embodiment of the present invention. The fourth validation experiment corresponds to the baseline CMP process with 100% conditioning and a conditioner disk downforce ($F_c$) of 3 lbs. The estimated spindle and roller torques shown in FIGS. 24 and 25, respectively, are close to the measured values.

The conditioner disk downforce affects the spindle and roller torques. For example, the roller torque under 3 lbs conditioner disk downforce is smaller than that under 7 lbs conditioner disk downforce. An increase in conditioner disk downforce increases the roller torque by increasing the wafer-to-polishing pad friction coefficient $\mu_s$ (i.e., increased $\gamma_\mu$). Also, an increase in conditioner disk downforce increases the roller torque through contact between the conditioner disk and the polishing pad.

Figure 26:
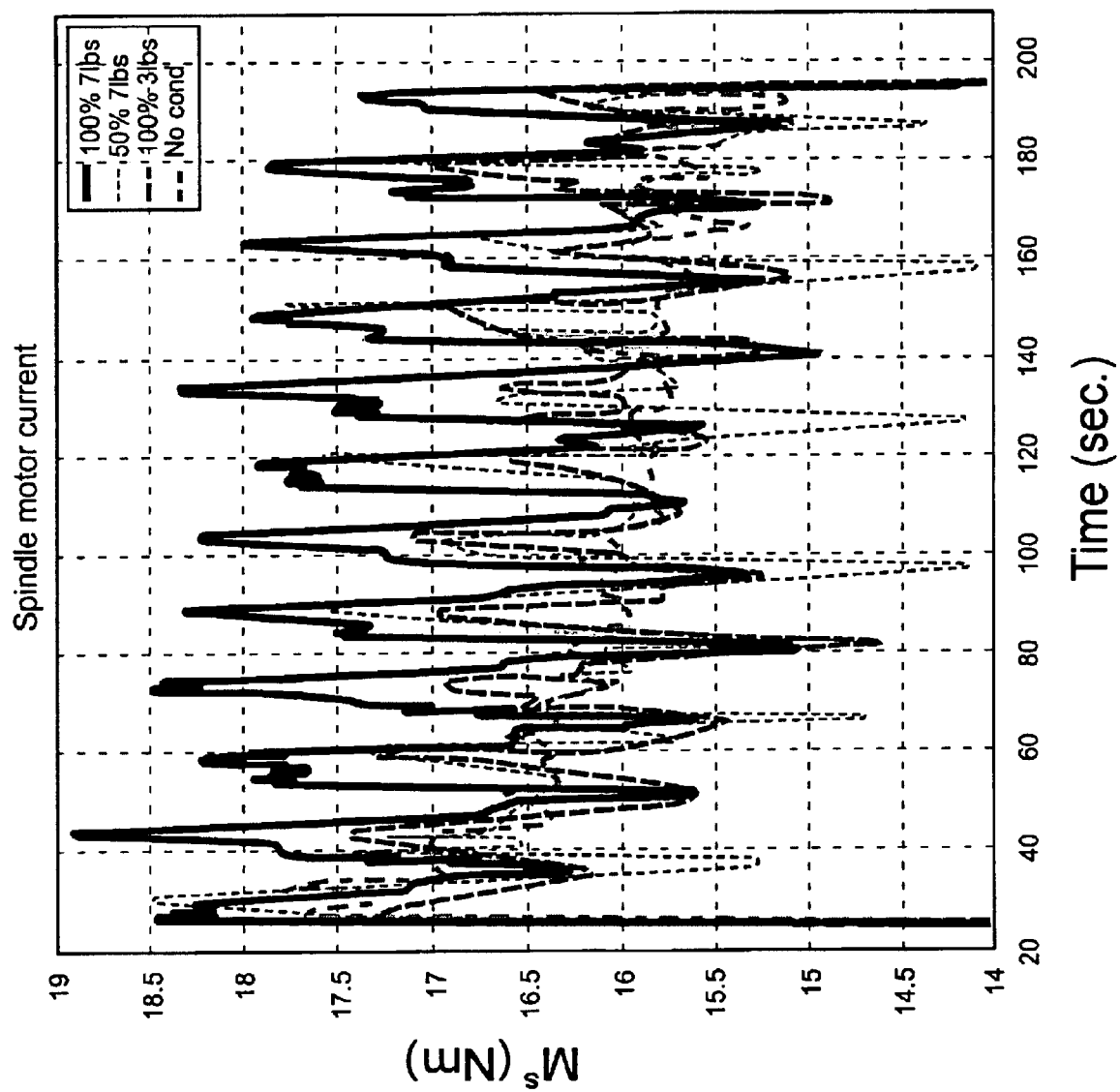
FIG. 26 is an illustration showing a combination of the spindle torque results for the first through fourth validation experiments, in accordance with one embodiment of the present invention.
Figure 27:
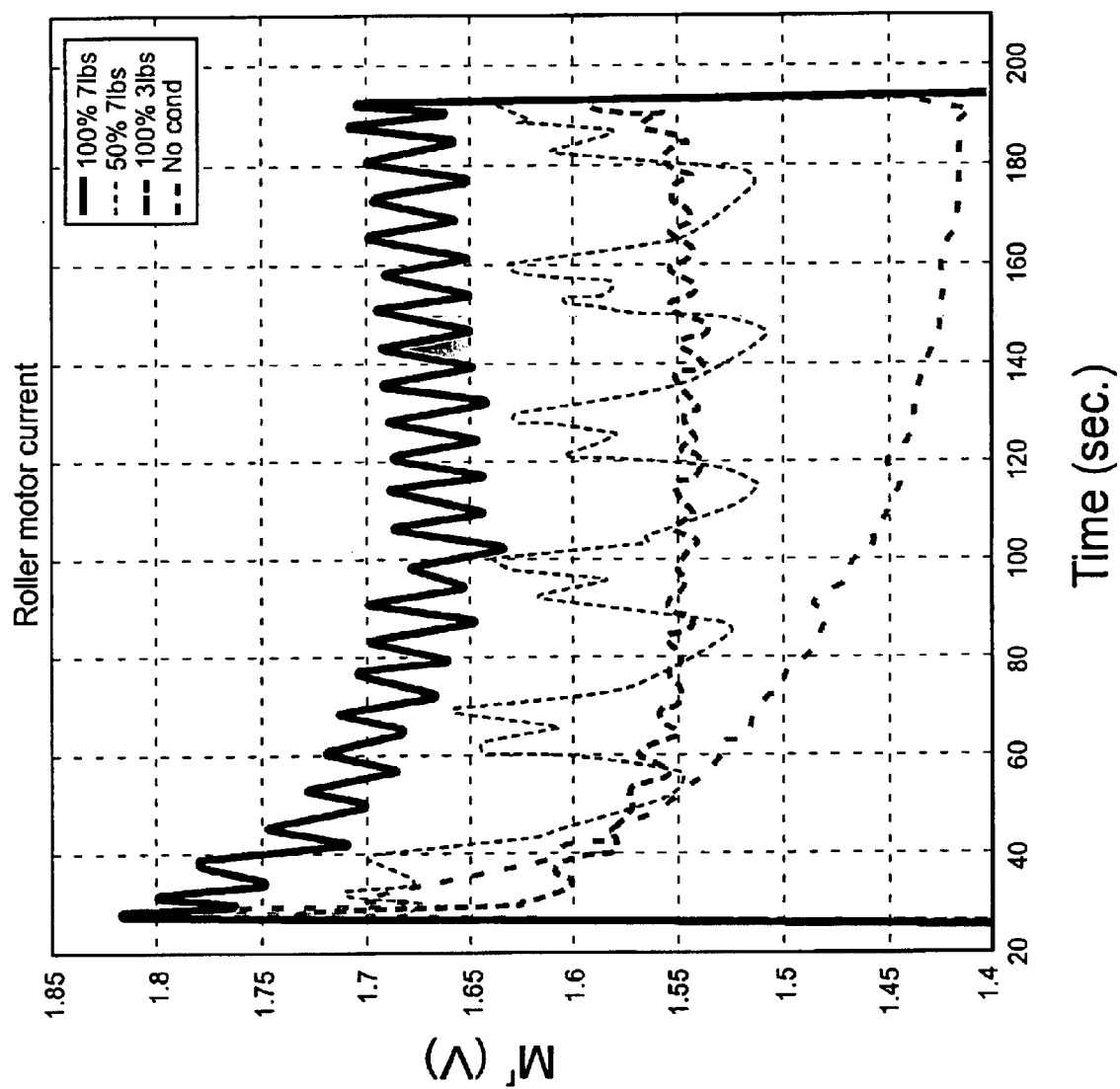
FIG. 27 is an illustration showing a combination of the roller torque results for the first through fourth validation experiments, in accordance with one embodiment of the present invention.

FIG. 26 is an illustration showing a combination of the spindle torque results for the first through fourth validation experiments, in accordance with one embodiment of the present invention. FIG. 27 is an illustration showing a combination of the roller torque results for the first through fourth validation experiments, in accordance with one embodiment of the present invention. Conditioner impact of the spindle and roller torques are clearly visible in FIGS. 26 and 27, respectively. The information provided in FIGS. 26 and 27 can be used to define a relationship between the spindle and roller torques and a CMP process material removal rate.

FIGS. 26 and 27 also show that the roller torque is more sensitive to changes in the CMP process, such as conditioning. With conditioning, the CMP process maintains a constant spindle and roller torque. This remains true even in the validation experiment with 50% conditioning. Without conditioning, the spindle and roller torques continue to decrease. Furthermore, the validation experiment with 50% conditioning demonstrates that the friction coefficient between the wafer and polishing pad decreases quickly between each conditioning period.

A fifth validation experiment was performed to evaluate the effect of polishing pad linear velocity on the friction coefficient between the wafer and polishing pad. The fifth validation experiment corresponds to the baseline CMP process without conditioning. During the fifth CMP process, the polishing pad linear velocity is adjusted in a multiple step sequence. The polishing pad linear velocity is adjusted from 100 fpm to 400 fpm in steps of 100 fpm. Each step lasts 30 seconds.

Figure 28:
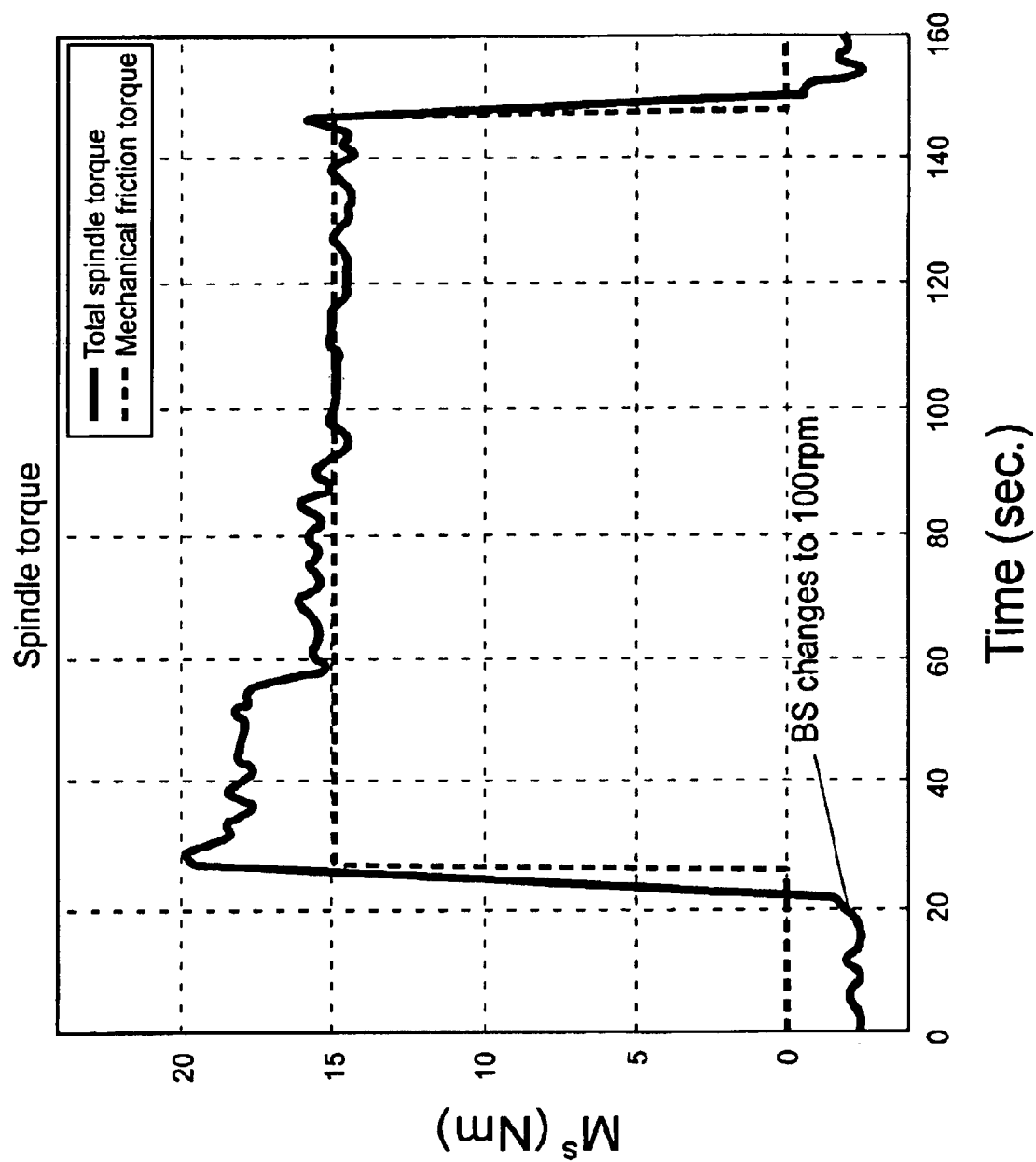
FIG. 28 is an illustration showing a spindle torque during the fifth validation experiment, in accordance with one embodiment of the present invention.
Figure 29:
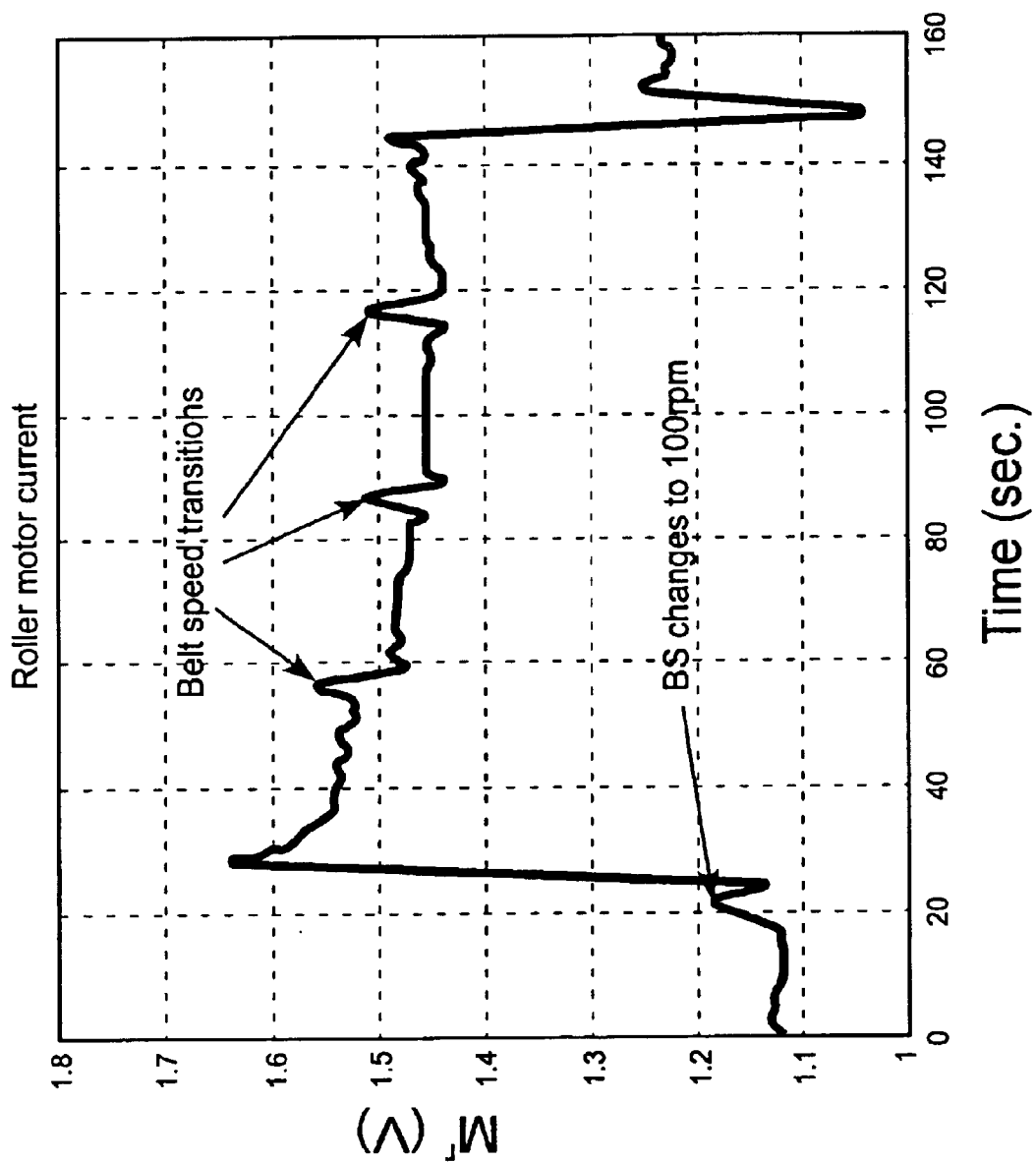
FIG. 29 is an illustration showing a roller torque during the fifth validation experiment, in accordance with one embodiment of the present invention.
Figure 30:
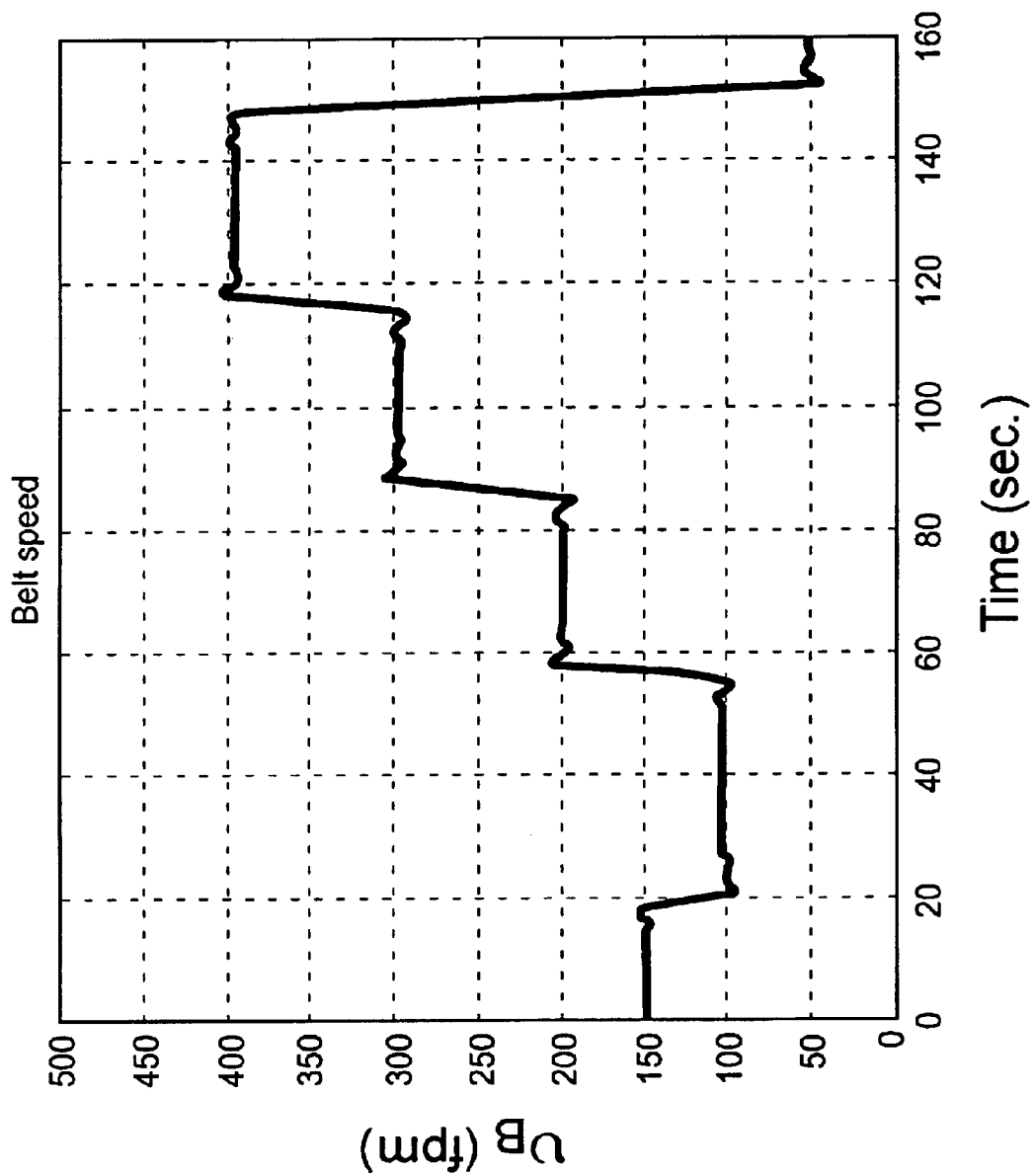
FIG. 30 is an illustration showing the linear polishing pad velocity during the fifth validation experiment, in accordance with one embodiment of the present invention.
Figure 31:
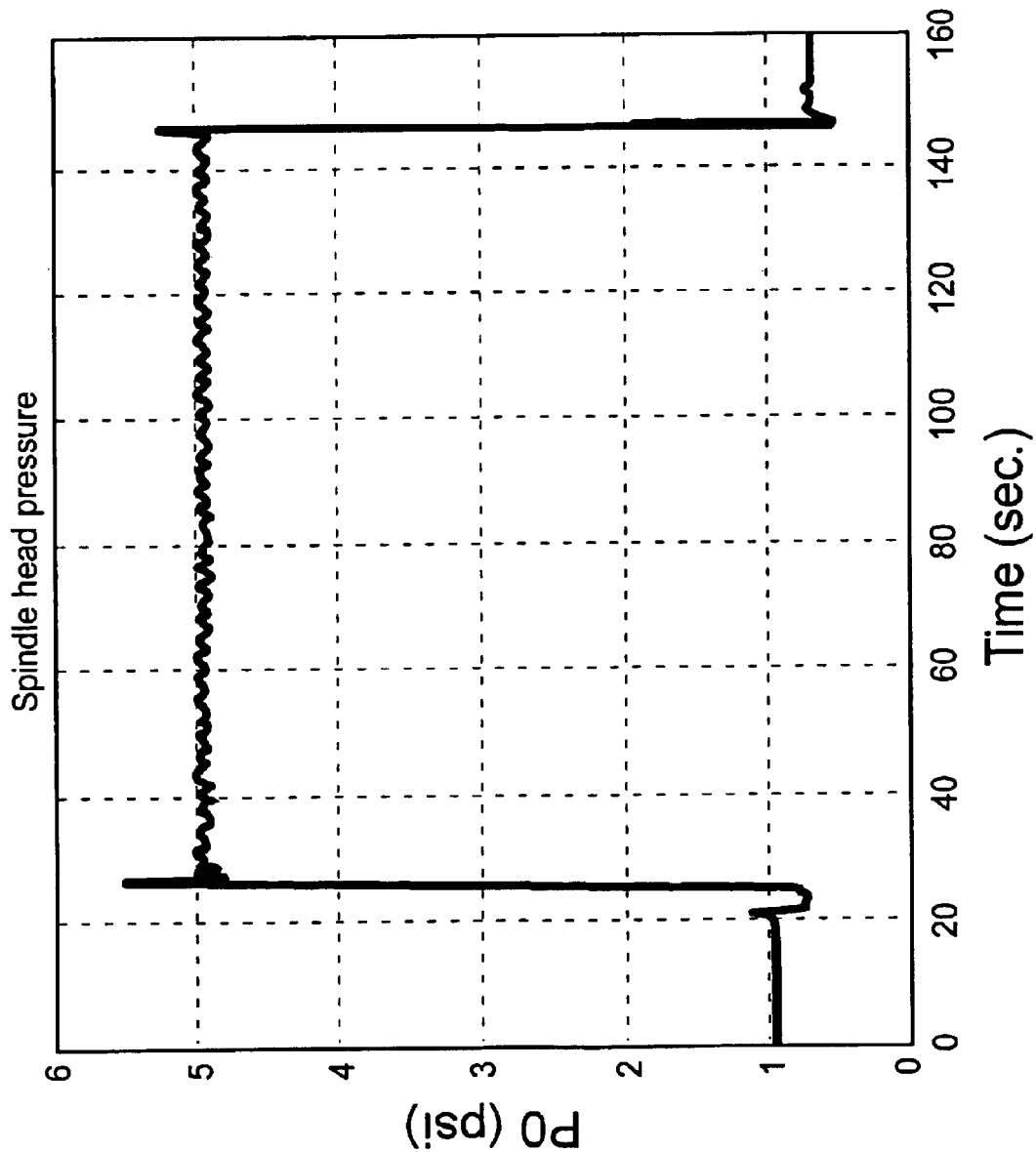
FIG. 31 is an illustration showing the wafer carrier pressure during the fifth validation experiment, in accordance with one embodiment of the present invention.

FIG. 28 is an illustration showing a spindle torque during the fifth validation experiment, in accordance with one embodiment of the present invention. FIG. 29 is an illustration showing a roller torque during the fifth validation experiment, in accordance with one embodiment of the present invention. FIG. 30 is an illustration showing the linear polishing pad velocity during the fifth validation experiment, in accordance with one embodiment of the present invention. FIG. 31 is an illustration showing the wafer carrier pressure during the fifth validation experiment, in accordance with one embodiment of the present invention.

When the polishing pad linear velocity increases from 100 fpm to 200 fpm, the spindle torque decreases by about 5 N m. However, spindle torque changes resulting from polishing pad linear velocity changes are indistinguishable thereafter. Therefore, the spindle torque is relatively small even though it is proportional to the reciprocal of the polishing pad linear velocity. Also, at high polishing pad linear velocities, the spindle torque is approximately equal to the spindle mechanical friction torque. Thus, the polishing friction torque applied to the spindle is about zero because the linear velocity of the polishing pad dominates relative to the angular velocity of the wafer carrier.

With respect to FIG. 29, the roller torque differs from the spindle torque under changes in the polishing pad linear velocity. Considering the decreasing trend in roller torque due the absence of conditioning, the roller torque does not display an substantial change with respect to variations in polishing pad linear velocity. Thus, roller torque is essentially independent of polishing pad linear velocity.

A sixth validation experiment was performed to evaluate the effect of wafer carrier pressure on the friction coefficient between the wafer and polishing pad. The sixth validation experiment corresponds to the baseline CMP process without conditioning. During the sixth CMP process, the wafer carrier pressure $p_0$ is adjusted in a series of five steps. The wafer carrier pressure adjustment per step is an increase of 1 psi from the previous step.

Figure 32:
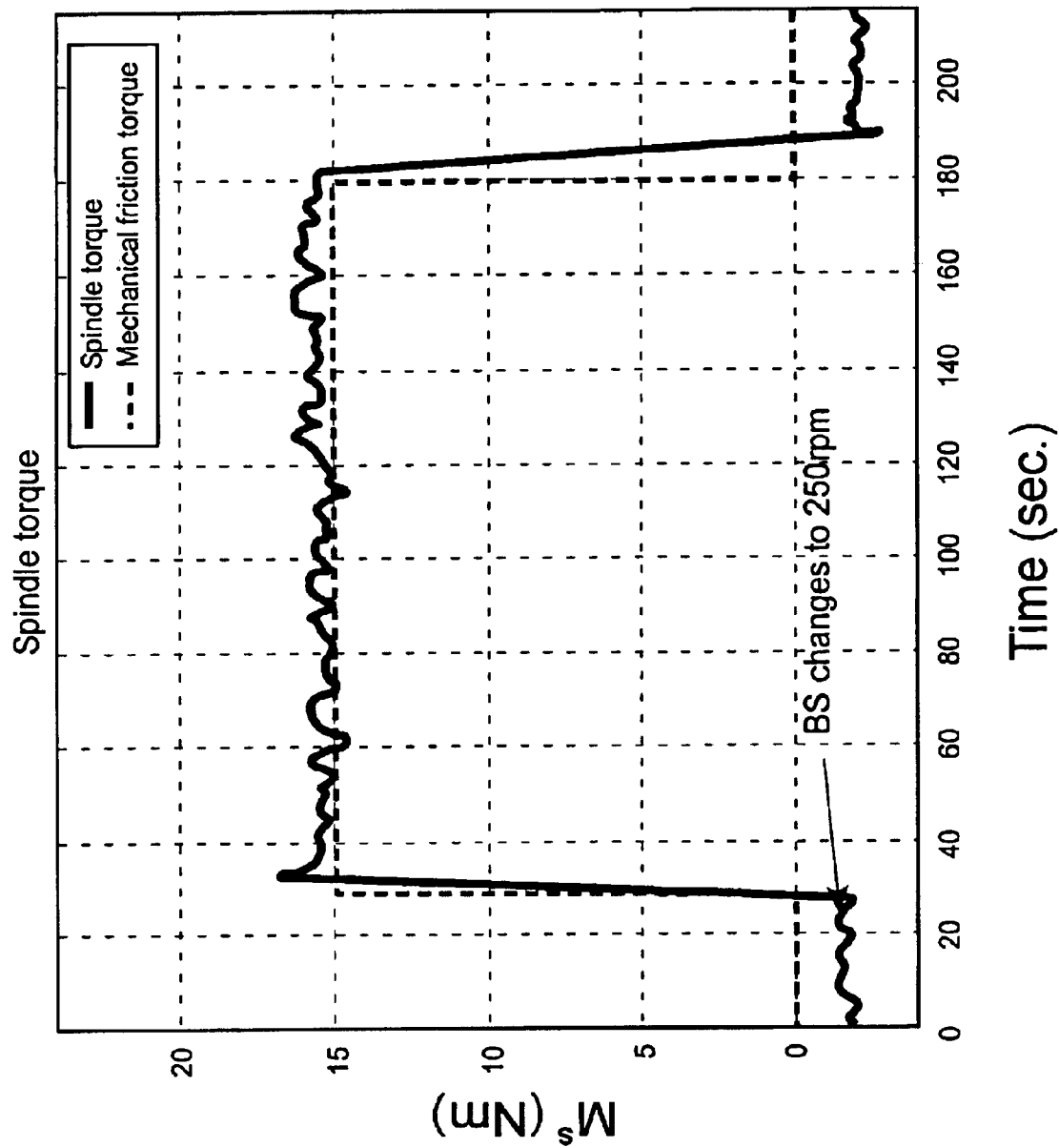
FIG. 32 is an illustration showing a spindle torque during the sixth validation experiment, in accordance with one embodiment of the present invention.
Figure 33:
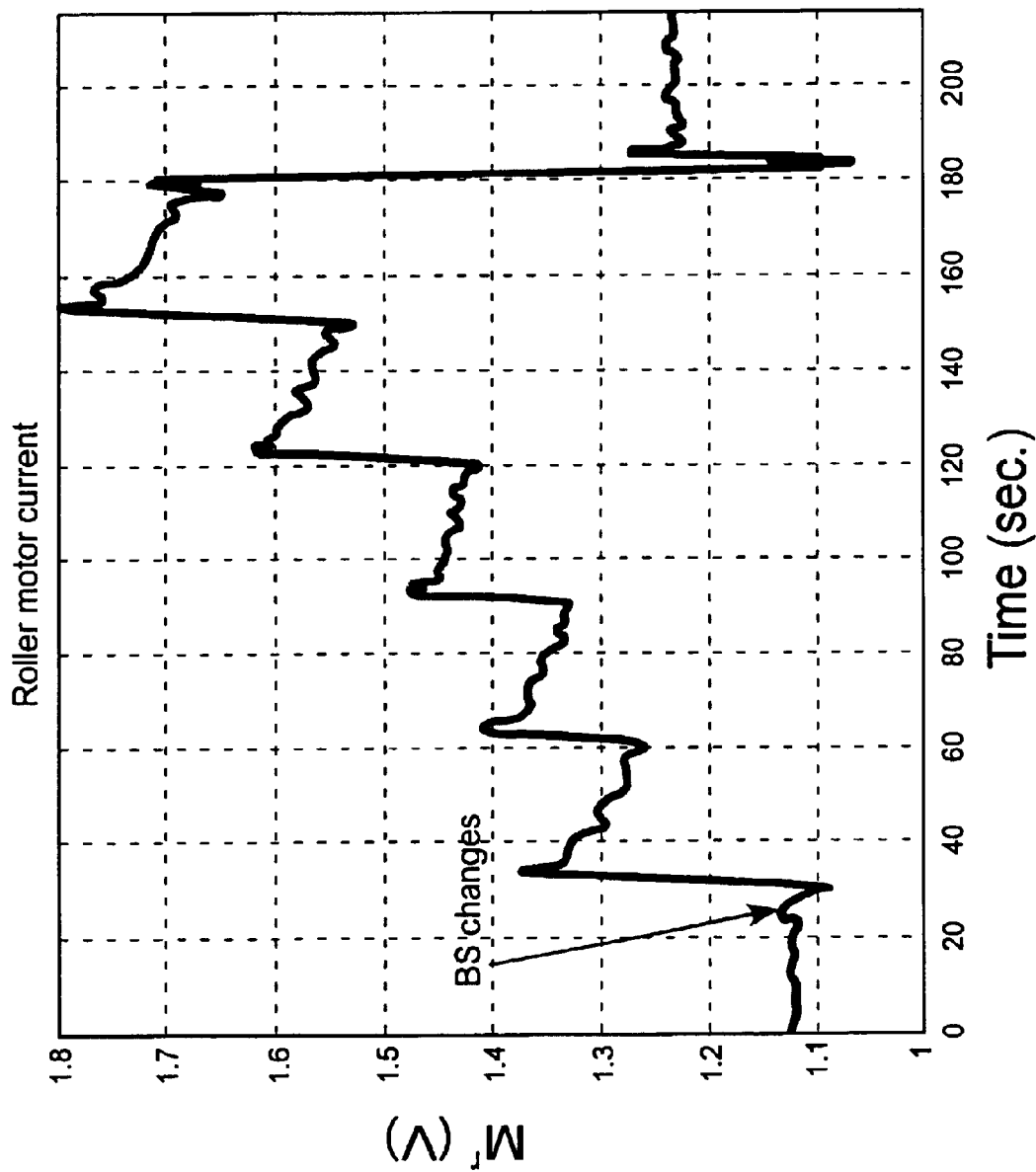
FIG. 33 is an illustration showing a roller torque during the sixth validation experiment, in accordance with one embodiment of the present invention.
Figure 34:
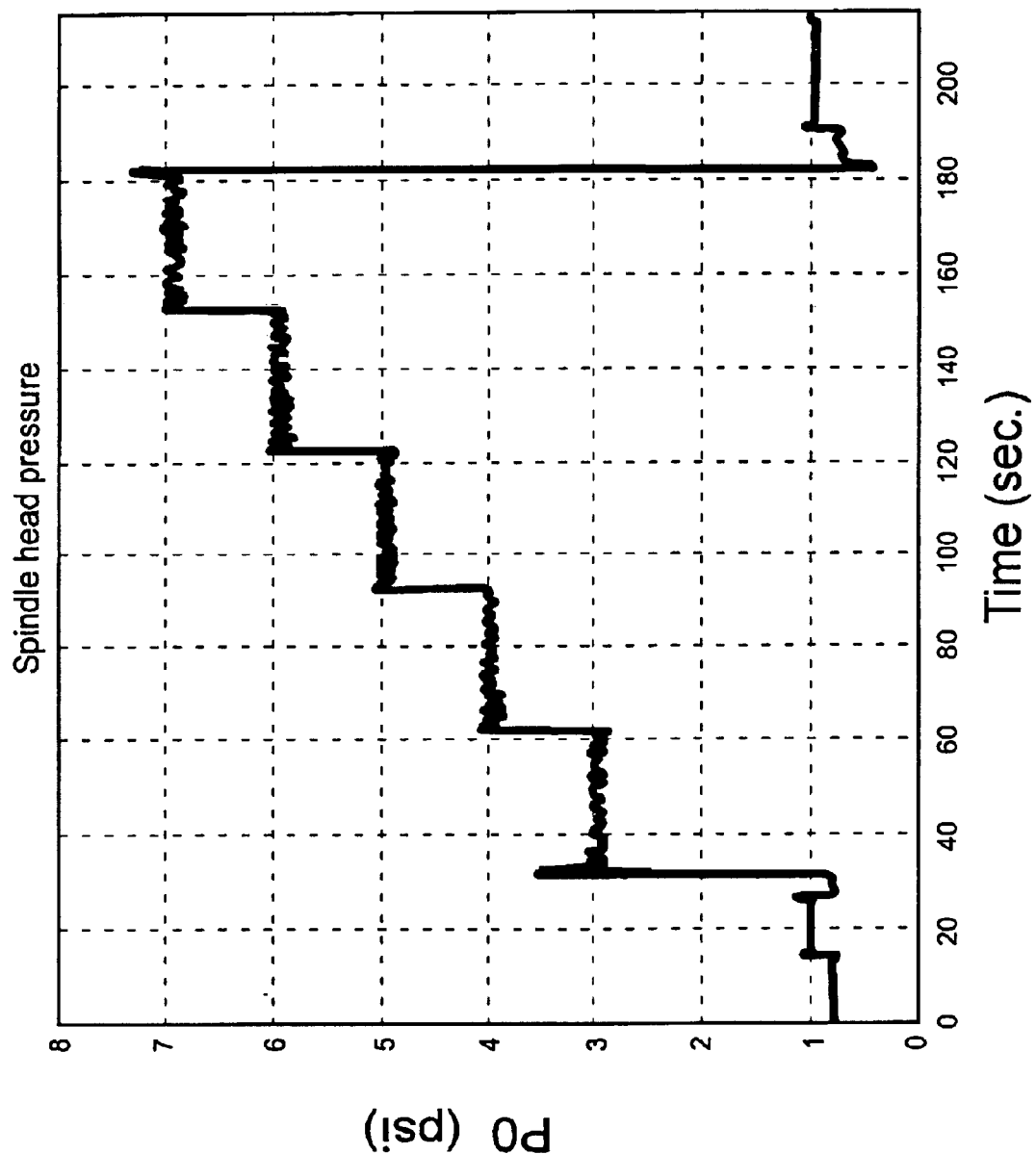
FIG. 34 is an illustration showing the wafer carrier pressure during the sixth validation experiment, in accordance with one embodiment of the present invention.
Figure 35:
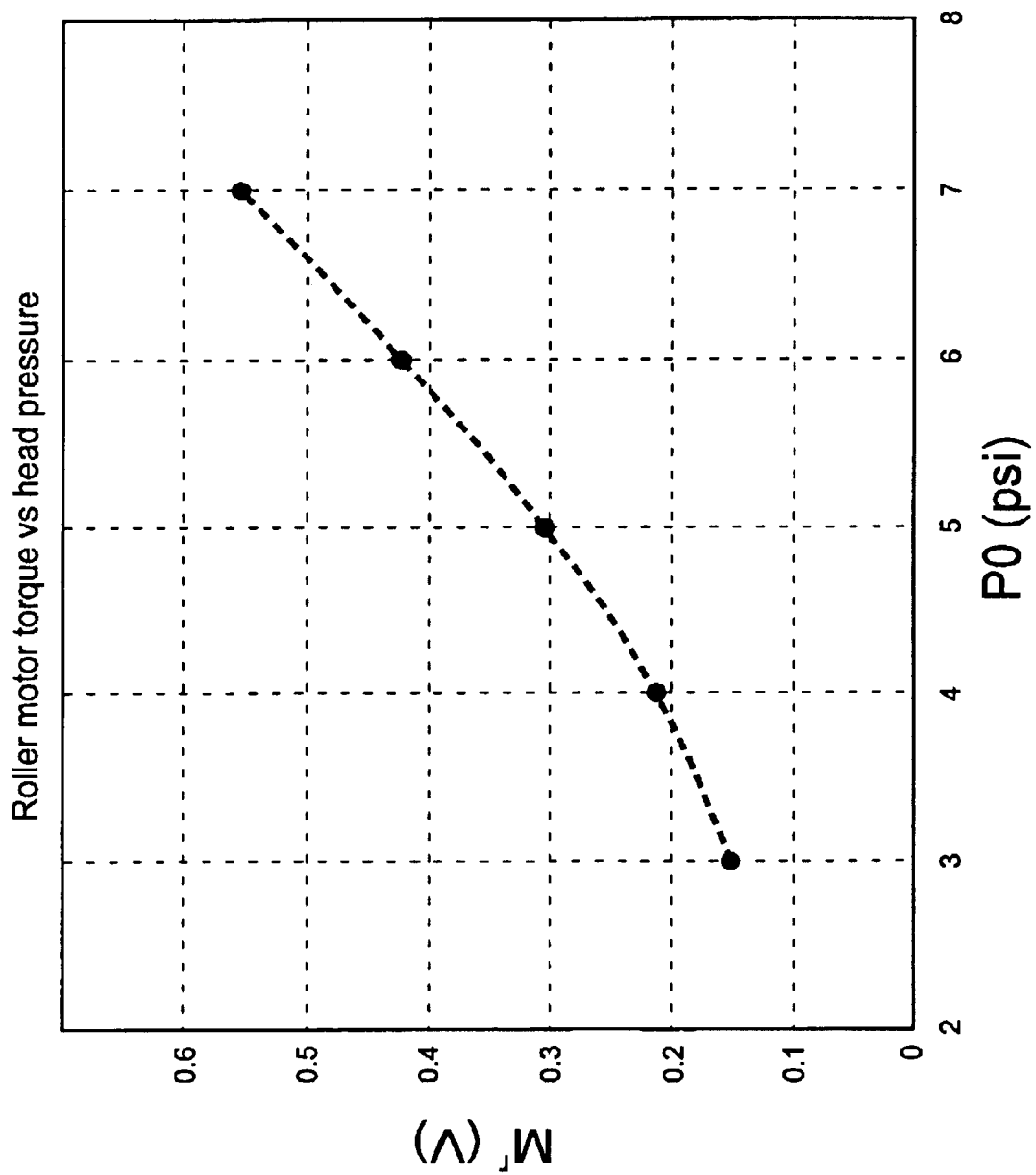
FIG. 35 is an illustration showing the roller torque as a function of the wafer carrier pressure during the sixth validation experiment, in accordance with one embodiment of the present invention.

FIG. 32 is an illustration showing a spindle torque during the sixth validation experiment, in accordance with one embodiment of the present invention. FIG. 33 is an illustration showing a roller torque during the sixth validation experiment, in accordance with one embodiment of the present invention. FIG. 34 is an illustration showing the wafer carrier pressure during the sixth validation experiment, in accordance with one embodiment of the present invention. FIG. 35 is an illustration showing the roller torque as a function of the wafer carrier pressure during the sixth validation experiment, in accordance with one embodiment of the present invention.

With respect to FIG. 32, the spindle torque does not change significantly as the wafer carrier pressure is increased. However, with respect to FIG. 33, the roller torque changes substantially as the wafer carrier pressure is increased. FIG. 35 demonstrates that a linear relationship exists between the roller torque and the wafer carrier pressure.

A seventh validation experiment was performed to evaluate the effect of wafer carrier angular velocity on the spindle and roller torques. The seventh validation experiment corresponds to the baseline CMP process without conditioning. During the seventh CMP process, the wafer carrier angular velocity is adjusted in a series of five steps. The wafer carrier angular velocity adjustment per step is an increase of 10 rpm from the previous step.

Figure 36:
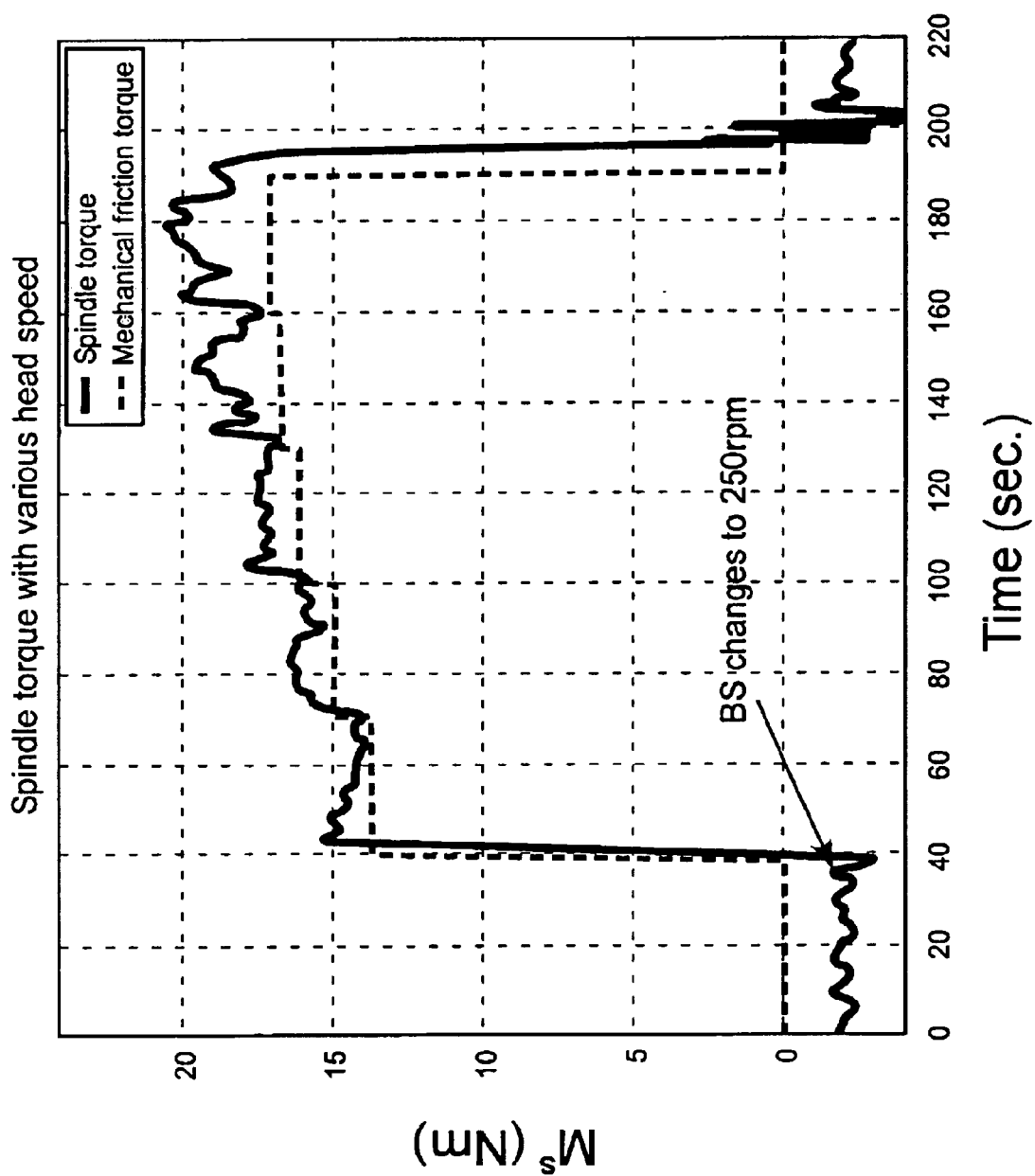
FIG. 36 is an illustration showing a spindle torque during the seventh validation experiment, in accordance with one embodiment of the present invention.
Figure 37:
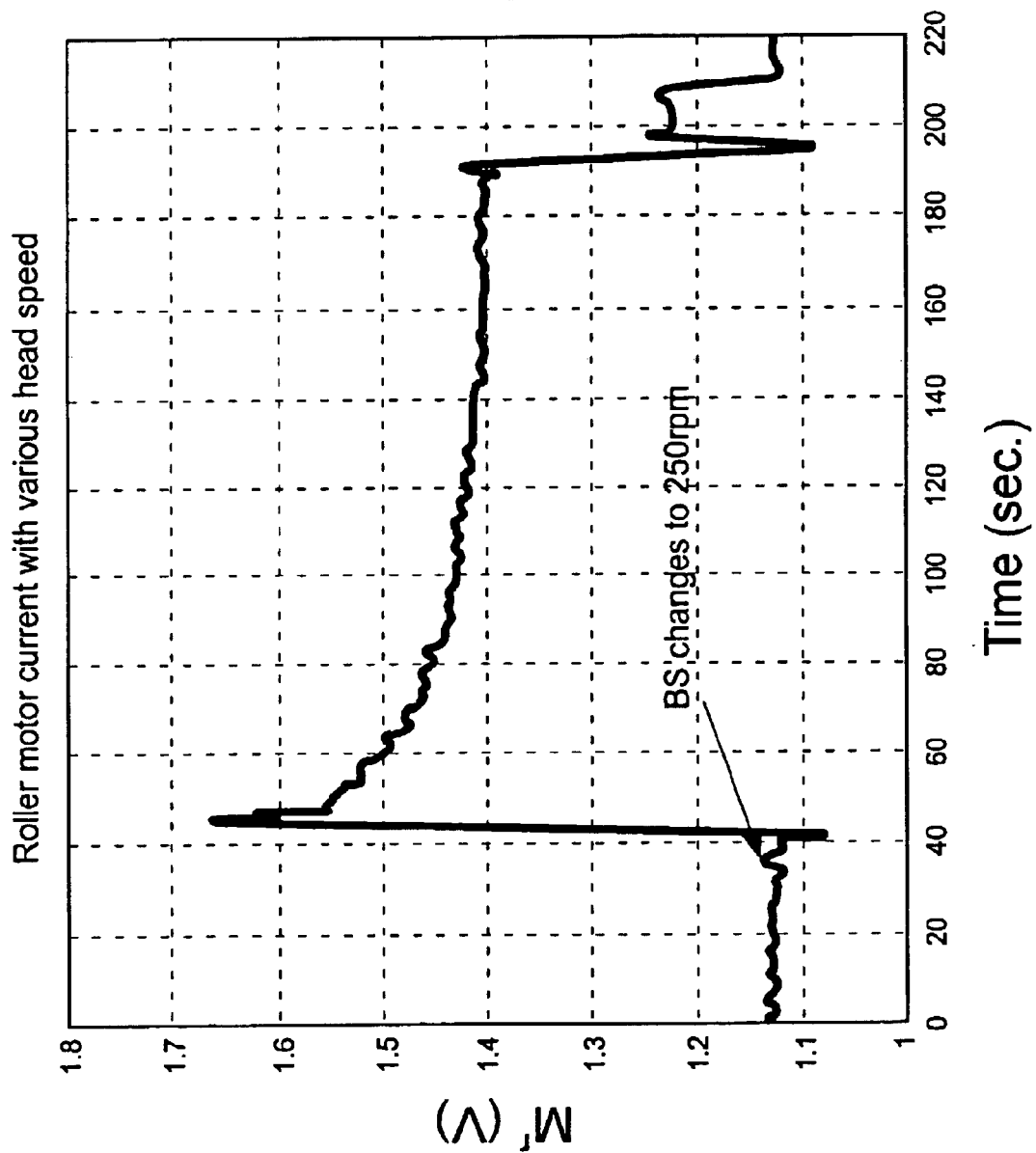
FIG. 37 is an illustration showing a roller torque during the seventh validation experiment, in accordance with one embodiment of the present invention.
Figure 38:
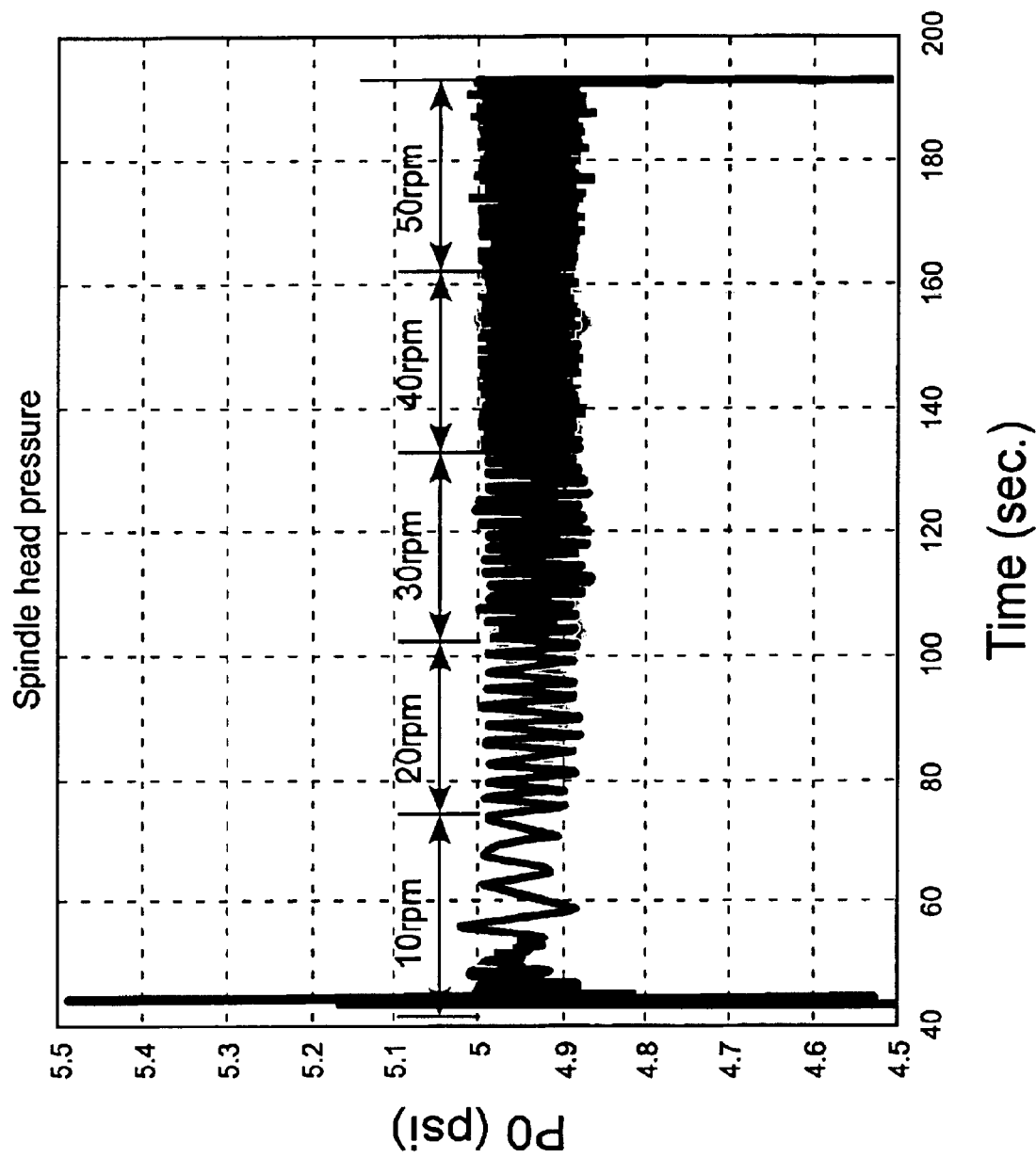
FIG. 38 is an illustration showing the wafer carrier angular velocity relative to the wafer carrier pressure during the seventh validation experiment, in accordance with one embodiment of the present invention.
Figure 39:
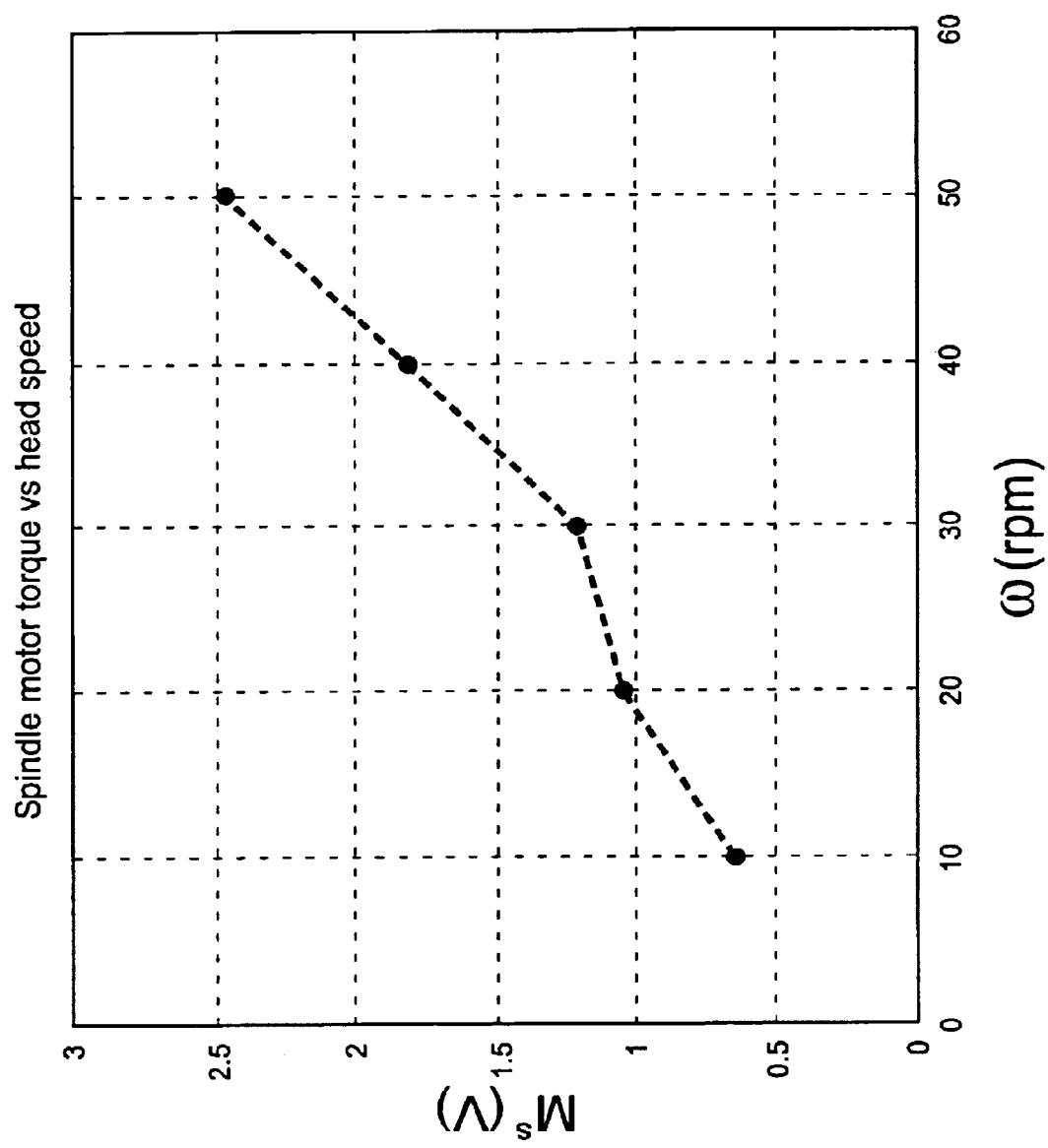
FIG. 39 is an illustration showing the spindle torque as a function of the wafer carrier angular velocity during the seventh validation experiment, in accordance with one embodiment of the present invention.

FIG. 36 is an illustration showing a spindle torque during the seventh validation experiment, in accordance with one embodiment of the present invention. FIG. 37 is an illustration showing a roller torque during the seventh validation experiment, in accordance with one embodiment of the present invention. FIG. 38 is an illustration showing the wafer carrier angular velocity relative to the wafer carrier pressure during the seventh validation experiment, in accordance with one embodiment of the present invention. FIG. 39 is an illustration showing the spindle torque as a function of the wafer carrier angular velocity during the seventh validation experiment, in accordance with one embodiment of the present invention.

The seventh validation experiment demonstrates that varying the wafer carrier angular velocity changes the spindle torque proportionally, but has no effect on the roller torque. As shown in FIG. 37, the roller torque follows a decreasing trend associated with the absence of conditioning. With respect to FIG. 36, however, the spindle torque increases each time the wafer carrier angular velocity is increased. FIG. 39 demonstrates that a linear relationship exists between the spindle torque and the wafer carrier angular velocity.

In accordance with the foregoing, the spindle moment $M^S$ and roller moment $M^R$ representations of the present invention, and their respective associations with the spindle and roller motor currents, have been validated. Therefore, the spindle moment $M^S$ and roller moment $M^R$ representations of the present invention can be used as a basis for monitoring a CMP process through measurement of the spindle and roller motor currents, respectively.

Figure 40:
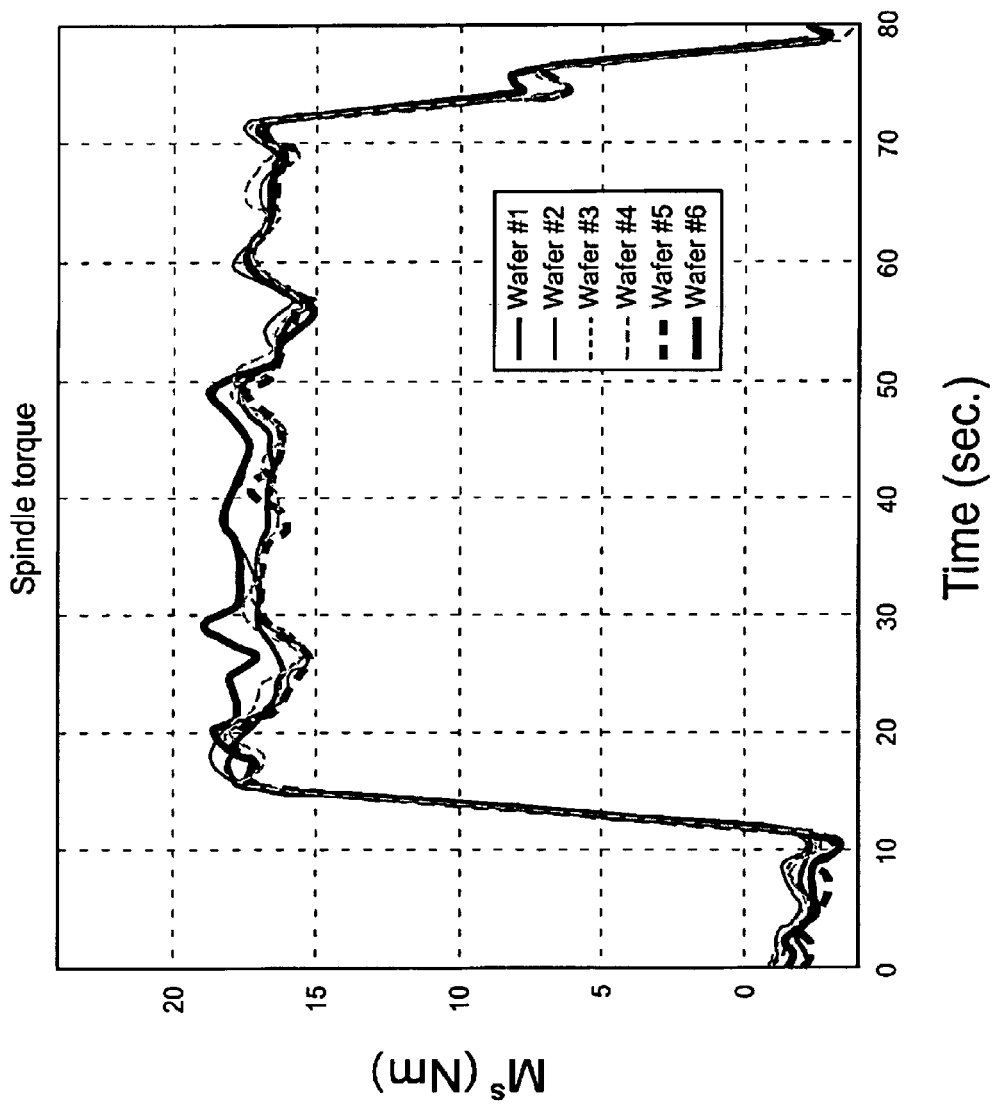
FIGS. 40 and 41 are illustrations showing a spindle torque and a roller torque as monitored during an example six wafer CMP process, in accordance with one embodiment of the present invention.
Figure 41:
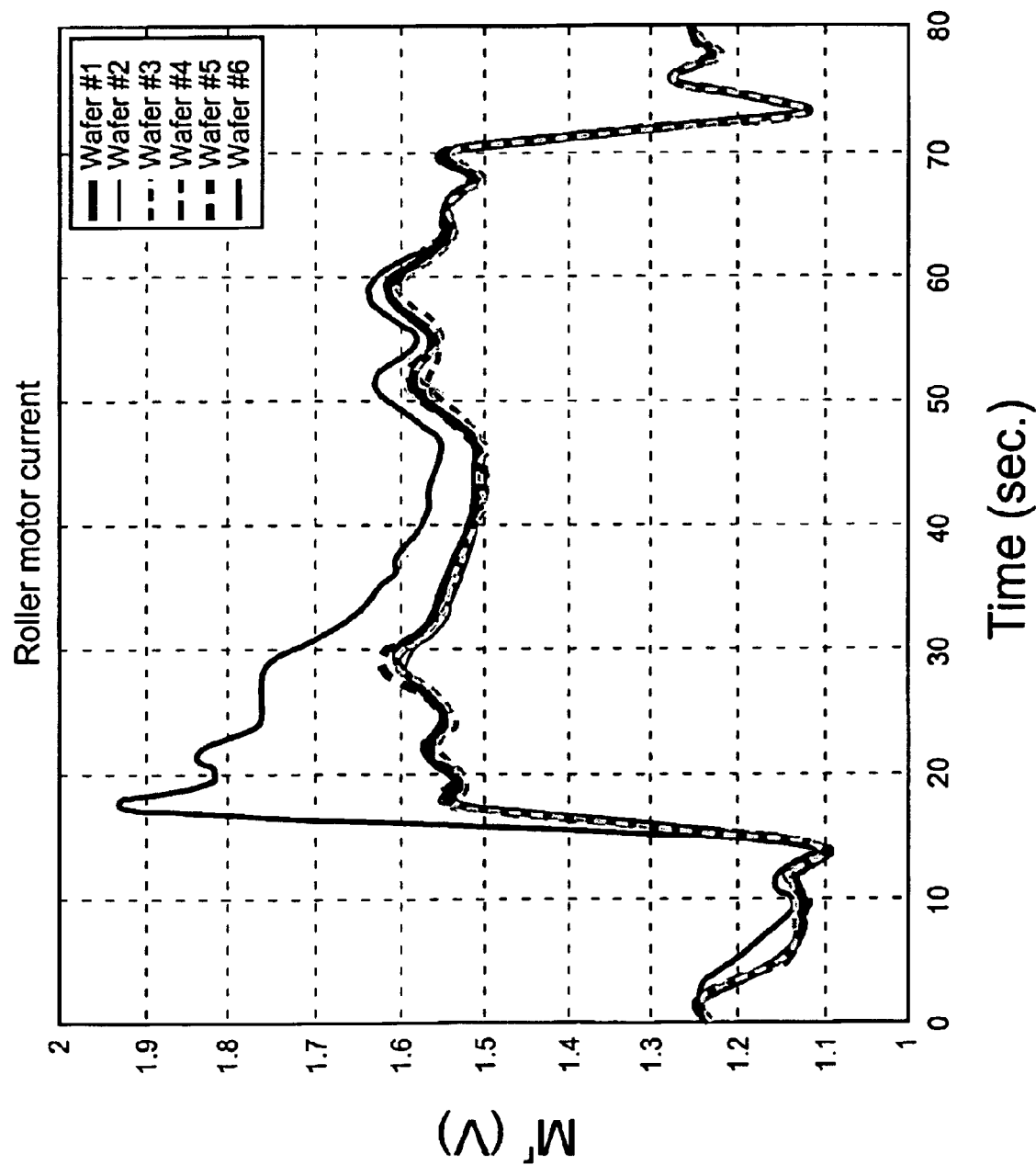

FIGS. 40 and 41 are illustrations showing a spindle torque and a roller torque as monitored during an example six wafer CMP process, in accordance with one embodiment of the present invention. CMP process parameters as shown in Table 2 were also used in the example six wafer CMP process. The example six wafer CMP process used 50% conditioning with a conditioner disk downforce of 7 lbs and a sweep period of 7 seconds. A polishing time of 56 seconds was used for each wafer in the six wafer CMP process.

When the CMP apparatus is exiting an idle state, the polishing pad is cold and does not have any deposited slurry. Therefore, when the CMP apparatus is exiting the idle state, the friction characteristics between the wafer and the polishing pad can be significantly different than after a few wafers have been processed. Comparison of the monitored spindle and roller torques for the first wafer with the remaining wafers, as shown in FIGS. 40 and 41, clearly demonstrates a change in friction characteristics between the wafer and the polishing pad as the CMP apparatus exits the idle state and reaches a warmed-up steady-state. The monitored roller torque distinguishes more clearly between the wafers of the six wafer CMP process. The monitored roller torque clearly shows the warn-up occurring during processing of the first wafer. Due to conditioning of the polishing pad, the last five wafers do not demonstrate a significant difference in roller torque.

The example six wafer CMP process previously discussed was performed using blank oxide wafers. However, during production, patterned wafers are processed. Variations in wafer topography and film characteristics cause the friction characteristics between the patterned wafers and the polishing pad to change during the CMP process.

Figure 42:
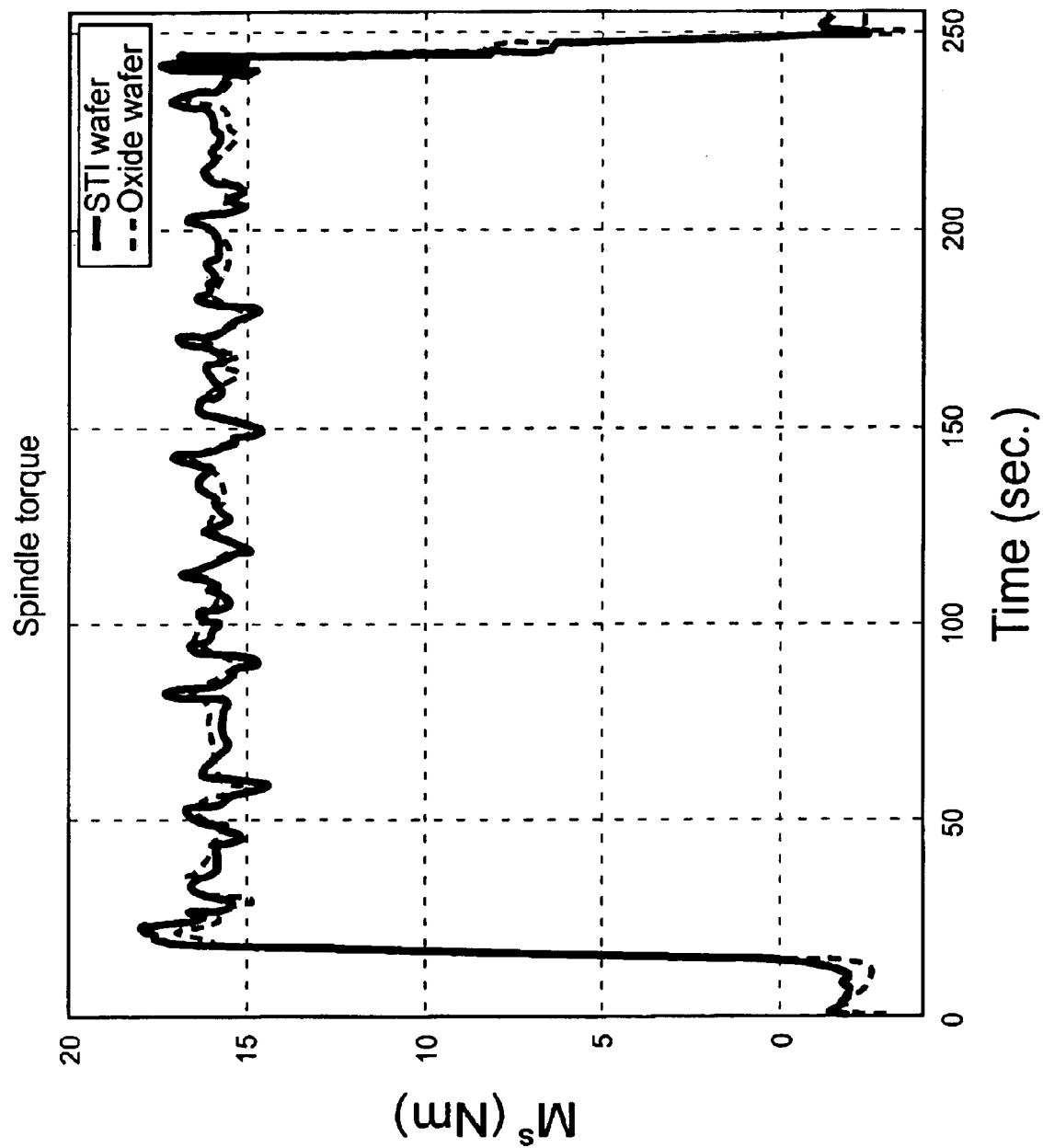
FIGS. 42 and 43 are illustrations showing a spindle torque and a roller torque as monitored during an example CMP process on a shallow trench isolation (STI) patterned wafer, in accordance with one embodiment of the present invention.
Figure 43:
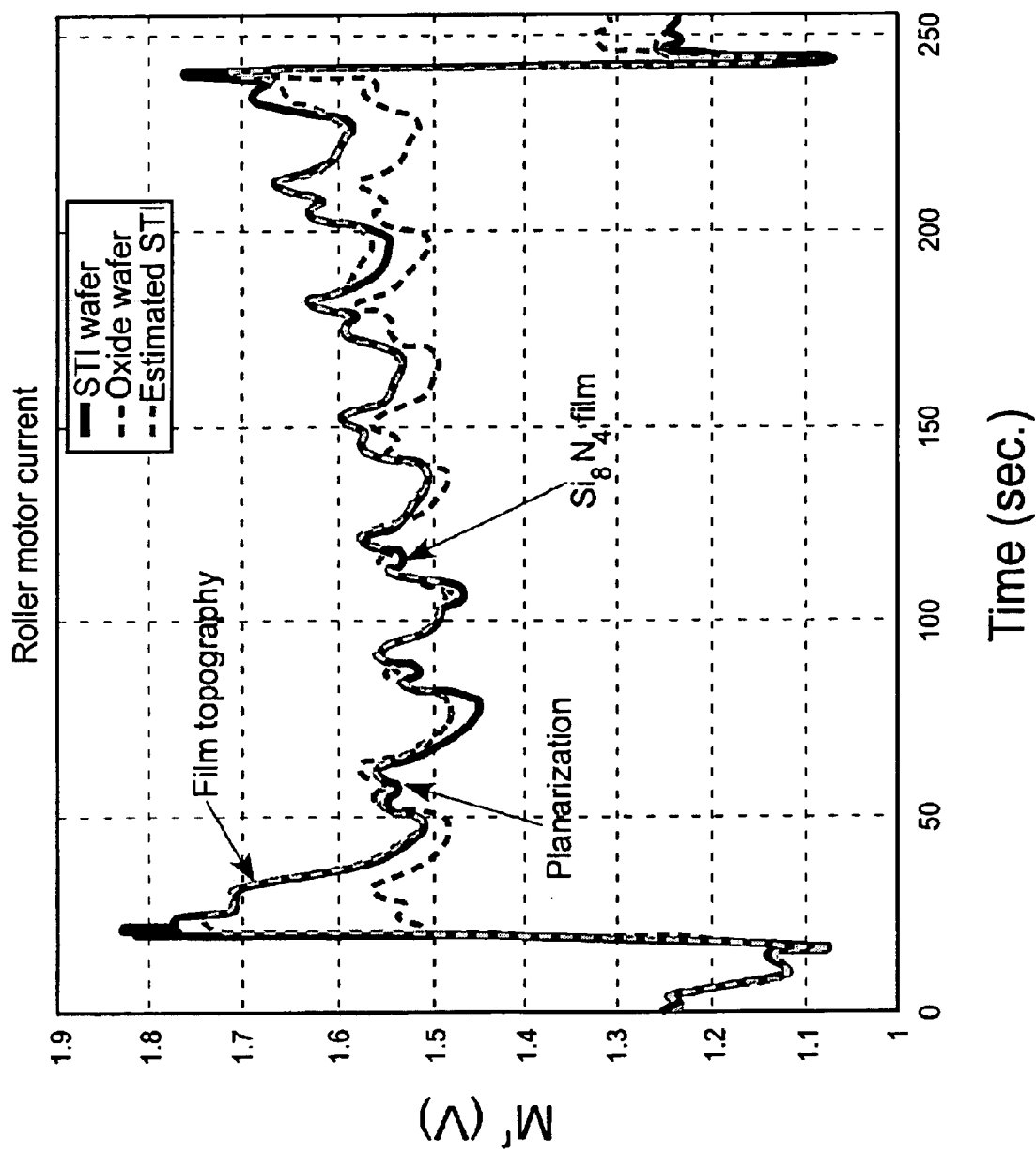

FIGS. 42 and 43 are illustrations showing a spindle torque and a roller torque as monitored during an example CMP process on a shallow trench isolation (STI) patterned wafer, in accordance with one embodiment of the present invention. The STI patterned wafer was characterized as having active oxide and trench depth thickness of about 7000 Å. Also, a thickness of a $Si_3Ni_4$ layer was about 1500 Å, and a step height was about 5000 Å. The CMP process parameters were the same as previously described with respect to the example six wafer CMP process, with the exception of a 224 second polishing time. For comparison purposes, the same example CMP process performed on the STI patterned wafer was also performed on a blank oxide wafer.

FIG. 42 demonstrates that there was no significant spindle torque difference between the blank oxide wafer and the STI patterned wafer. FIG. 43, however, demonstrates a noticeable difference between the roller torque associated with the blank oxide wafer and the STI wafer. Due to variations in the STI patterned wafer topography and film characteristics during the initial period of the CMP process, the roller torque associated with the STI patterned wafer was higher than that associated with the blank oxide wafer. As the CMP process continued, the STI patterned wafer topography and film characteristics became smoother causing the roller torque associated with the STI patterned wafer to coincide with the roller torque associated with the blank oxide wafer. After about 120 seconds, the STI patterned wafer was planarized. Beyond about 120 seconds, the $Si_3Ni_4$ layer of the STI patterned wafer begins to influence the roller torque. Since the coefficient of friction between the $Si_3Ni_4$ layer and the polishing pad is higher than that between the blank oxide wafer and polishing pad, the roller torque associated with the STI patterned wafer begins to increase relative to that associated with the blank oxide wafer. Therefore, monitoring of the roller torque clearly identifies the condition of the STI patterned wafer during the CMP process.

Figure 44:
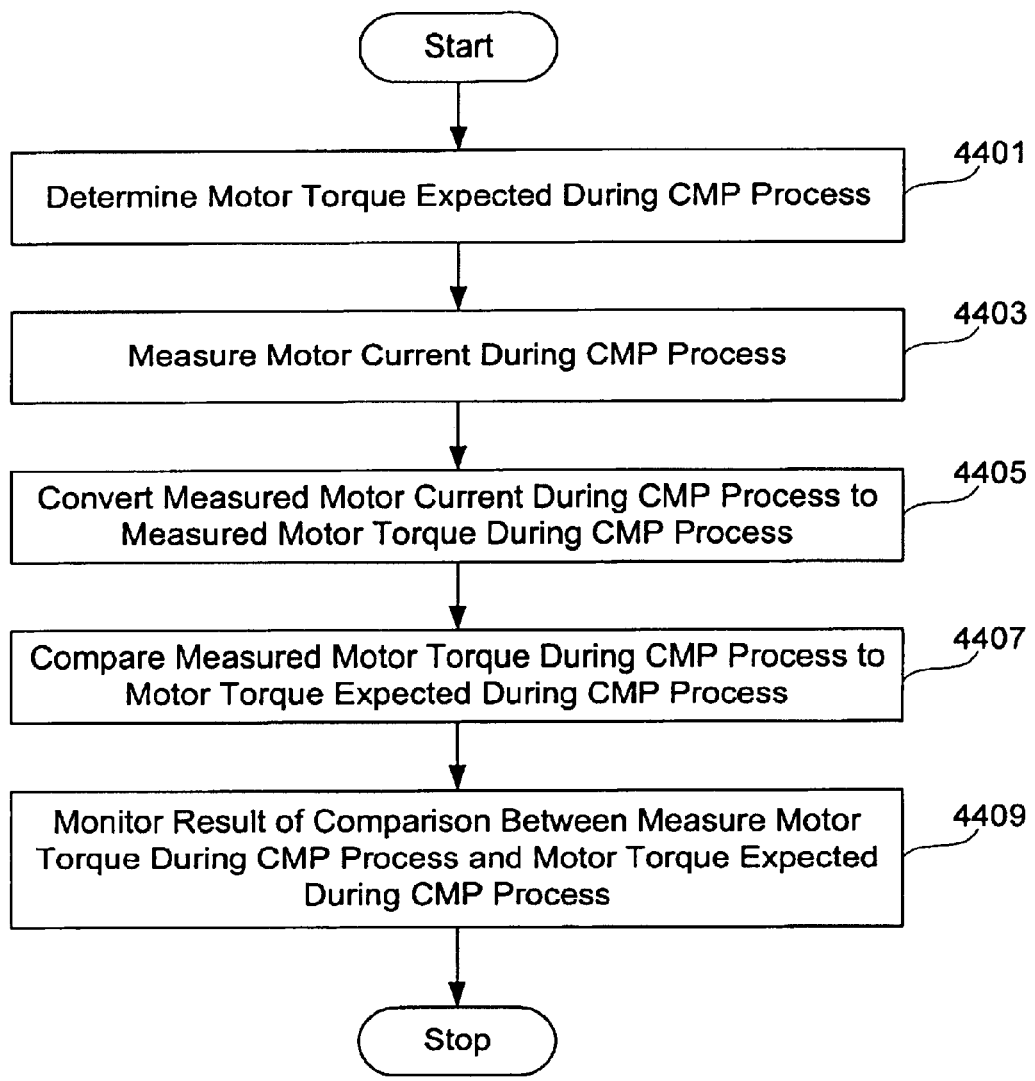
FIG. 44 is an illustration showing a flowchart of a method for monitoring a CMP process, in accordance with one embodiment of the present invention.

FIG. 44 is an illustration showing a flowchart of a method for monitoring a CMP process, in accordance with one embodiment of the present invention. The method includes an operation 4401 in which an expected motor torque is determined for a CMP process to be performed based on a set of CMP process parameters. In one embodiment, the CMP process is to be performed using a linear CMP apparatus, and the motor torque corresponds to either a spindle motor, a roller motor, or both a spindle motor and roller motor. It should be understood, however, that the method shown in FIG. 44 can also be applied to a CMP process to be performed using an alternative type of CMP apparatus (e.g., rotary CMP apparatus). In one embodiment, values for one or more CMP process parameters in the set of CMP process parameters used to determine the expected motor torque are obtained in a previously performed CMP process. In one embodiment, the set of CMP process parameters includes a coefficient of friction between a wafer and a polishing pad, a wafer carrier pressure, a wafer carrier velocity, and a polishing pad velocity. In one embodiment, a relationship between the set of CMP parameters and the expected motor torque can be developed, as previously discussed in this document, and used in the operation 4401 to determine the expected motor torque.

The method continues with an operation 4403 in which a motor current is measured during performance of the CMP process. In an operation 4405, the measured motor current is converted to a measured motor torque occurring during performance of the CMP process. The method also includes an operation 4407 in which the measured motor torque is compared to the expected motor torque from the operation 4401. In operation 4409, a result of the comparison between the measured motor torque and the expected motor torque is monitored. In one embodiment, the monitored result is used to monitor a coefficient of friction present during performance of the CMP process.

Figure 45:
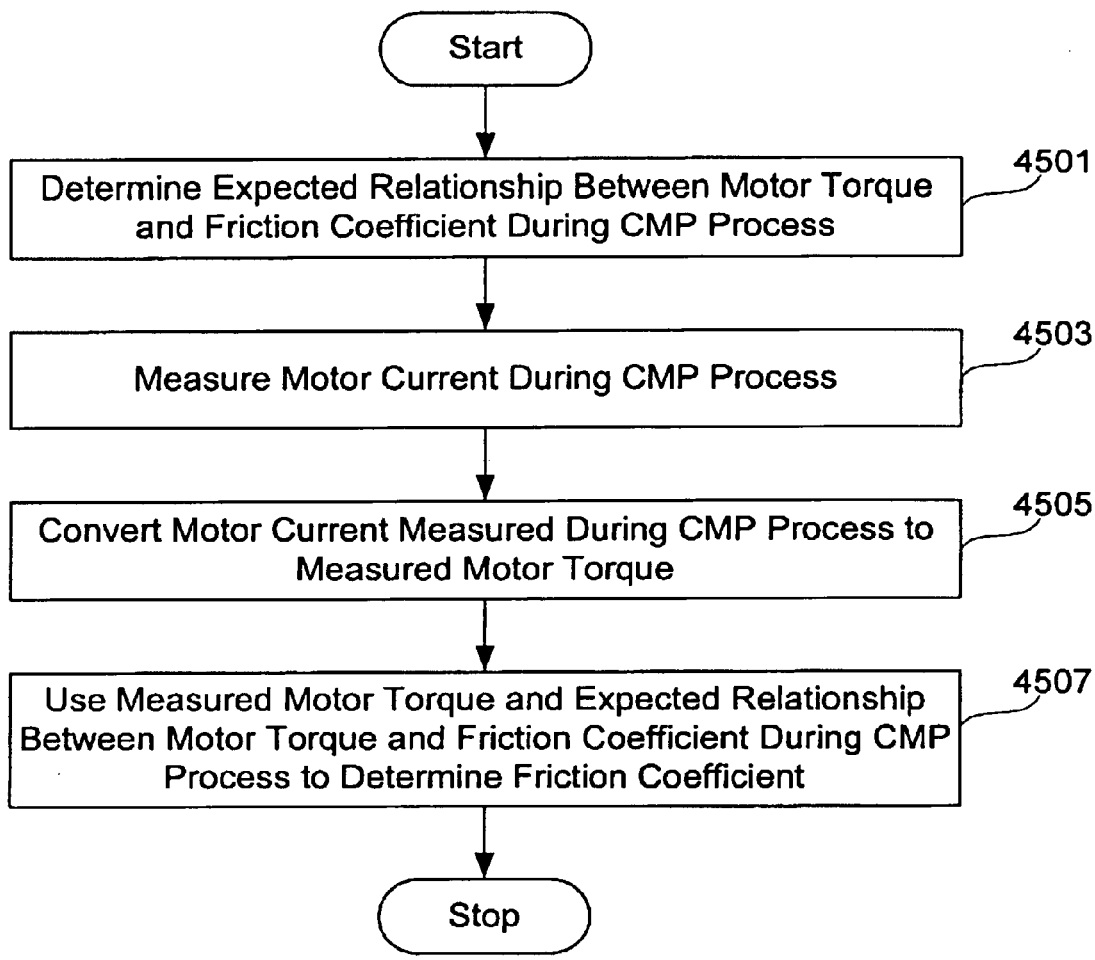
FIG. 45 is an illustration showing a flowchart of a method for determining a friction coefficient of a CMP process, in accordance with one embodiment of the present invention.

FIG. 45 is an illustration showing a flowchart of a method for determining a friction coefficient of a CMP process, in accordance with one embodiment of the present invention. The method includes an operation 4501 for determining an expected relationship between a motor torque and a friction coefficient during a CMP process to be performed. In one embodiment, the CMP process is to be performed using a linear CMP apparatus, and the motor torque corresponds to either a spindle motor, a roller motor, or both a spindle motor and roller motor. It should be understood, however, that the method shown in FIG. 45 can also be applied to a CMP process to be performed using an alternative type of CMP apparatus (e.g., rotary CMP apparatus). In one embodiment, determining the expected relationship between the motor torque and the friction coefficient as required in operation 4501, is performed in-part through the use of a distributed LuGre dynamic friction model, as previously discussed in this document. In one embodiment, the relationship determined in operation 4501 is associated with a set of CMP process parameters including a wafer carrier pressure, a wafer carrier velocity, and a polishing pad velocity.

The method continues with an operation 4503 in which a motor current is measured during performance of the CMP process. In an operation 4505, the measured motor current is converted to a measured motor torque occurring during performance of the CMP process. The method further includes an operation 4507 for using the measured motor torque and the relationship determined in operation 4501 to determine the friction coefficient present during performance of the CMP process.

Figure 46:
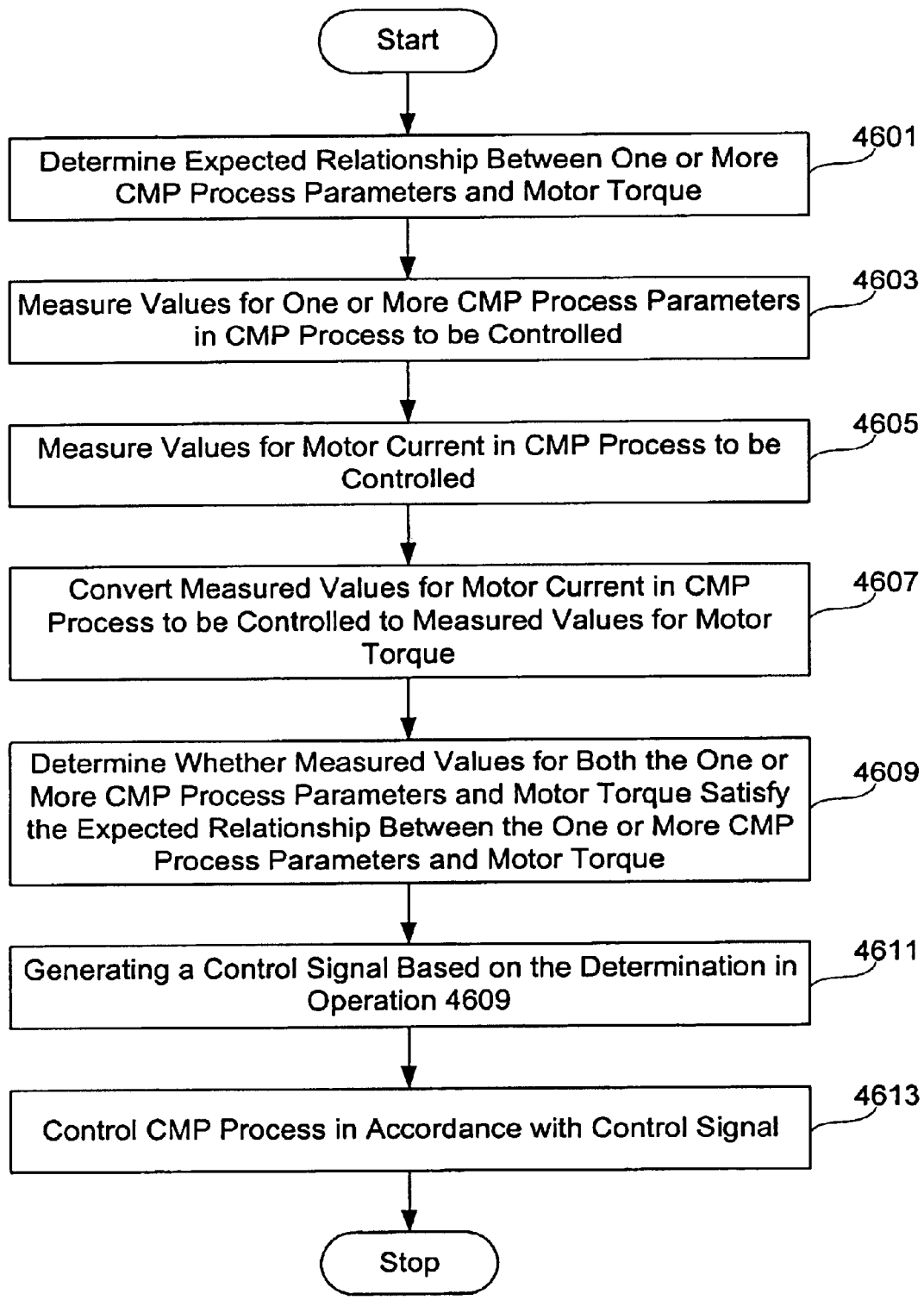
FIG. 46 is an illustration showing a flowchart of a method for controlling a CMP process, in accordance with one embodiment of the present invention.

FIG. 46 is an illustration showing a flowchart of a method for controlling a CMP process, in accordance with one embodiment of the present invention. The method includes an operation 4601 for determining an expected relationship between one or more CMP process parameters and a motor torque during a CMP process to be performed. In one embodiment, the CMP process is to be performed using a linear CMP apparatus, and the motor torque corresponds to either a spindle motor, a roller motor, or both a spindle motor and roller motor. It should be understood, however, that the method shown in FIG. 46 can also be applied to a CMP process to be performed using an alternative type of CMP apparatus (e.g., rotary CMP apparatus). In one embodiment, determining the expected relationship between the one or more CMP process parameters and the motor torque as required in operation 4601, is performed in-part through the use of a distributed LuGre dynamic friction model, as previously discussed in this document. In one embodiment, the relationship determined in operation 4601 is associated with a set of CMP process parameters including a wafer carrier pressure, a wafer carrier velocity, a polishing pad velocity, and a coefficient of friction.

The method continues with an operation 4603 in which values of the one or more CMP process parameters are measured during performance of the CMP process to be controlled. Also, in an operation 4605, values for a motor current associated with the CMP process are measured during performance of the CMP process to be controlled. In an operation 4607, the measured motor current values are converted to measured motor torque values occurring during performance of the CMP process. The method further includes an operation 4609 for determining whether the measured values for both the one or more CMP process parameters and the motor torque satisfy the expected relationship determined in the operation 4601. In an operation 4611, a control signal is generated based on the determination performed in operation 4609. An operation 4613 is also provided for controlling the CMP process in accordance with the control signal generated in the operation 4611.

Figure 47:
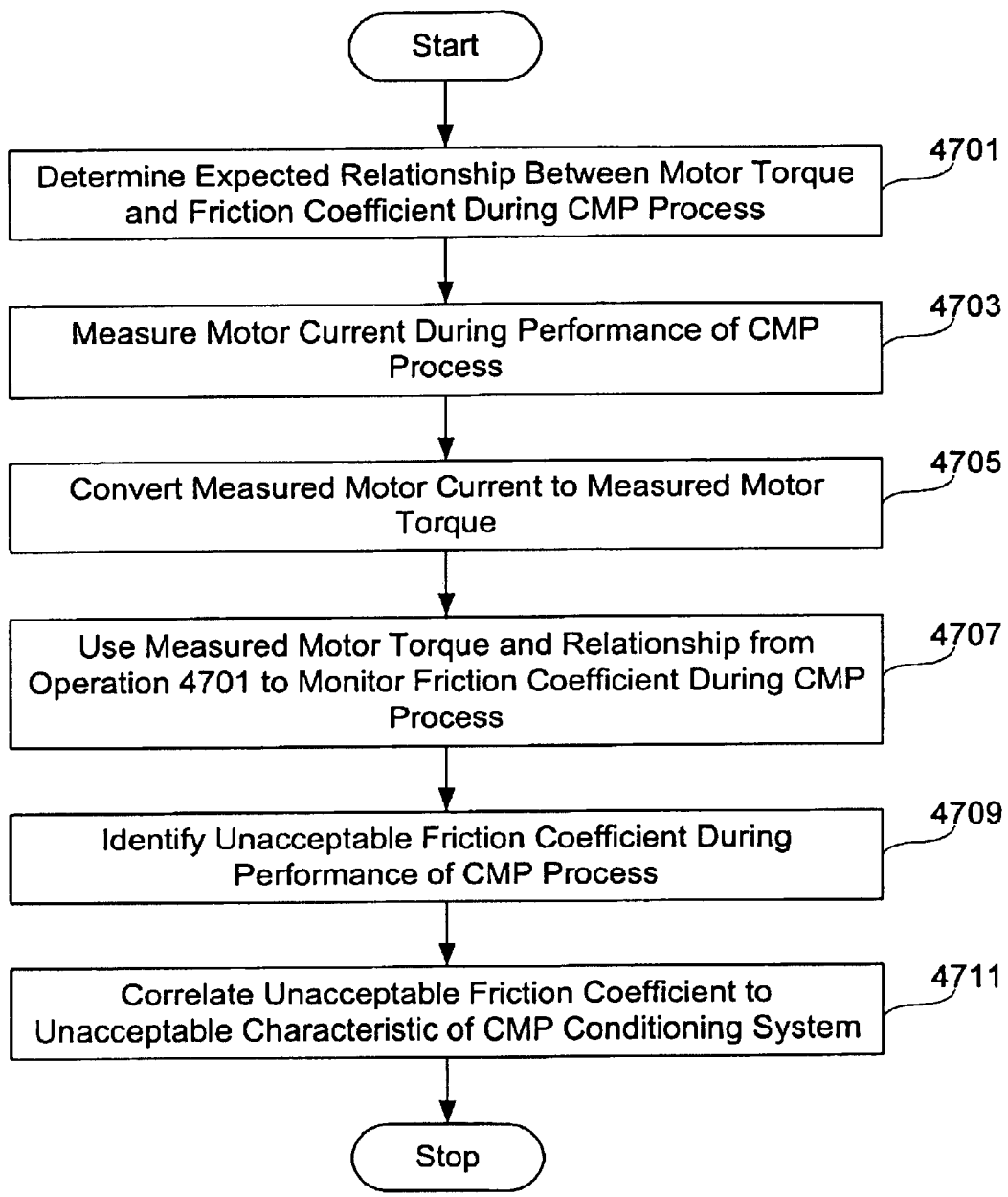
FIG. 47 is an illustration showing a flowchart of a method for monitoring a CMP conditioning system, in accordance with one embodiment of the present invention.

FIG. 47 is an illustration showing a flowchart of a method for monitoring a CMP conditioning system, in accordance with one embodiment of the present invention. The method includes an operation 4701 for determining an expected relationship between a motor torque and a friction coefficient during a CMP process. In one embodiment, the CMP process is to be performed using a linear CMP apparatus, and the motor torque corresponds to either a spindle motor, a roller motor, or both a spindle motor and roller motor. It should be understood, however, that the method shown in FIG. 47 can also be applied to a CMP process to be performed using an alternative type of CMP apparatus (e.g., rotary CMP apparatus). The expected relationship between the motor torque and the friction coefficient is based in-part on acceptable characteristics of the CMP conditioning system. In one embodiment, the acceptable characteristics are related to characteristics of a conditioning disk of the CMP conditioning system (e.g., a conditioning disk state of wear). In one embodiment, determining the expected relationship between the motor torque and the friction coefficient as required in operation 4701, is performed in-part through the use of a distributed LuGre dynamic friction model, as previously discussed in this document. In one embodiment, the relationship determined in operation 4701 is associated with a set of CMP process parameters including a wafer carrier pressure, a wafer carrier velocity, a polishing pad velocity, and a coefficient of friction.

The method continues with an operation 4703 in which a motor current is measured during performance of the CMP process. In an operation 4705, the measured motor current is converted to a measured motor torque occurring during performance of the CMP process. The method further includes an operation 4707 for using the measured motor torque and the relationship determined in operation 4701 to monitor the friction coefficient present during performance of the CMP process. In one embodiment, the friction coefficient is monitored in real-time during performance of the CMP process. The method also includes an operation 4709 in which an unacceptable friction coefficient is identified during performance of the CMP process. In one embodiment, the unacceptable friction coefficient is identified through comparison of the monitored friction coefficient with an expected friction coefficient. The expected friction coefficient can be determined using the expected relationship between the motor torque and the friction coefficient determined in operation 4701. Additionally, in an operation 4711, the identified unacceptable friction coefficient is correlated to an unacceptable characteristic of the CMP conditioning system (e.g., an unacceptable conditioning disk state of wear).

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope on the invention.

What is claimed is:

1. A method for monitoring a chemical mechanical planarization (CMP) process, comprising:
   determining an analytical relationship between a set of CMP process parameters and a spindle friction moment in the CMP process;
   using the determined analytical relationship to calculate an expected spindle friction moment in a particular CMP process;
   measuring a current drawn by a spindle motor during the particular CMP process;
   converting the measured spindle motor current to a measured spindle motor torque;
   correlating the measured spindle motor torque to a measured spindle friction moment;
   comparing the measured spindle friction moment to the expected spindle friction moment; and
   monitoring a result of the comparison between the measured spindle friction moment and the expected spindle friction moment.

2. A method for monitoring a CMP process as recited in claim 1, wherein values for one or more CMP process parameters in the set of CMP process parameters are determined in a previously performed CMP process.

3. A method for monitoring a CMP process as recited in claim 1, wherein the set of CMP process parameters includes a coefficient of friction between a wafer and a polishing pad.

4. A method for monitoring a CMP process as recited in claim 1, wherein the set of CMP process parameters includes a wafer carrier pressure, a wafer carrier velocity, and a polishing pad velocity.

5. A method for monitoring a CMP process as recited in claim 1, wherein the CMP process is a linear CMP process.

6. A method for monitoring a CMP process as recited in claim 1, further comprising:

using the monitored result of the comparison between the measured spindle friction moment and the expected spindle friction moment to monitor a coefficient of friction.

7. A method for determining a friction coefficient of a chemical mechanical planarization (CMP) process, comprising:

determining an analytical relationship between a spindle friction moment and the friction coefficient;

measuring a current drawn by a spindle motor during the CMP process;

converting the measured spindle motor current to a measured spindle motor torque;

correlating the measured spindle motor torque to a measured spindle friction moment; and using the measured spindle friction moment and the analytical relationship between the spindle friction moment and the friction coefficient to determine the friction coefficient during the CMP process.

8. A method for determining a friction coefficient of a CMP process as recited in claim 7, wherein determining the analytical relationship between the spindle friction moment and the friction coefficient is performed using a distributed LuGre dynamic friction model.

9. A method for determining a friction coefficient of a CMP process as recited in claim 7, wherein the analytical relationship between the spindle friction moment and the friction coefficient is associated with a set of CMP process parameters.

10. A method for determining a friction coefficient of a CMP process as recited in claim 9, wherein the set of CMP process parameters includes a wafer carrier pressure, a wafer carrier velocity, and a polishing pad velocity.

11. A method for determining a friction coefficient of a CMP process as recited in claim 7, wherein the CMP process is a linear CMP process.

12. A method for controlling a chemical mechanical planarization (CMP) process, comprising:

determining an analytical relationship between one or more CMP process parameters and a motor torque;

measuring values for the one or more CMP process parameters in the CMP process to be controlled;

measuring values for a motor current in the CMP process to be controlled;

converting the measured values for the motor current in the CMP process to be controlled to measured values for a motor torque;

determining whether the measured values for both the one or more CMP process parameters and the motor torque satisfy the expected analytical relationship between the one or more CMP process parameters and the motor torque, the determining creating a control signal; and controlling the CMP process in accordance with the control signal.

13. A method for controlling a CMP process as recited in claim 12, wherein determining the analytical relationship between one or more CMP process parameters and the motor torque is performed using a distributed LuGre dynamic friction model.

14. A method for controlling a CMP process as recited in claim 12, wherein the one or more CMP process parameters include a wafer carrier pressure, a wafer carrier velocity, a polishing pad velocity, and a coefficient of friction.

15. A method for controlling a CMP process as recited in claim 12, wherein the CMP process is a linear CMP process.

16. A method for controlling a CMP process as recited in claim 15, wherein the motor torque, the measured motor current, and the measured motor torque correspond to one of a roller motor, a spindle motor, and both the roller motor and the spindle motor.

17. A method for monitoring a chemical mechanical planarization (CMP) conditioning system, comprising:

determining an expected relationship between a motor torque and a friction coefficient during a CMP process, the expected relationship being partially based on acceptable characteristics of the CMP conditioning system;

measuring a motor current during performance of the CMP process;

converting the measured motor current to a measured motor torque;

using the measured motor torque and the expected relationship between the motor torque and the friction coefficient to monitor the friction coefficient during the CMP process;

identifying an unacceptable friction coefficient during performance of the CMP process; and correlating the unacceptable friction coefficient to an unacceptable characteristic of the CMP conditioning system.

18. A method for monitoring a CMP conditioning system as recited in claim 17, wherein determining the relationship between the motor torque and the friction coefficient is performed using a distributed LuGre dynamic friction model.

19. A method for monitoring a CMP conditioning system as recited in claim 17, wherein the relationship between the motor torque and the friction coefficient is associated with a set of CMP process parameters.

20. A method for monitoring a CMP conditioning system as recited in claim 19, wherein the set of CMP process parameters includes a characteristic of a conditioning disk of the CMP conditioning system.

21. A method for monitoring a CMP conditioning system as recited in claim 17, wherein the CMP process is a linear CMP process.

22. A method for monitoring a CMP conditioning system as recited in claim 21, wherein the motor torque, the measured motor current, and the measured motor torque correspond to one of a roller motor, a spindle motor, and both the roller motor and the spindle motor.

23. A method for monitoring a CMP conditioning system as recited in claim 17, wherein the friction coefficient is monitored in real-time during performance of the CMP process.

24. A method for monitoring a CMP conditioning system as recited in claim 17, wherein the unacceptable friction coefficient is identified through comparison of the monitored friction coefficient with an expected friction coefficient, the expected friction coefficient being determined using the expected relationship between the motor torque and the friction coefficient.

\* \* \* \* \*